US009356250B2

(12) United States Patent
Ohsawa et al.

(10) Patent No.: US 9,356,250 B2
(45) Date of Patent: May 31, 2016

(54) LIGHT-EMITTING ELEMENT, COMPRISING AN ORGANOMETALLIC COMPLEX LIGHT-EMITTING MATERIAL, A LIGHT-EMITTING DEVICE AND AN ELECTRONIC DEVICE COMPRISING THE LIGHT-EMITTING ELEMENT

(75) Inventors: Nobuharu Ohsawa, Kanagawa (JP); Hideko Inoue, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 362 days.

(21) Appl. No.: 12/552,817

(22) Filed: Sep. 2, 2009

(65) Prior Publication Data
US 2010/0059741 A1 Mar. 11, 2010

(30) Foreign Application Priority Data
Sep. 5, 2008 (JP) .................................. 2008-228080

(51) Int. Cl.
*H01L 51/54* (2006.01)
*H01L 51/50* (2006.01)
*H01L 51/00* (2006.01)

(52) U.S. Cl.
CPC ........ *H01L 51/5012* (2013.01); *H01L 51/5016* (2013.01); *H01L 51/0081* (2013.01); *H01L 51/0085* (2013.01); *H01L 51/5036* (2013.01); *H01L 2251/552* (2013.01)

(58) Field of Classification Search
None
See application file for complete search history.

(56) References Cited

U.S. PATENT DOCUMENTS

| 6,224,966 | B1 | 5/2001 | Sakai et al. |
| 6,803,720 | B2 | 10/2004 | Kwong et al. |
| 7,173,370 | B2 | 2/2007 | Seo et al. |
| 7,196,360 | B2 | 3/2007 | Seo et al. |
| 7,238,806 | B2 | 7/2007 | Inoue et al. |
| 7,332,857 | B2 | 2/2008 | Seo et al. |
| 7,342,355 | B2 | 3/2008 | Seo et al. |
| 7,374,830 | B2 | 5/2008 | Kato et al. |
| 7,399,991 | B2 | 7/2008 | Seo et al. |
| 7,432,116 | B2 | 10/2008 | Yamazaki et al. |
| 7,456,425 | B2 | 11/2008 | Seo et al. |
| 7,459,722 | B2 | 12/2008 | Seo et al. |
| 7,550,173 | B2 | 6/2009 | Seo et al. |
| 7,629,025 | B2 | 12/2009 | Yamazaki et al. |
| 7,663,149 | B2 | 2/2010 | Seo et al. |
| 7,858,977 | B2 | 12/2010 | Seo et al. |
| 7,915,807 | B2 | 3/2011 | Seo et al. |
| 8,053,974 | B2 | 11/2011 | Seo et al. |
| 8,174,007 | B2 | 5/2012 | Seo et al. |
| 8,203,262 | B2 | 6/2012 | Seo et al. |
| 8,278,649 | B2 | 10/2012 | Ohsawa |
| 8,354,786 | B2 | 1/2013 | Yamazaki et al. |
| 8,653,537 | B2 | 2/2014 | He et al. |
| 2002/0093283 | A1 | 7/2002 | Seo et al. |
| 2003/0010288 | A1 | 1/2003 | Yamazaki et al. |
| 2004/0066139 | A1* | 4/2004 | Hamada et al. ............... 313/506 |
| 2005/0184657 | A1 | 8/2005 | Kato et al. |
| 2005/0242715 | A1* | 11/2005 | Inoue et al. .................... 313/504 |
| 2006/0036097 | A1 | 2/2006 | Qiu et al. |
| 2007/0222376 | A1* | 9/2007 | Ohsawa et al. ............... 313/506 |
| 2007/0241667 | A1* | 10/2007 | Ohsawa et al. ............... 313/504 |
| 2008/0149923 | A1* | 6/2008 | Ohsawa et al. .................. 257/40 |
| 2008/0160345 | A1* | 7/2008 | Inoue et al. .................... 428/691 |
| 2009/0058285 | A1 | 3/2009 | Yamazaki et al. |
| 2009/0140643 | A1 | 6/2009 | Ohsawa et al. |
| 2009/0167168 | A1 | 7/2009 | Seo et al. |
| 2009/0200918 | A1 | 8/2009 | Seo et al. |
| 2009/0206331 | A1 | 8/2009 | Seo et al. |
| 2009/0236590 | A1 | 9/2009 | Ohsawa |
| 2009/0236980 | A1 | 9/2009 | Ohsawa |
| 2011/0101322 | A1 | 5/2011 | Seo et al. |
| 2011/0169400 | A1 | 7/2011 | Seo et al. |
| 2012/0256209 | A1 | 10/2012 | Seo et al. |
| 2013/0009141 | A1 | 1/2013 | Ohsawa |

FOREIGN PATENT DOCUMENTS

| EP | 0 866 645 A1 | 9/1998 |
| JP | 10-261488 A | 9/1998 |
| JP | 2002-093577 A | 3/2002 |
| JP | 2004-515895 | 5/2004 |
| JP | 2004-241188 A | 8/2004 |

(Continued)

OTHER PUBLICATIONS

Meerheim et al. Appl. Phys. Lett. 2008, 93, 043310-1-043310-3. Date of online publication: Aug. 1, 2008.*
Tao, X.T. et al, "Metal Complex Polymer for Second Harmonic Generation and Electroluminescence Applications," Applied Physics Letters, vol. 70, No. 12, Mar. 24, 1997, pp. 1503-1505.
Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, Dec. 15, 1999, pp. L1502-L1504.
Adachi, C. et al, "High-Efficiency Red Electrophosphorescence Devices," Applied Physics Letters, vol. 78, No. 11, Mar. 12, 2001, pp. 1622-1624.

(Continued)

*Primary Examiner* — Andrew K Bohaty
(74) *Attorney, Agent, or Firm* — Husch Blackwell LLP

(57) ABSTRACT

To provide a light-emitting element with high light emission efficiency, a long lifetime, and reduced driving voltage. To provide a light-emitting element including an anode, a cathode, and a plurality of light-emitting layers which are in contact with each other so that a stacked structure is formed, between the anode and the cathode, in which the plurality of light-emitting layers are formed with a first light-emitting layer which is close to the anode and a second light-emitting layer which is close to the cathode, the first light-emitting layer and the second light-emitting layer each include a host material, a hole-transporting material, and a light-emitting material, and the concentration of the hole-transporting material in the first light-emitting layer is higher than the concentration of the hole-transporting material in the second light-emitting layer.

23 Claims, 28 Drawing Sheets

(56) References Cited

FOREIGN PATENT DOCUMENTS

| | | |
|---|---|---|
| JP | 2004-311231 A | 11/2004 |
| JP | 2005-276802 | 10/2005 |
| JP | 2006-13295 | 1/2006 |
| JP | 2007-235081 | 9/2007 |
| JP | 2007-299645 A | 11/2007 |
| JP | 2008-53664 | 3/2008 |
| JP | 2008-509565 | 3/2008 |
| JP | 2008-160098 | 7/2008 |
| KR | 10-2006-0043123 | 5/2006 |
| KR | 2007-0021094 A | 2/2007 |
| KR | 2007-0035518 A | 3/2007 |
| WO | WO 2006/104177 A1 | 10/2006 |
| WO | WO 2008/065975 A1 | 6/2008 |

OTHER PUBLICATIONS

Tsuboi, T. et al, "New Emission Band of PtOEP Phosphor in Organic LED Devices," Current Applied Physics, vol. 5, 2005, pp. 47-54.
International Search Report re application No. PCT/JP2009/064282, dated Sep. 15, 2009.
Written Opinion re application No. PCT/JP2009/064282, dated Sep. 15, 2009.
Tsuboi, T. et al, "New Emission Band of PtOEP Phosphor in Organic LED Devices," Current Applied Physics, vol. 5, No. 1, 2005, pp. 47-54.
Chinese Office Action re Application No. CN 200980134880.9, dated Jan. 15, 2014.
Korean Office Action re Application No. KR 2011-7007824, dated Apr. 30, 2015.

\* cited by examiner

LIGHT-EMITTING ELEMENT, COMPRISING AN ORGANOMETALLIC COMPLEX LIGHT-EMITTING MATERIAL, A LIGHT-EMITTING DEVICE AND AN ELECTRONIC DEVICE COMPRISING THE LIGHT-EMITTING ELEMENT

TECHNICAL FIELD

The present invention relates to a light-emitting element which includes a layer containing an organic compound between a pair of electrodes. Further, the present invention relates to a light-emitting device using the light-emitting element. Furthermore, the present invention relates to an electronic device using the light-emitting device.

BACKGROUND ART

In recent years, a light-emitting element using a light-emitting organic compound or inorganic compound as a light-emitting material has been actively developed. In particular, a light-emitting element called an EL element has a simple structure in which a light-emitting layer containing a light-emitting material is provided between electrodes. Therefore, the light-emitting element has attracted attention as a next-generation flat panel display element because of its characteristics such as a thin shape, lightweight, high response speed, and direct current driving at low voltage. In addition, a display using such a light-emitting element is superior in contrast, image quality, and wide viewing angle. Further, since these light-emitting elements are plane light sources, it is considered that these light-emitting elements are applied as light sources such as a backlight of a liquid crystal display and a lighting device.

In the case of using a light-emitting organic compound as a light-emitting material, the emission mechanism of a light-emitting element is a carrier injection type. That is, by application of voltage with a light-emitting layer interposed between electrodes, carriers (holes and electrons) injected from the electrodes are recombined and a light-emitting material is made to be in an exited state. Light is emitted when the excited state returns to the ground state. As the type of the excited state, a singlet excited state (S*) and a triplet excited state (T*) are possible. Further, the statistical generation ratio thereof in a light-emitting element is considered to be S*:T*=1:3.

In general, the ground state of a light-emitting organic compound is a singlet excited state. Therefore, light emission from a singlet excited state (S*) is referred to as fluorescence because of electron transition between the same multiplicities. On the other hand, light emission from a triplet excited state (T*) is referred to as phosphorescence because of electron transition between different multiplicities. Here, in a compound emitting fluorescence (hereinafter referred to as a fluorescent compound), in general, phosphorescence is not observed at room temperature, and only fluorescence is observed. Accordingly, the internal quantum efficiency (the ratio of generated photons to injected carriers) in a light-emitting element using a fluorescent compound is assumed to have a theoretical limit of 25% based on S*:T=1:3.

On the other hand, when a compound emitting phosphorescence (hereinafter referred to as a phosphorescent compound) is used, internal quantum efficiency can be theoretically 75 to 100%. That is, light emission efficiency that is 3 to 4 times as much as that of the fluorescent compound can be achieved. From these reasons, in order to achieve a light-emitting element with high efficiency, a light-emitting element using a phosphorescent compound has been proposed (for example, see Non Patent Documents 1 and 2). Note that Non Patent Document 1 employs an iridium complex, in which a ligand is 2-phenylpyridine ($Ir(ppy)_3$), as a phosphorescent compound and that Non-Patent Document 2 employs an iridium complex, in which a ligand is 2-(2'-benzo[4,5-a]thienyl)pyridine ([$btp_2Ir(acac)$]), as a phosphorescent compound.

Further, a light-emitting element is disclosed using a light-emitting layer which contains, as a host material for a phosphorescent dopant, an organic low molecular hole-transporting substance and an organic low molecular electron-transporting substance in order to improve the lifetime and efficiency of the light-emitting element using a phosphorescent compound (see Patent Document 1).

One of advantages of using a light-emitting element with high efficiency is that power consumption of an electronic device using the light-emitting element can be reduced. Energy problems have been discussed recently, and power consumption is becoming a major factor which affects consumer buying patterns; thus, power consumption is a very important element.

CITATION LIST

[Patent Document]
[Patent Document 1] Japanese Translation of PCT International Application No. 2004-515895
[Non Patent Document]
[Non Patent Document 1] Tetsuo TSUTSUI, and eight others, Japanese Journal of Applied Physics Vol. 38, L1502 to L1504 (1999)
[Non Patent Document 2] Chihaya ADACHI, and five others, Applied Physics Letters, Vol. 78, No. 11, pp. 1622-1624 (2001)

DISCLOSURE OF INVENTION

According to the report in Non Patent Document 1 described above, the half-life period of luminance is about 170 hours when the initial luminance is set to be 500 $cd/m^2$ in constant current driving, and so, there is a problem of the lifetime of the element. In addition, Non Patent Document 1 reports a problem of lifetime, in which bathocuproine (abbreviation: BCP) is used as a hole-blocking layer, because the stability of BCP is not sufficient.

However, if BCP is removed from an element structure in Non Patent Document 1, light emission with high efficiency cannot be obtained. This is because 4,4'-di(N-carbazolyl)biphenyl (abbreviation: CBP) used in the host material of the light-emitting layer in Non Patent Document 1 has a strong hole-transporting property, holes may penetrate an electron-transporting layer, if BCP is not used as the hole-blocking layer. In addition, BCP has a function of blocking excitation energy (in this case, triplet excitation energy) generated in the light-emitting layer. Thus, with the element structure of Non Patent Document 1, although high efficiency can be achieved due to BCP, a light-emitting element having a long lifetime cannot be obtained because of BCP.

On the other hand, Patent Document 1 reports improvement in lifetime of an element and efficiency. However, the performance of a phosphorescent compound cannot be utilized efficiently. Actually, the light-emitting element of Patent Document 1 employs an iridium complex ([$btp_2Ir(acac)$]), which is also used in Non Patent Document 2, and the efficiency is about 0.9 cd/A to 2.0 cd/A, which is still lower than the efficiency described in Non Patent Document 2.

For the above reasons, it can be seen that it is very difficult to achieve both high light emission efficiency and a long lifetime. Therefore, practically, the lifetime of a light-emitting element has been secured at some expense of efficiency.

Further, when considering that electronic devices to which such light-emitting elements are applied are practically used, power consumption thereof may be an important element. Therefore, as a factor affecting power consumption, not only light emission efficiency but also reduced driving voltage of the element becomes very important.

Accordingly, an object is to provide a light-emitting element with high light emission efficiency, a long lifetime, and reduced driving voltage. It is another object to provide a light-emitting device with low power consumption and a long lifetime by manufacturing the light-emitting device using the light-emitting element. Further, it is still another object to provide an electronic device with low power consumption and a long lifetime by applying such a light-emitting device to the electronic device.

In order to solve the above problems, the present inventors provide a light-emitting element including a plurality of light-emitting layers each including a host material, a hole-transporting material, and a light-emitting material between an anode and a cathode, in which a concentration of the hole-transporting material of the light-emitting layer which is the closest to the anode is higher than a concentration of the hole-transporting material of the light-emitting layer which is the closest to the cathode.

That is, an embodiment of the present invention is a light-emitting element including an anode, a cathode, and a plurality of light-emitting layers which are in contact with each other so that a stacked structure is formed, between the anode and the cathode, in which the plurality of light-emitting layers are formed with a first light-emitting layer which is the closest to the anode of the plurality of light-emitting layers and a second light-emitting layer which is the closest to the cathode of the plurality of light-emitting layers, the first light-emitting layer includes a host material, a hole-transporting material, and a light-emitting material, and the second light-emitting layer includes the host material, the hole-transporting material having lower concentration than the hole-transporting material of the first light-emitting layer, and the light-emitting material.

A light-emitting element with such a structure has high light emission efficiency, a long lifetime, and reduced driving voltage.

Note that in the light-emitting element having the above structure, it is preferable that the light-emitting layer having the highest concentration of the hole-transporting material of the plurality of light-emitting layers have a mass ratio of the hole-transporting material to the host material less than or equal to 1. This is because injection of electrons to the host material is preferentially performed. In addition, it is preferable that the light-emitting layer having the lowest concentration of the hole-transporting material of the plurality of light-emitting layers have a mass ratio of the hole-transporting material to the host material greater than or equal to 0.05. This is because injection of holes to the light-emitting layer is smoothly performed.

That is, an embodiment of the present invention is a light-emitting element having the above structure in which a mass ratio of the hole-transporting material to the host material in the first light-emitting layer is less than or equal to 1 and a mass ratio of the hole-transporting material to the host material in the second light-emitting layer is greater than or equal to 0.05.

Further, in a light-emitting element having the above structure, the plurality of light-emitting layers fully exert their effects even when the plurality of light-emitting layers employ a two-layer structure. In addition, it is preferable that the plurality of light-emitting layers employ a two-layer structure because the element structure is simple.

That is, an embodiment of the present invention is a light-emitting element including an anode, a cathode, and a first light-emitting layer and a second light-emitting layer which is in contact with the first light-emitting layer and is closer to the cathode than the first light-emitting layer, between the anode and the cathode, in which the first light-emitting layer includes a host material, a hole-transporting material, and a light-emitting material, and the second light-emitting layer includes the host material, the hole-transporting material having lower concentration than the hole-transporting material of the first light-emitting layer, and the light-emitting material.

An embodiment of the present invention is a light-emitting element having the above structure in which a mass ratio of the hole-transporting material to the host material in the first light-emitting element is less than or equal to 1 and a mass ratio of the hole-transporting material to the host material in the second light-emitting layer is greater than or equal to 0.05.

It is preferable that the light-emitting element have the above structure because driving voltage can be effectively reduced in the case of an element structure with which the light-emitting material can easily trap electrons.

That is, an embodiment of the present invention is a light-emitting element having the above structure in which a LUMO level of the light-emitting material is lower than a LUMO level of the host material and a LUMO level of the hole-transporting material by 0.2 eV or more.

Further, it is preferable that the light-emitting element have the above structure in the case where the host material is a material having an electron-transporting property because an effect of adding the hole-transporting material is remarkable. As the material having an electron-transporting property, typically, a heteroaromatic compound or a metal complex can be given.

That is, an embodiment of the present invention is a light-emitting element having the above structure in which the host material is a heteroaromatic compound or a metal complex.

Further, a light-emitting element having the above structure is particularly suitable in the case where a phosphorescent compound which has a good carrier balance and with which reduction in light emission efficiency is easily caused due to localization of the light-emitting layer (reduction in efficiency due to so-called T-T annihilation is easily caused) is used as a light-emitting material.

That is, an embodiment of the present invention is a light-emitting element having the above structure in which light emission from the light-emitting material is phosphorescence.

Although an organometallic complex which includes a ligand having a pyrazine skeleton and whose central metal is an element belonging to Group 9 or Group 10 is a phosphorescent compound and shows high light emission efficiency, the organometallic complex has a low LUMO level and easily traps electrons; thus, the above structure of the light-emitting element is suitably applied.

That is, an embodiment of the present invention is a light-emitting element having the above structure in which the light-emitting material is an organometallic complex which includes a ligand having a pyrazine skeleton and whose central metal is an element belonging to Group 9 or Group 10.

Further, in the above organometallic complex, as the ligand having a pyrazine skeleton, a 2-arylpyrazine derivative is preferable.

That is, an embodiment of the present invention is a light-emitting element whose ligand having a pyrazine skeleton is a 2-arylpyrazine derivative.

Further, in the above organometallic complex, as the 2-arylpyrazine derivative, a 2-phenylpyrazine derivative is preferable.

That is, an embodiment of the present invention is a light-emitting element having the above structure in which the 2-arylpyrazine derivative is a 2-phenylpyrazine derivative.

Further, in the above organometallic complex, as the 2-phenylpyrazine derivative, a 2,5-diphenylpyrazine derivative is preferable.

That is, an embodiment of the present invention is a light-emitting element having the above structure in which the 2-phenylpyrazine derivative is a 2,5-diphenylpyrazine derivative.

Furthermore, as the central metal, iridium or platinum is preferable.

That is, an embodiment of the present invention is a light-emitting element having the above structure in which the central metal is iridium or platinum.

Further, a light-emitting device provided with a light-emitting element having the above structure has low power consumption and a long lifetime.

That is, an embodiment of the present invention is a light-emitting device provided with a light-emitting element having the above structure and a means for controlling the light-emitting element.

Further, an electronic device provided with a light-emitting device having the above structure has low power consumption and a long lifetime.

That is, an embodiment of the present invention is an electronic device provided with a light-emitting device having the above structure.

A light-emitting element which is an embodiment of the present invention has high light emission efficiency, a long lifetime, and reduced driving voltage.

Further, a light-emitting device which is an embodiment of the present invention has low power consumption and a long lifetime.

Furthermore, an electronic device which is an embodiment of the present invention is a light-emitting device with low power consumption and a long lifetime.

BEST MODE FOR CARRYING OUT THE INVENTION

Figure 1A:
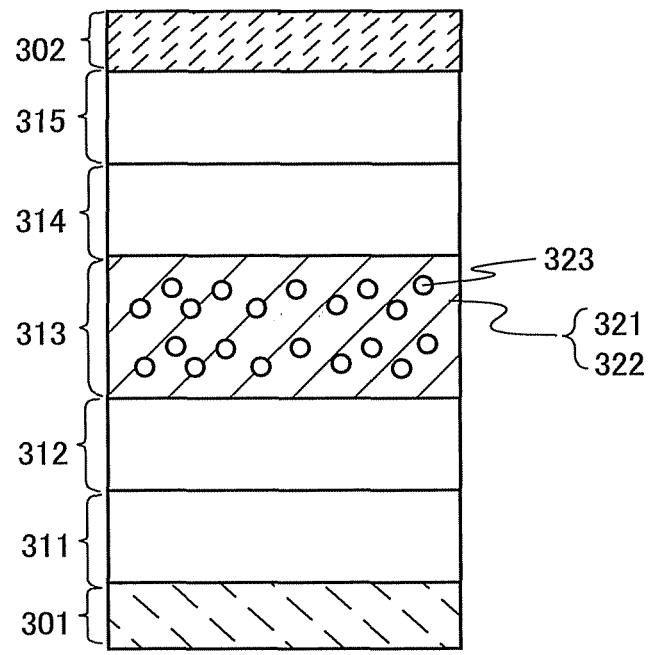
FIGS. 1A and 1B are schematic diagrams each illustrating a light-emitting element which is an embodiment of the present invention.

Hereinafter, embodiments and examples of the present invention will be described with reference to the drawings. However, the present invention can be carried out in many different modes, and it is easily understood by those skilled in the art that the mode and detail can be variously modified without departing from the spirit and scope of the present invention. Therefore, the present invention is not interpreted as being limited to the following description of the embodiments and examples.

Embodiment 1

In a light-emitting element in which a layer containing an organic compound is provided between a pair of electrodes, a structure in which the layer containing the organic compound is formed with a plurality of layers in which functions are separated has been mainstream. As the layers in which functions are separated, there are various kinds, for example, a carrier-injection layer and a carrier-transporting layer in addition to a light-emitting layer having a light-emitting function. The layer containing the organic compound does not have to include all these layers, or may include layers other than these layers.

In a light-emitting element including such layers in which functions are separated, characteristics of these layers are different from each other; thus, carriers are accumulated at an interface between the layers (in particular, at an interface between a light-emitting layer and the other layers) in some cases. Accordingly, the lifetime of the light-emitting element may be adversely affected.

In this case, by further adding a hole-transporting material to a host-guest type light-emitting layer in which a light-emitting material is dispersed in a host material, both electrons and holes can easily enter the light-emitting layer. That is, a problem due to an interface by accumulation of carriers can be reduced. Accordingly, the lifetime of the light-emitting element can be prolonged.

In addition, a carrier recombination region which is localized at the interface between the light-emitting layer and the other layers can be widened to a central portion of the light-emitting layer; thus, improvement of light emission efficiency can be expected. Further, in a light-emitting element using an organic compound emitting phosphorescence as a light-emitting material, when a recombination region is localized, T-T annihilation is likely to occur. On the other hand, in a light-emitting element whose recombination region is widened, T-T annihilation is reduced, and high light emission efficiency can be achieved.

In general, since an organic compound having a hole-transporting property (a hole-transporting material) has a high carrier-transporting property, by increasing the additive amount of the hole-transporting material to a light-emitting element, current easily flows. Therefore, by increasing the additive amount of the hole-transporting material, driving voltage of the light-emitting element can be reduced. However, if the additive amount of the hole-transporting material to the light-emitting element is increased too much, holes easily pass through a cathode, and a proportion of holes which do not contribute to the recombination is increased. Therefore, there has been a problem in that light emission efficiency is decreased while the driving voltage of the light-emitting element is decreased. That is, the relationship between achievement of light emission efficiency higher than or equal to a certain level and reduction in driving voltage has been traded off.

Thus, in order to solve this problem, the present inventors found a structure as described below.

That is, in a light-emitting element whose light-emitting layers are formed using a host material, a hole-transporting material, and a light-emitting material, a first light-emitting layer whose concentration of the hole-transporting material is higher than that of a second light-emitting layer is formed on an anode side, and the second light-emitting layer whose concentration of the hole-transporting material is lower than that of the first light-emitting layer is formed on a cathode side. Since the first light-emitting layer has higher concentration of the hole-transporting material, it contributes to reduction in driving voltage. However, when the second light-emitting layer is formed so as to have the same composition as the first light-emitting layer, a proportion of holes which pass through the light-emitting layers without contributing to recombination is increased; therefore, the additive amount of the hole-transporting material to the second light-emitting layer is made smaller than that to the first light-emitting layer. Accordingly, a light-emitting element with high light emission efficiency, a long lifetime, and low driving voltage can be manufactured.

Here, it is important that the hole-transporting material is also added to the second light-emitting layer. Even when the second light-emitting layer is formed using only the host material and the light-emitting material, it is expected that holes can be prevented from passing through the second light-emitting layer; however, holes are unlikely to enter the second light-emitting layer. Therefore, holes are accumulated at an interface between the first light-emitting layer and the second light-emitting layer, and the lifetime of the light-emitting element might be reduced. Accordingly, the second light-emitting layer, i.e., the layer which is the closest to the cathode preferably has a mass ratio of the hole-transporting material to the host material greater than or equal to 0.05.

Further, also in the case where the concentration of the hole-transporting material is too high (in short, in the case where the concentration of the hole-transporting material is higher than that of the host material) in the first light-emitting layer, a problem arises. In this case, in the first light-emitting layer, electrons easily enter not the host material but the hole-transporting material; thus, deterioration is easily caused. Accordingly, the first light-emitting layer, that is, the light-emitting layer which is the closest to the anode preferably has a mass ratio of the hole-transporting material to the host material less than or equal to 1, more preferably, less than or equal to 0.5.

Thus, the first light-emitting layer and the second light-emitting layer can be expressed as substances in which the layers are formed using the host material and the hole-transporting material and the light-emitting material are added thereto. Further, by forming a structure in which the concentration of the hole-transporting material of the first light-emitting layer is lower than that of the second light-emitting layer, a light-emitting element with high light emission efficiency and a long lifetime can be obtained. In addition, a light-emitting element with low driving voltage can be obtained.

Note that, in the above description, the case where the light-emitting layer has a two-layer structure is described as an example; however, the light-emitting layer may be formed with three or more layers. In this case, a plurality of light-emitting layers are made to have a structure in which the concentration of a hole-transporting material of the light-emitting layer which is the closest to an anode is the highest and the concentration of the hole-transporting material of the light-emitting layer which is the closest to the cathode is the lowest. Further, in the light-emitting layer in which two layers are in contact with each other, by forming the light-emitting layer on the anode side so as to have higher concentration of the hole-transporting material than the light-emitting layer on the cathode side, a light-emitting element with high light emission efficiency, a long lifetime, and low power consumption can be obtained.

As the host material that can be used for the above light-emitting element, any material may be used as long as it can transport electrons. Note that the host material preferably has an electron-transporting property because a hole-transporting property of the light-emitting layers is controlled by adding the hole-transporting material. As the material having an electron-transporting property, typically, a heteroaromatic compound, a metal complex, and the like can be given. Note that, in this specification, the term "an electron-transporting property" means that the property of the electron transportation is higher than that of the hole transportation, and the term "a hole-transporting property" means that the property of the hole transportation is higher than that of the electron transportation.

Further, as the hole-transporting material that can be used for the above light-emitting element, although there is no particular limitation, an aromatic amine compound or a carbazole derivative is particularly preferable.

Further, there is no particular limitation on the light-emitting material that can be used for the above light-emitting element. Note that the element structure as described above is effective in the case where an electron-trapping property of the light-emitting material is high. This is because, by application of the structure of the light-emitting element, driving voltage can be reduced. Specifically, the structure of the light-emitting element is effective in the case where the LUMO level of the light-emitting material is lower than the LUMO level of the host material by 0.2 eV or more. In the case where the light-emitting material has a high electron-trapping property, an electron-transporting property of the light-emitting layer is decreased as a whole. Therefore, driving voltage is likely to be increased. On the other hand, in the case where the light-emitting element has the above structure, driving voltage can be reduced.

As the light-emitting material having a high electron-trapping property, for example, an organometallic complex including a pyrazine skeleton as a ligand can be given. Further, as a central metal of such an organometallic complex, an element belonging to Group 9 or Group 10 is preferable.

As the organometallic complex, an organometallic complex including a quinoxaline-based ligand as represented by the following structural formulae (A1) to (A15), an organometallic complex including a tetrahydroquinoxaline-based ligand as represented by the following structural formulae (B1) to (B5), an organometallic complex including a dibenzoquinoxaline-based ligand as represented by the following structural formulae (C1) to (C5), or the like can be given. It is needless to say that an organometallic complex including a pyrazine-based ligand as represented by the structural formulae (D1) to (D32) can be given. Note that the light-emitting material that can be used for the above-described light-emitting element is not limited thereto.

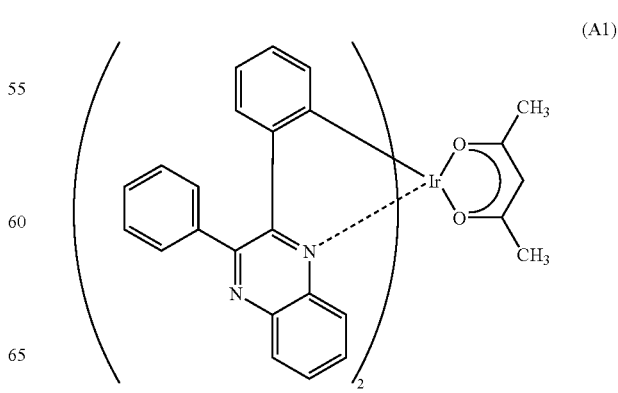

(A1)

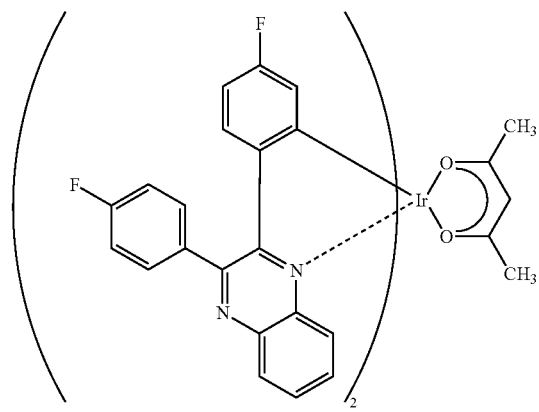
(A2)
(A3)
(A4)
(A5)
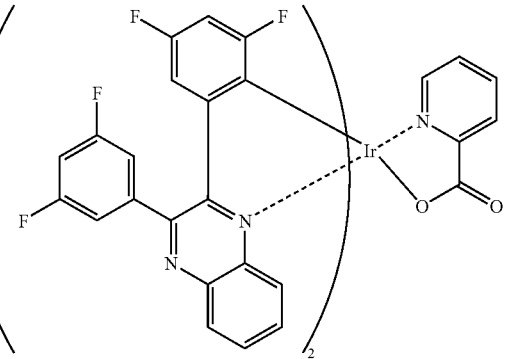
(A6)
(A7)
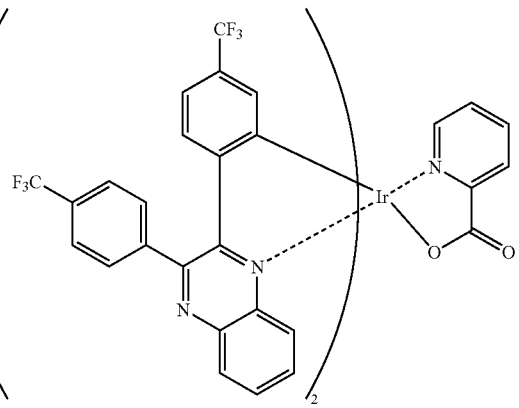
(A8)
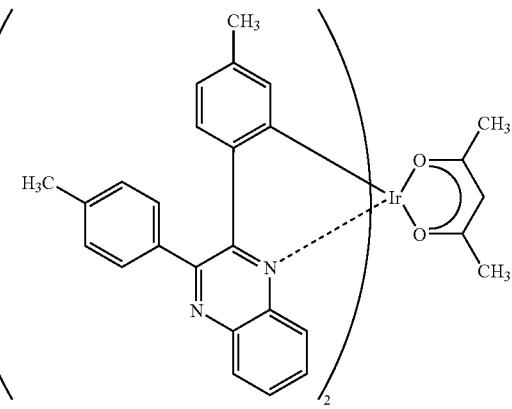
(A9)

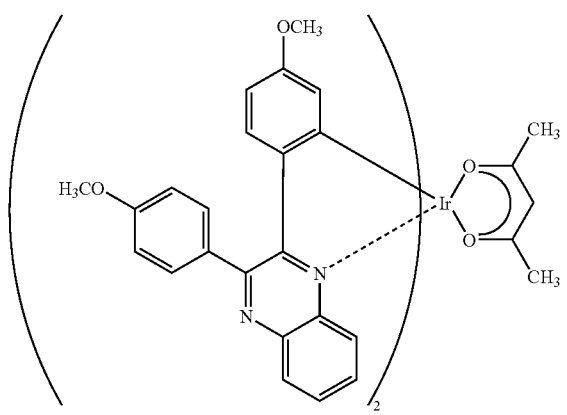
(A10)
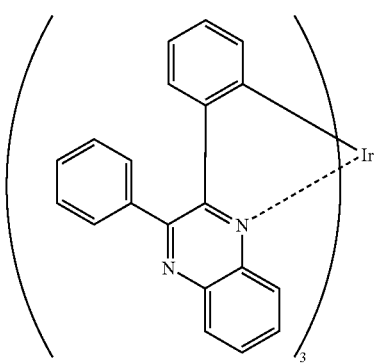
(A11)
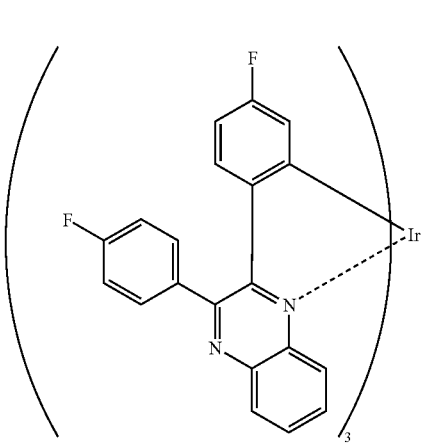
(A12)
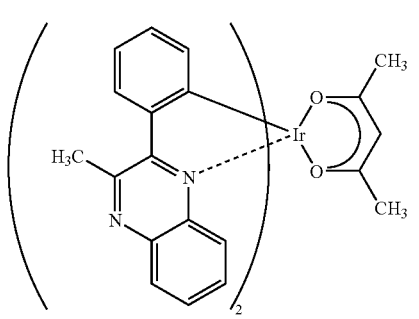
(A13)
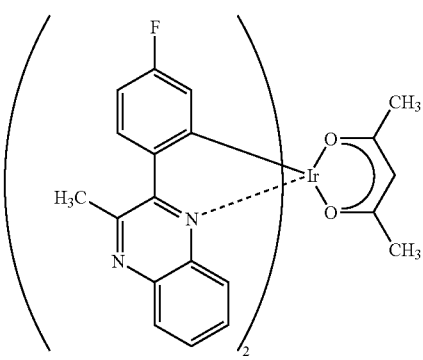
(A14)
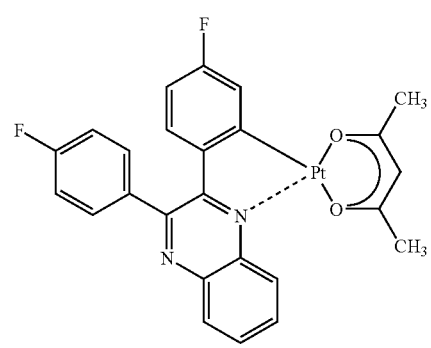
(A15)
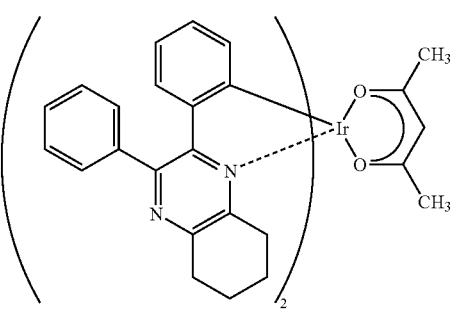
(B1)
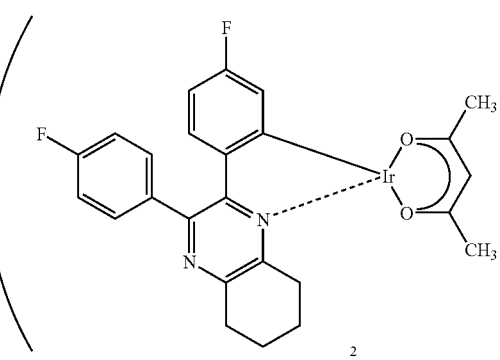
(B2)

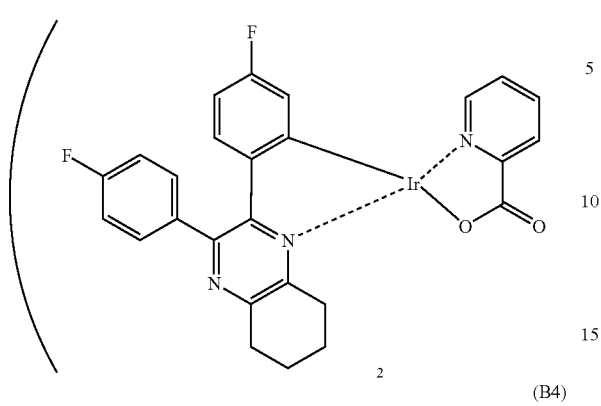
(B3)
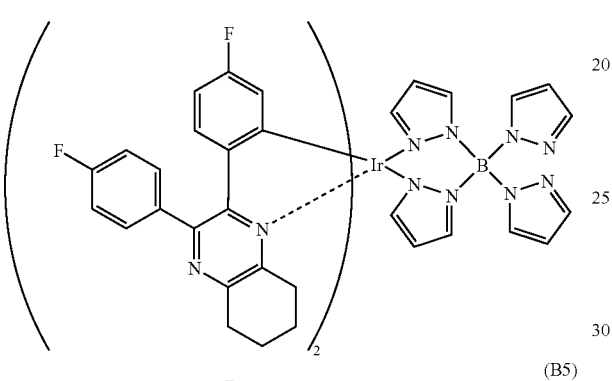
(B4)
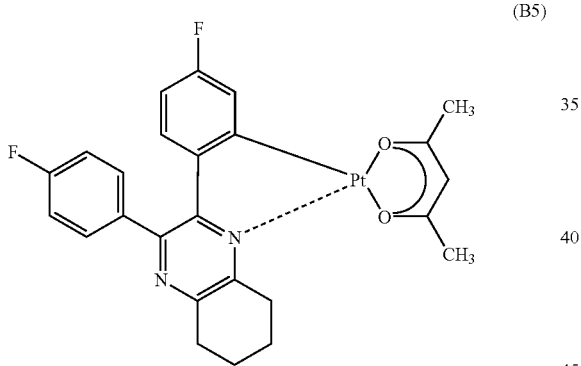
(B5)
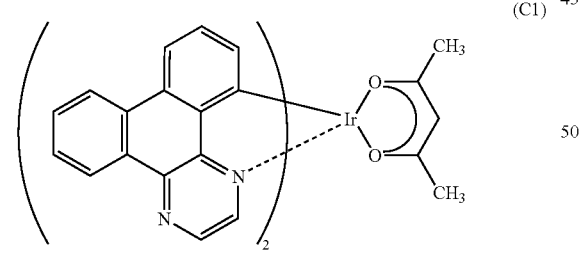
(C1)
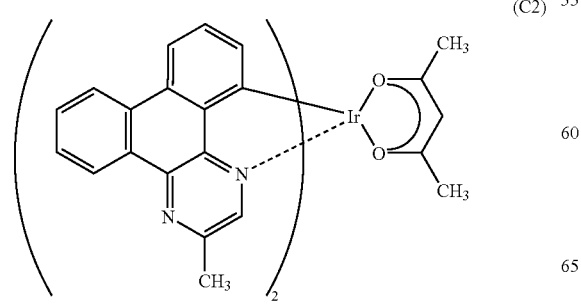
(C2)
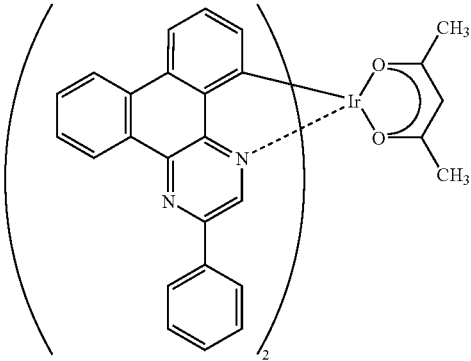
(C3)
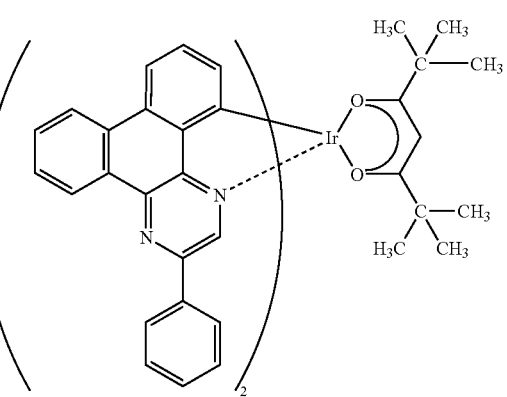
(C4)
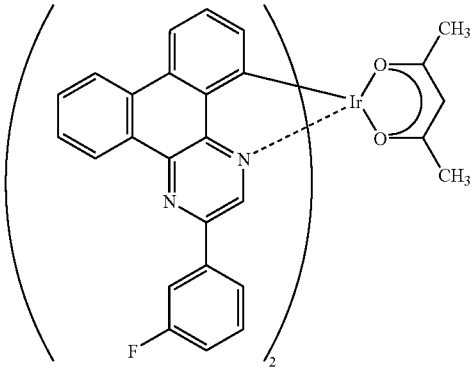
(C5)
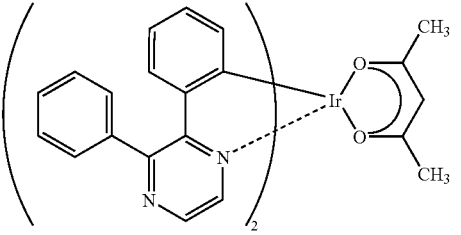
(D1)

-continued
(D2)
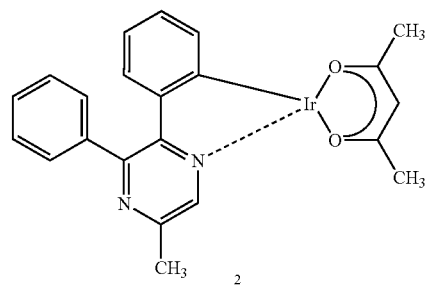
(D3)
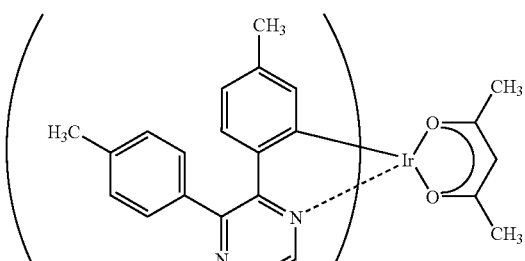
(D4)
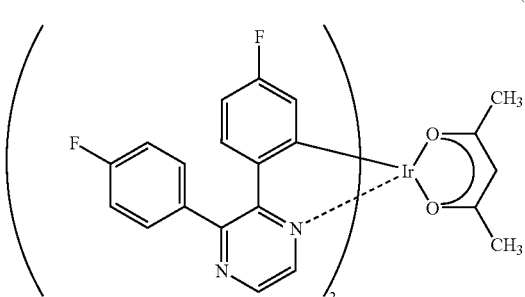
(D5)
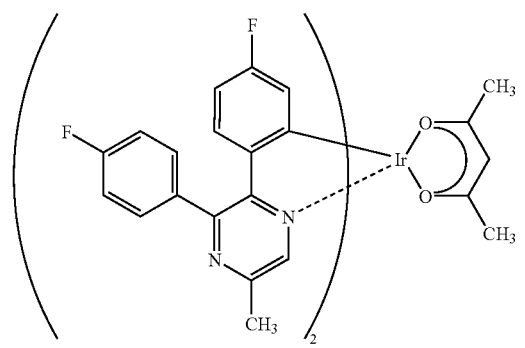
(D6)
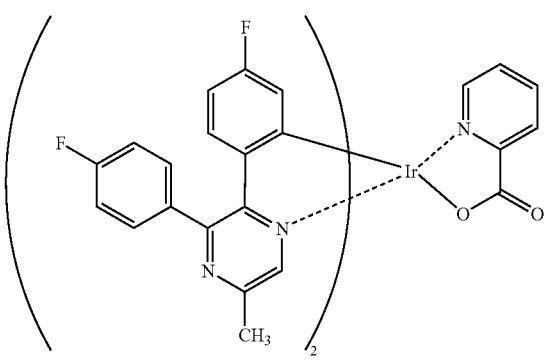
-continued
(D7)
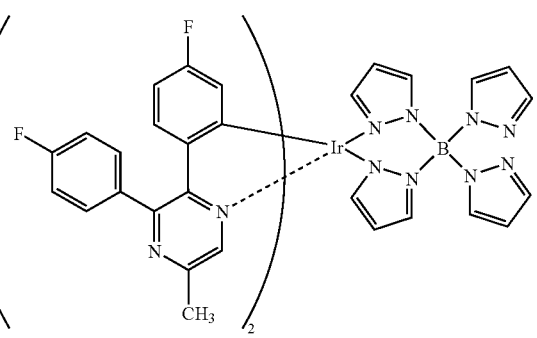
(D8)
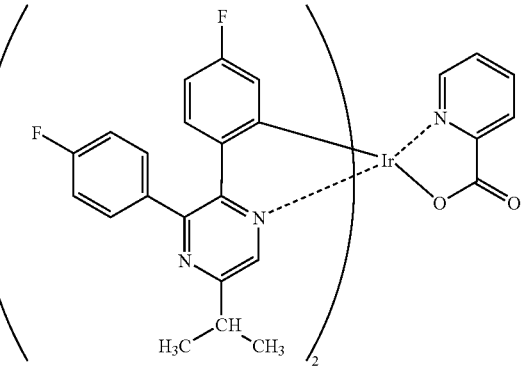
(D9)
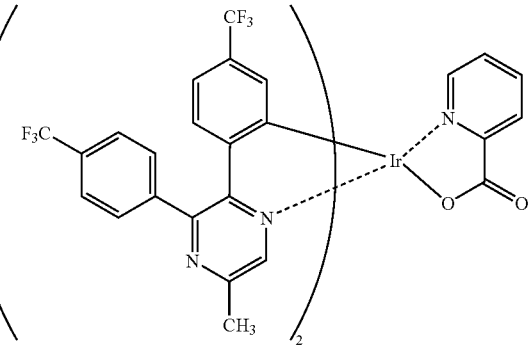
(D10)
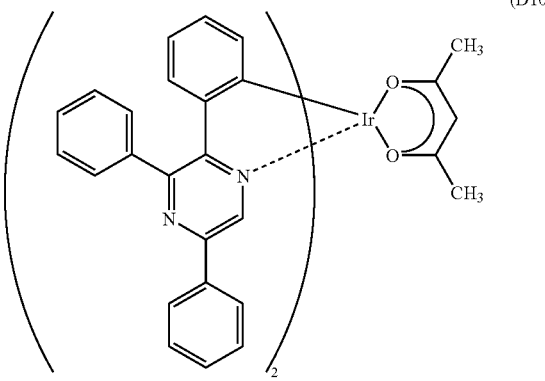

-continued
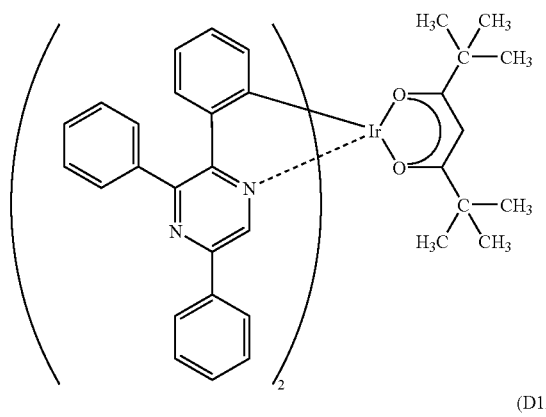
(D11)
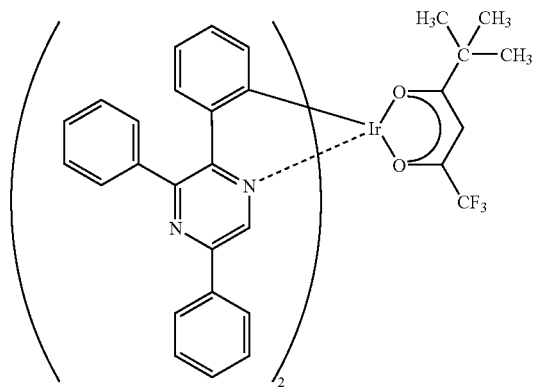
(D12)
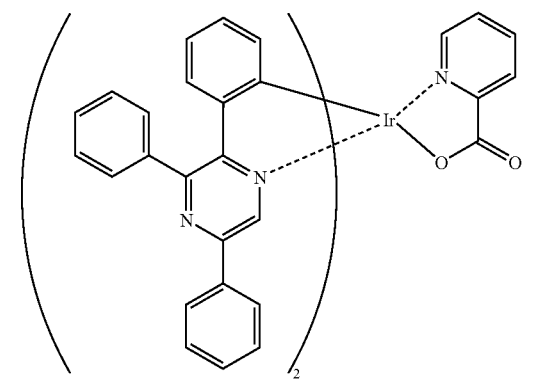
(D13)
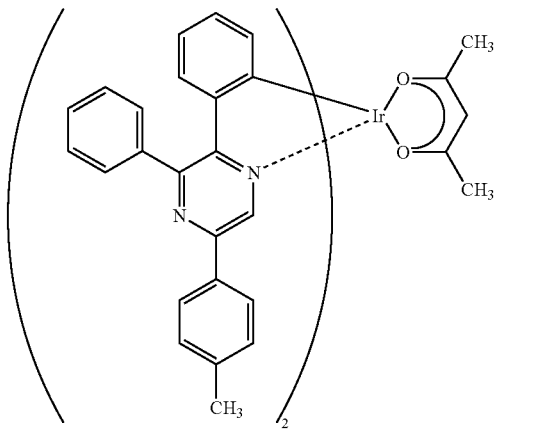
(D14)
-continued
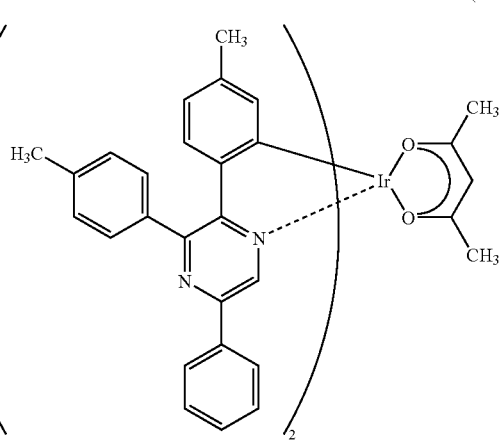
(D15)
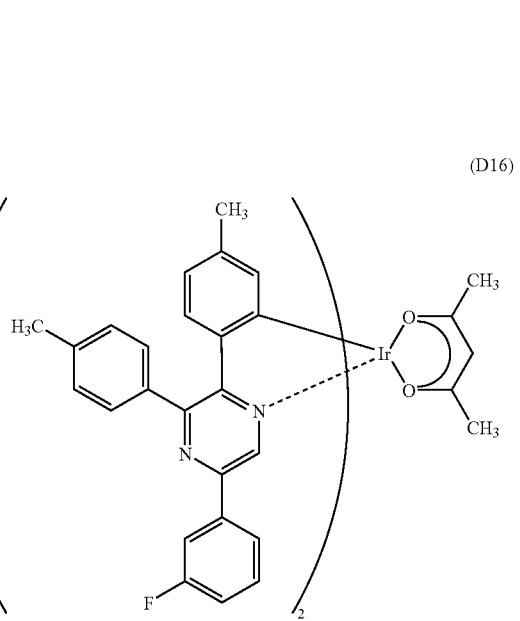
(D16)
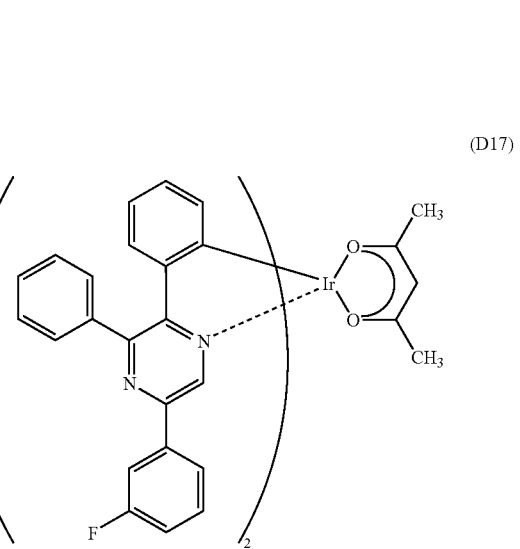
(D17)

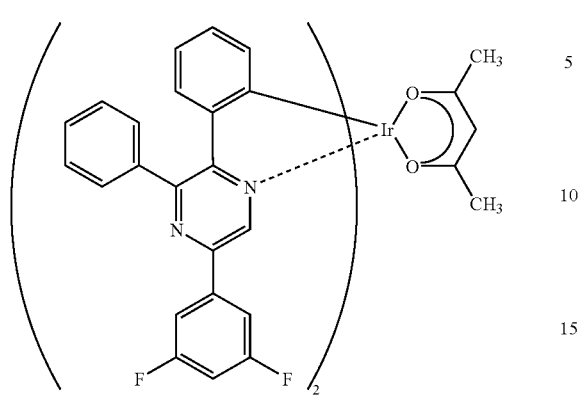
(D18)
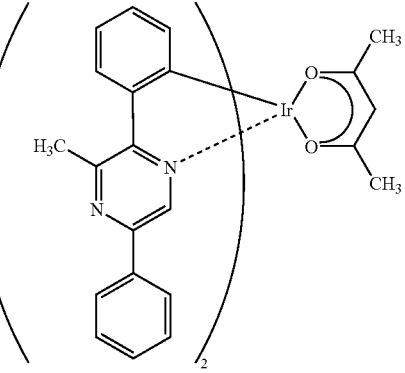
(D22)
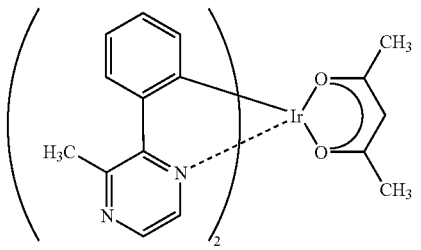
(D19)
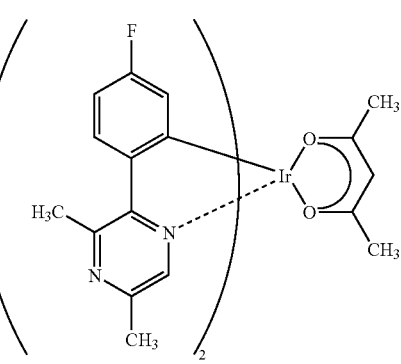
(D23)
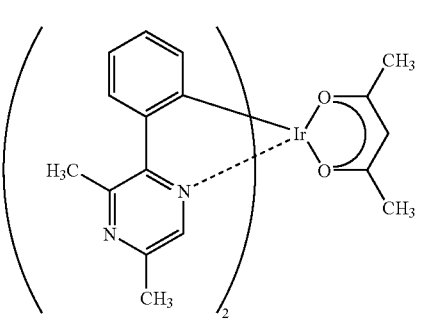
(D20)
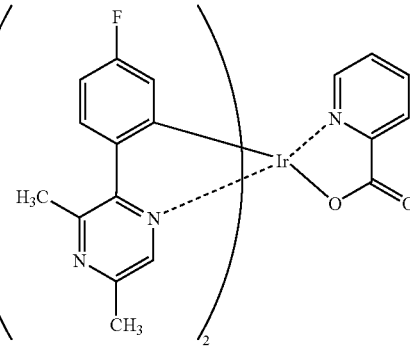
(D24)
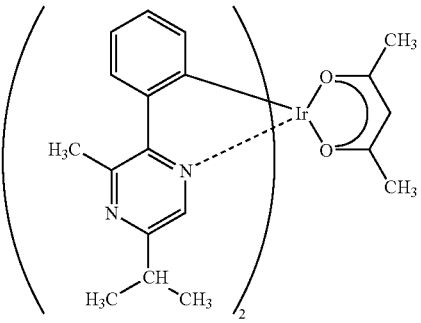
(D21)
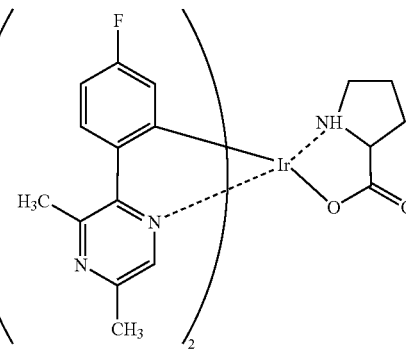
(D25)

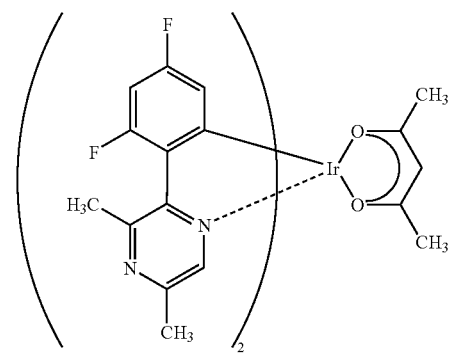
(D26)

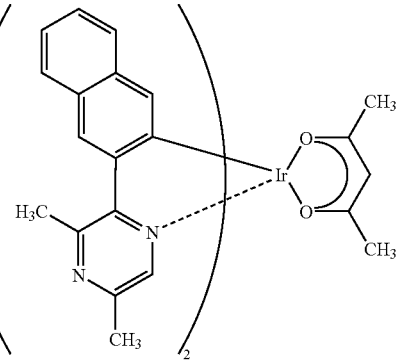
(D30)

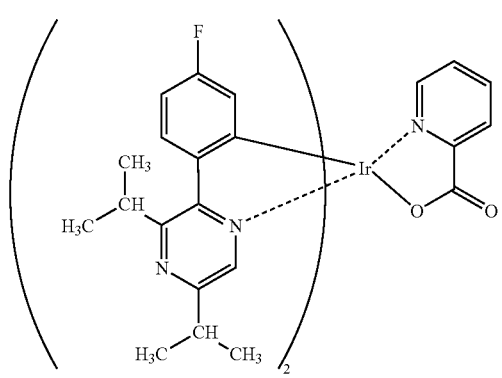
(D27)

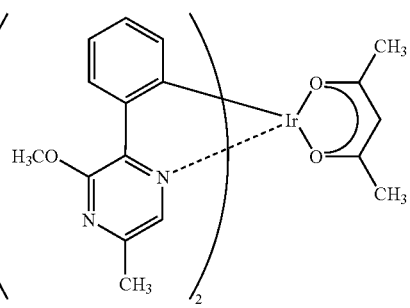
(D31)

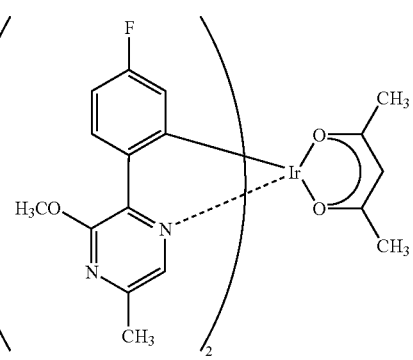
(D32)

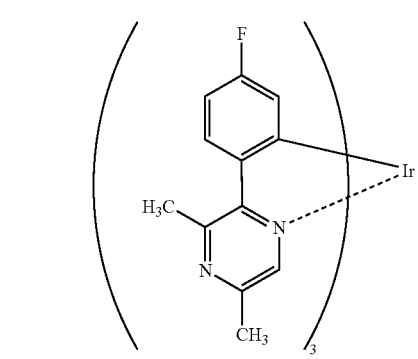
(D28)

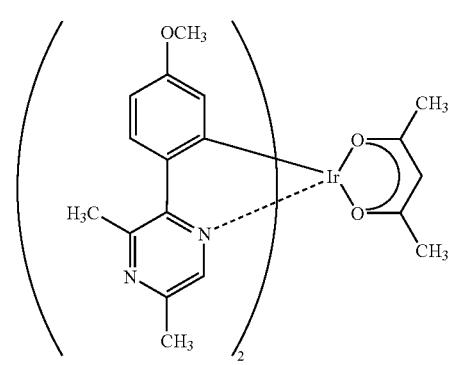
(D29)

The organometallic complex whose ligand includes a pyrazine skeleton can emit phosphorescence, and has high light emission efficiency. Therefore, by using the organometallic complex whose ligand includes a pyrazine skeleton as the above-described light-emitting material, a light-emitting element with a long lifetime, high light emission efficiency, and low driving voltage can be obtained. That is, a light-emitting element with low power consumption can be obtained. In particular, the organometallic complex including a 2-arylpyrazine-based ligand which is represented by the above structural formulae (D1) to (D32) has high light emission efficiency. Therefore, by using the organometallic complex, a light-emitting element with very low power consumption can be obtained by a synergistic effect with an effect of lowering driving voltage of the light-emitting element.

Subsequently, a structure of a light-emitting element of this embodiment is described with reference to FIG. 1A. In addition, materials applicable to the light-emitting element are listed below.

FIG. 1A is a diagram illustrating a light-emitting element including a plurality of light-emitting layers 313 between a first electrode 301 functioning as an anode and a second electrode 302 functioning as a cathode. The plurality of light-emitting layers 313 include a hole-transporting material 321, a host material 322, and a light-emitting material 323. A structure of the plurality of light-emitting layers 313 is described below.

In the plurality of light-emitting layers 313, the hole-transporting material 321 is a compound having a hole-transporting property. Specifically, an aromatic amine compound such as 4,4'-bis[N-(1-naphthyl)-N-phenylamino]biphenyl (abbreviation: NPB), 4,4'-bis[N-(9-phenanthryl)-N-phenylamino] biphenyl (abbreviation: PPB), 4,4'-bis[N-(3-methylphenyl)-N-phenylamino]biphenyl (abbreviation: TPD), 4,4'-bis[N-(9, 9-dimethylfluoren-2-yl)-N-phenylamino]biphenyl (abbreviation: DFLDPBi), 4,4',4''-tris(N,N-diphenylamino) triphenylamine (abbreviation: TDATA), 4,4',4''-tris[N-(3-methylphenyl)-N-phenylamino]triphenylamine (abbreviation: m-MTDATA), 4,4',4''-tri(N-carbazolyl)triphenylamine (abbreviation: TCTA), 1,1-bis[4-(diphenylamino)phenyl]cyclohexane (abbreviation: TPAC), 9,9-bis[4-(diphenylamino) phenyl]fluorene (abbreviation: TPAF), 4-(9-carbazolyl)-4'-(5-phenyl-1,3,4-oxadiazol-2-yl)triphenylamine (abbreviation: YGAO11), or N-[4-(9-carbazolyl)phenyl]-N-phenyl-9,9-dimethylfluoren-2-amine (abbreviation: YGAF) can be used. Also, a carbazole derivative such as 4,4'-di(N-carbazolyl)biphenyl (abbreviation: CBP), 1,3-bis(N-carbazolyl)benzene (abbreviation: mCP), 1,3,5-tris(N-carbazolyl) benzene (abbreviation: TCZB), or 4-phenyl-4'-(9-phenyl-9H-carbazol-3-yl)triphenylamine (abbreviation: PCBA1BP) can be used. Further, a high molecular compound such as poly(4-vinyltriphenylamine) (abbreviation: PVTPA) can also be used as such an aromatic amine compound. As a carbazole derivative, a high molecular compound such as poly(N-vinylcarbazole) (abbreviation: PVK) can also be used. Note that the singlet excitation energy (the triplet excitation energy in the case where light emission of the light-emitting material is phosphorescence) of the hole-transporting material 321 is preferably higher than the singlet excitation energy (or the triplet excitation energy) of the light-emitting material 323.

The host material 322 may be any materials as long as it can transport electrons, and a compound having an electron-transporting property is preferable. Specifically, a heteroaromatic compound such as 9-[4-(5-phenyl-1,3,4-oxadiazol-2-yl)phenyl]carbazole (abbreviation: CO11), 1,3-bis[5-(p-tert-butylphenyl)-1,3,4-oxadiazol-2-yl]benzene (abbreviation: OXD-7), 2-(4-biphenylyl)-5-(4-tert-butylphenyl)-1,3,4-oxadiazole (abbreviation: PBD), 2,2',2''-(1,3,5-benzenetriyl)tris (1-phenyl-1H-benzimidazole) (abbreviation: TPBI), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 9,9',9''-[1,3,5-triazine-2,4,6-triyl]tricarbazole (abbreviation: TCZTRZ), 2,2',2''-(1,3,5-benzenetriyl)tris(6,7-dimethyl-3-phenylquinoxaline) (abbreviation: TriMeQn), 9,9'-(quinoxaline-2,3-diyldi-4,1-phenylene)di(9H-carbazole) (abbreviation: CzQn), 3,3',6,6'-tetraphenyl-9,9'(quinoxaline-2,3-diyldi-4,1-phenylene)di(9H-carbazole) (abbreviation: DCZPQ), bathophenanthroline (abbreviation: BPhen), bathocuproine (abbreviation: BCP), or 3-phenyl-9-[4-(5-phenyl-1,3,4-oxadiazol-2-yl)-phenyl]-9H-carbazole (abbreviation: CO11II) can be used. A metal complex such as bis(2-methyl-8-quinolinolato)(4-phenylphenolato)aluminum(III) (abbreviation: BAlq), tris[2-(2-hydroxyphenyl)-5-phenyl-1,3,4-oxadiazolato]aluminum(III) (abbreviation: Al(OXD)$_3$), tris(2-hydroxyphenyl-1-phenyl-1H-benzimidazolato)aluminum(III) (abbreviation: Al(BIZ)$_3$), bis[2-(2-hydroxyphenyl)benzothiazolato]zinc(II) (abbreviation: Zn(BTZ)$_2$), or bis[2-(2-hydroxyphenyl)benzoxazolato]zinc (II) (abbreviation: Zn(PBO)$_2$) can be used. Further, a high molecular compound such as poly(2,5-pyridine-diyl) (abbreviation: PPy) can also be used as such a heteroaromatic compound. As a metal complex, metal complex high molecular compounds as disclosed in the following reference can also be used (reference: X. T. TAO, and five others, Applied Physics Letters, Vol. 70, No. 12, pp. 1503-1505 (1997)). Note that the singlet excitation energy (the triplet excitation energy in the case where light emission of the light-emitting material is phosphorescence) of the host material 322 is preferably higher than the singlet excitation energy (or the triplet excitation energy) of the light-emitting material 323.

There is no particular limitation on the light-emitting material 323, and either a fluorescent light-emitting material or a phosphorescent light-emitting material can be used. Specifically, in addition to the organometallic complex represented by the structural formulae (A1) to (A15), (B1) to (B5), (C1) to (C5), and (D1) to (D32), the following fluorescent light-emitting material can be used, for example: N,N-bis[4-(9H-carbazol-9-yl)phenyl]-N,N-diphenylstylbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis [N,N',N'-triphenyl-1,4-phenylenediarnine] (abbreviation: DPABPA), N,9-diphenyl-N-[4-(9,10-diphenyl-2-anthryl) phenyl]-9H-carbazol-3-amine (abbreviation: 2PCAPPA), N-[4-(9,10-diphenyl-2-anthryl)phenyl]-N',N'-triphenyl-1,4-phenylenediamine (abbreviation: 2DPAPPA), N,N,N',N',N'', N'',N''',N'''-octaphenyldibenzo[g,p]chrysene-2,7,10,15-tetramine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9, 10-bis(1,1'-biphenyl-2-yl)-2-anthryl]-N,N',N'-triphenyl-1,4-phenylenediamine (abbreviation: 2DPABPhA), 9,10-bis(1, 1'-biphenyl-2-yl)-N-[4-(9H-carbazol-9-yl)phenyl]-N-phenylanthracen-2-amine (abbreviation: 2YGABPhA), N,N, 9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinit rile (abbreviation: DCM1), 2-{2-methyl-6-[2-(2,3, 6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,13-diphenyl-N,N,N', N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij] quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), or 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM).

Alternatively, the following phosphorescent light-emitting material can be used, for example:

bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis[2-(3',5'-bistrifluoromethylphenyl)pyridinato-N,C$^{2'}$]iridium(III)picolinate (abbreviation: Ir(CF$_3$ppy)$_2$(Pic)), bis[2-(4',6'-difluorophenyl)pyridinato-N,C$^{2'}$]iridium(III)acetylacetonate (abbreviation: FIracac), tris(2-phenylpyridinato)iridium(III) (abbreviation: Ir(ppy)$_3$), bis(2-phenylpyridinato)iridium(III)acetylacetonato (abbreviation: Ir(ppy)$_2$(acac)), tris(acetylacetonato)(monophenanthroline)terbium(III) (abbreviation: Tb(acac)$_3$(Phen)), bis(benzo[h]quinolinato)iridium(III)acetylacetonate (abbreviation: Ir(bzq)$_2$(acac)), bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), bis[2-(2'-benzo[4,5-α]thienyl)pyridinato-N,C$^{3'}$](III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), 2,3,7,8,12,13,17,18-octaethyl-21H,23H-porphyrin-platinum(II) (abbreviation: PtOEP), tris(1,3-diphenyl-1,3-propanedionato)(monophenanthroline)europium(III) (abbreviation: Eu(DBM)$_3$(Phen)), or tris[1-(2-thenoyl)-3,3,3-trifluoroacetonato](monophenanthroline)europium(III) (abbreviation: Eu(TTA)$_3$(Phen)).

Note that, in the case where a substance having a high electron-trapping property is used as the light-emitting material 323 in this embodiment, specifically, in the case where a LUMO level of the light-emitting material 323 is lower than LUMO levels of the host material 322 and the hole-transporting material 321 by 0.2 eV or more, an effect of the lifetime improvement and an effect of the efficiency improvement are significant, so a structure of an embodiment of the present invention is a preferable structure.

The hole-transporting material 321, the host material 322, and the light-emitting material 323 which are described above are combined as appropriate, so that the plurality of light-emitting layers 313 in the light-emitting element of this embodiment are formed. Note that the plurality of light-emitting layers 313 may further include another substance. Note that each boundary of the plurality of light-emitting layers 313 is distinguished by a difference of a mass ratio of the host material and the hole-transporting material included in each layer. The light-emitting material 323 is the same for each of the plurality of light-emitting layers 313; however, the concentrations may be the same or different from one layer to another.

The plurality of light-emitting layers 313 in the light-emitting element of this embodiment are formed in such a manner that the light-emitting layers which are adjacent to each other are in contact with each other and the concentration of the hole-transporting material of the light-emitting layer which is closer to the anode is higher than that of the light-emitting layer which is closer to the cathode. That is, the concentration of the hole-transporting material of the light-emitting layer which is the closest to the anode is the highest, and the concentration of the hole-transporting material of the light-emitting layer which is the closest to the cathode is the lowest. Note that, when the concentrations of the hole-transporting materials are represented using the proportions of the hole-transporting materials to the host materials, the mass ratio of the hole-transporting material to the host material in the light-emitting layer which is the closest to the anode is preferably less than or equal to 1 and the mass ratio of the hole-transporting material to the host material in the light-emitting layer which is the closest to the cathode is preferably greater than or equal to 0.05. Further, in terms of the lifetime, it is known that it is effective that the mass ratio of the hole-transporting material to the host material in the light-emitting layer which is the closest to the anode is less than or equal to 0.5.

Figure 1B:
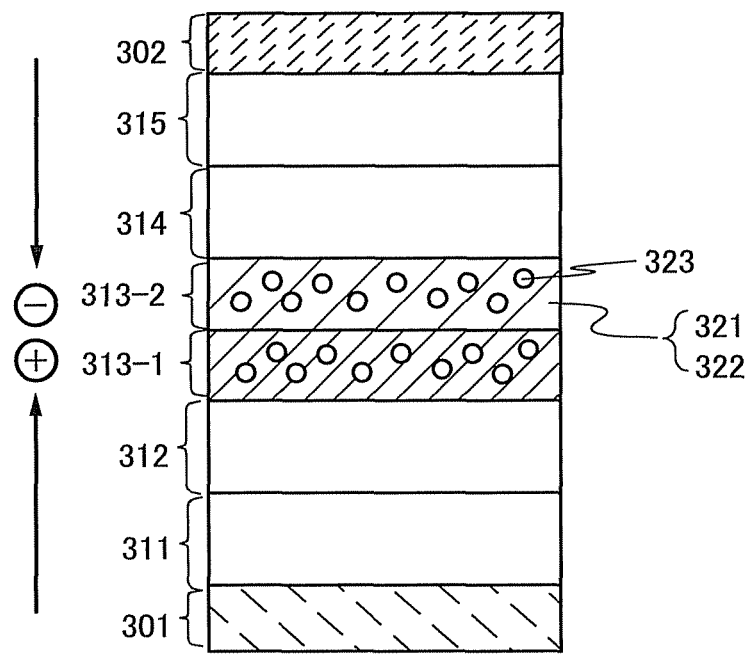

Note that the effect of a light-emitting element of this embodiment can be obtained even when the light-emitting layer has a two-layer structure of a first light-emitting layer 313-1 and a second light-emitting layer 313-2 as illustrated in FIG. 1B. Further, the structure is simple and thus preferable.

Next, layers other than the plurality of light-emitting layers 313 are described. A hole-transporting layer 312 and a hole-injecting layer 311 are not necessarily provided, and they may be provided as appropriate. As specific materials for forming these layers, hole-transporting compounds are preferable, and NPB, PPB, TPD, DFLDPBi, TDATA, m-MTDATA, TCTA, TPAC, TPAF, YGAO11, YGAF, CBP, mCP, TCzB, PCBALBP, PVTPA, PVK, or the like can be used.

Further, since the plurality of light-emitting layers 313 of this embodiment have a good carrier balance, a light-emitting region can be prevented from being concentrated at the interface between the light-emitting layers 313 and the hole-transporting layer 312 or the hole-injecting layer 311. Therefore, even if a substance having lower singlet excitation energy (or lower triplet excitation energy) than the light-emitting material 323 is applied to the hole-transporting layer 312 or the hole-injecting layer 311 in contact with the light-emitting layers 313, the substance is difficult to serve as a quencher to the light-emitting material 323. Therefore, as a material for forming the hole-transporting layer 312 or the hole-injecting layer 311, an anthracene derivative having low triplet excitation energy, such as 9,10-bis[4-(diphenylamino)phenyl]anthracene (abbreviation: TPA2A) or 2-tert-butyl-9,10-di(2-naphthyl)anthracene (abbreviation: t-BuDNA) can also be used.

Note that the hole-transporting layer 312 and the hole-injecting layer 311 may be formed by mixing the hole-transporting compound described above and an electron acceptor. As the electron acceptor, in addition to an organic compound such as chloranil or 7,7,8,8-tetracyano-2,3,5,6-tetrafluoro-quinodimethane (abbreviation: F$_4$-TCNQ), transition metal oxide such as molybdenum oxide, vanadium oxide, or rhenium oxide can be used. In particular, as the hole-injecting layer 311, an organic compound such as copper phthalocyanine, vanadyl phthalocyanine, or fluorocarbon, or an inorganic compound such as molybdenum oxide, ruthenium oxide, or aluminum oxide can also be used. Note that the hole-injection layer 311 may have a multilayer structure formed of two or more layers stacked together. Further, the hole-injecting layer 311 and the hole-transporting layer 312 may be formed by mixing two or more kinds of substances.

An electron-transporting layer 314 and an electron-injecting layer 315 are not necessarily required, and may be provided as appropriate. As specific materials for forming these layers, electron-transporting compounds are preferable, and CO11, OXD-7, PBD, TPBI, TAZ, p-EtTAZ, TCzTRZ, Tri-MeQn, CzQn, DCzPQ, BPhen, BCP, CO11II, BAlq, Al(OXD)$_3$, Al(BIZ)$_3$, Zn(BTZ)$_2$, Zn(PBO)$_2$, PPy, or the like, which are described above, can be used.

Further, since the plurality of light-emitting layers 313 of this embodiment have a good carrier balance, a light-emitting region can be prevented from being concentrated at the interface between the plurality of light-emitting layers 313 and the electron-transporting layer 314 or the electron-injecting layer 315. Therefore, even if a substance having lower triplet excitation energy than the light-emitting material 323 is applied to the electron-transporting layer 314 or the electron-injecting layer 315 in contact with the plurality of light-emitting layers 313, the substance is difficult to serve as a quencher to the light-emitting material 323. Therefore, a substance having low triplet excitation energy, such as tris(8-quinolinolato) aluminum(III) (abbreviation: Alq), tris(4-methyl-8-quinolinolato)aluminum(III) (abbreviation: Almq$_3$), or bis(10-hydroxybenzo[h]quinolinato)berylium(II) (abbreviation: BeBq$_2$), can be used as a material for the electron-transporting layer 314 or the electron-injecting layer 315 (for example, it is reported that the phosphorescence spectrum of Alq is approximately 650 nm to 700 nm of deep red).

Note that the electron-transporting layer 314 and the electron-injecting layer 315 may be formed by mixing the electron-transporting compound described above and an electron donor. As the electron donor, an organic compound such as tetrathiafulvalene or tetrathianaphthacene, an alkali metal such as lithium or cesium, an alkaline earth metal such as magnesium or calcium, a rare-earth metal such as erbium or ytterbium, or an oxide of such a metal can be used. In particular, for the electron-injecting layer 315, an alkali metal compound, an alkaline earth metal compound, or a rare-earth metal compound, such as lithium oxide, lithium fluoride, calcium fluoride, or erbium fluoride, can be used alone. The electron-injecting layer 315 may have a multilayer structure formed by stacking two or more layers. Further, the electron-transporting layer 314 and the electron-injecting layer 315 may be formed by mixing two or more kinds of substances.

Although there are no particular limitations on the first electrode 301, the first electrode 301 is preferably formed using a substance having a high work function in the case of functioning as an anode as in this embodiment. Specifically, in addition to a substance having a high light-transmitting property such as indium tin oxide (ITO), indium tin oxide containing silicon oxide (ITSO), or indium oxide containing 2 to 20 wt % zinc oxide (IZO), gold (Au), platinum (Pt), nickel (Ni), tungsten (W), chromium (Cr), molybdenum (Mo), iron (Fe), cobalt (Co), copper (Cu), palladium (Pd), or the like can be used. The first electrode 301 can be formed by, for example, a sputtering method, an evaporation method, or the like.

Further, although there are no particular limitations on the second electrode 302, the second electrode 302 is preferably formed using a substance having a low work function in the case of functioning as a cathode as in this embodiment. Specifically, in addition to aluminum (Al) or indium (In), an alkali metal such as lithium (Li) or cesium (Cs); an alkaline earth metal such as magnesium (g) or calcium (Ca); a rare-earth metal such as erbium (Er) or ytterbium (Yb) or the like can be used. In addition, an alloy such as aluminum-lithium alloy (AlLi) or magnesium-silver alloy (MgAg) can also be used. In addition, when the electron-injecting layer 315 is formed by mixing an electron-transporting compound and an electron donor, a substance having a high work function and a high light-transmitting property, such as ITO, ITSO, or IZO can also be used. The second electrode 302 can be formed by, for example, a sputtering method, an evaporation method, or the like.

In order to extract generated light to the outside, it is preferable that one or both of the first electrode 301 and the second electrode 302 be an electrode formed of a highly light-transmitting substance, such as ITO, ITSO, or IZO, which are described above. Alternatively, one or both of the first electrode 301 and the second electrode 302 is preferably an electrode formed to have a thickness of several to several tens of nanometers so that visible light can be transmitted.

In the light-emitting element of this embodiment as described above, each of the hole-injecting layer 311, the hole-transporting layer 312, the plurality of light-emitting layers 313, the electron-transporting layer 314, and the electron-injecting layer 315 may be formed by any method such as an evaporation method, an ink-jet method, or a coating method. The first electrode 301 or the second electrode 302 may also be formed by any method such as a sputtering method, an evaporation method, an ink-jet method, or a coating method.

Further, the above-described light-emitting element of this embodiment may be applied to a tandem type light-emitting element (also referred to as a multiphoton element).

Embodiment 2

In this embodiment, an image display device is described as an example of a light-emitting device having the light-emitting element described in Embodiment 1.

Figure 2A:
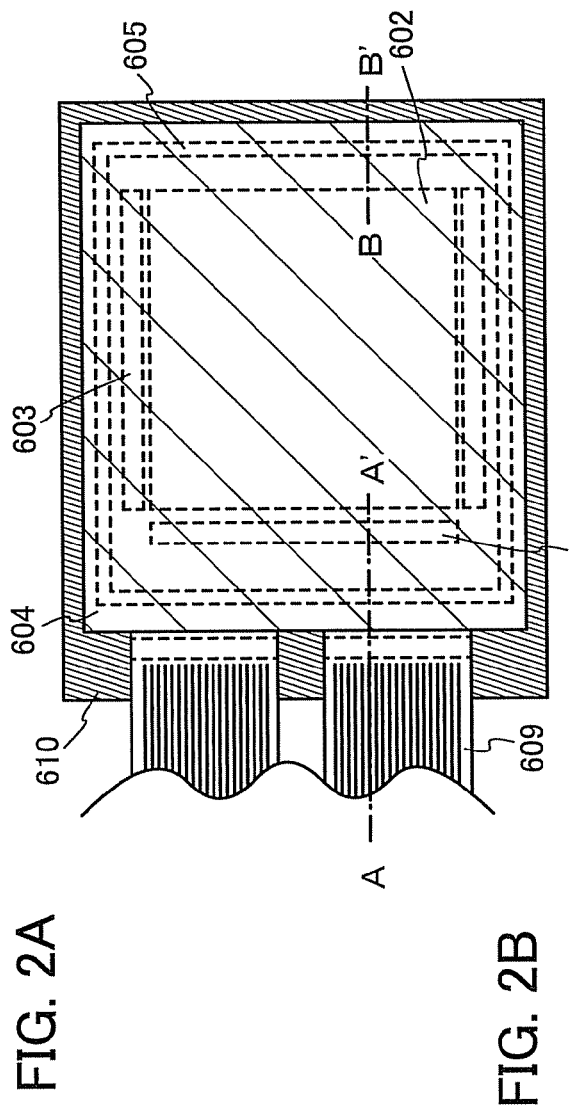
FIGS. 2A and 2B are schematic diagrams illustrating a light-emitting device which is an embodiment of the present invention.
Figure 2B:
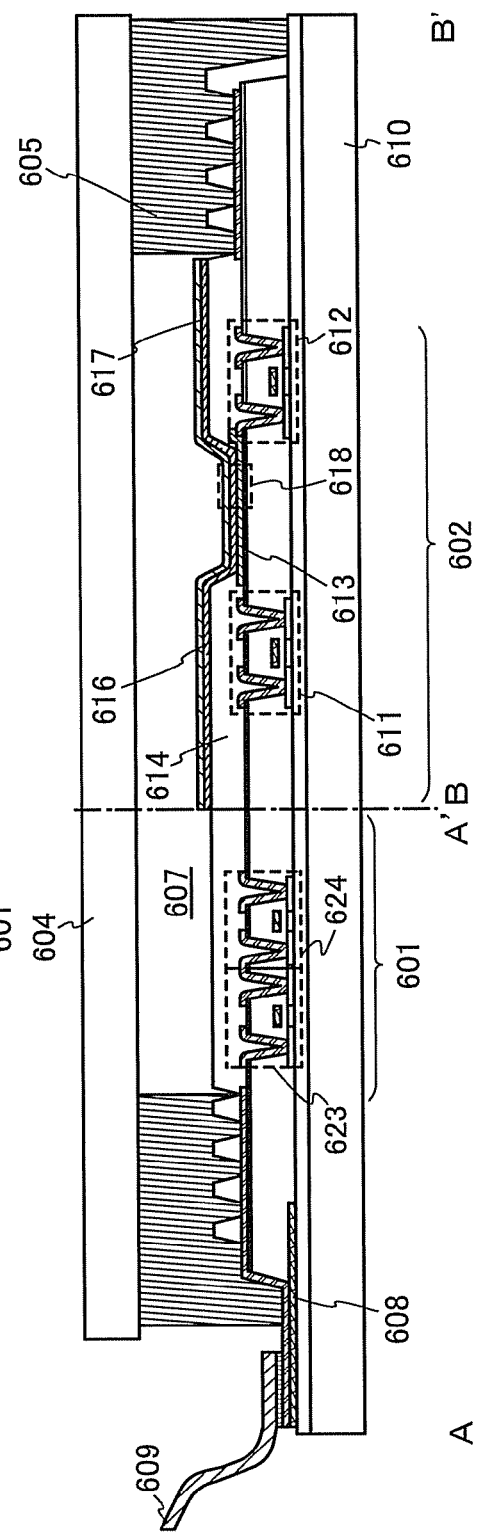

In this embodiment, an image display device having a light-emitting element in a pixel portion is described with reference to FIGS. 2A and 2B. Note that FIG. 2A is a top view illustrating an image display device while FIG. 2B is a cross-sectional view taken along lines A-A' and B-B' in FIG. 2A. This image display device includes: a pixel portion 602 shown with a dotted line; and a driver circuit portion (source side driver circuit) 601 shown with a dotted line and a driver circuit portion (gate side driver circuit) 603 shown with a dotted line for controlling light emission of the light-emitting element. Further, reference numeral 604 denotes a sealing substrate; 605, a sealing material; and 607, a space surrounded by the sealing material 605.

Note that a leading wiring 608 is a wiring for transmitting signals input to the source side driver circuit 601 and the gate side driver circuit 603. The leading wiring 608 receives video signals, clock signals, start signals, reset signals, and the like from an FPC (flexible printed circuit) 609 that serves as an external input terminal. Although only the FPC is shown here, this FPC may be provided with a printed wiring board (PWB). The light-emitting device in this specification includes not only a light-emitting device itself but also a light-emitting device with an FPC or a PWB attached thereto.

Next, a cross-sectional structure will be explained with reference to FIG. 2B. The driver circuit portion and the pixel portion are formed over an element substrate 610. Here, the source side driver circuit 601, which is the driver circuit portion, and one pixel in the pixel portion 602 are shown.

Note that a CMOS circuit which is a combination of an N-channel TFT 623 and a P-channel TFT 624 is formed in the source side driver circuit 601. The driver circuit including a thin film transistor (TFT) can be formed with various CMOS circuits, PMOS circuits, or NMOS circuits. In this embodiment, a driver-integrated type in which a driver circuit is formed over the substrate is described; however, an embodiment of the present invention is not limited to this, and it is also possible to form the driver circuit not on the substrate but outside the substrate externally.

The pixel portion 602 includes a plurality of pixels each having a switching TFT 611, a current controlling TFT 612, and a first electrode 613 that is electrically connected to a drain of the current controlling TFT 612. Note that an insulator 614 is formed to cover the edge portion of the first electrode 613. Here, a positive photosensitive acrylic resin film is formed as the insulator 614.

Further, in order to improve the coverage, the insulator 614 is provided such that either an upper edge portion or a lower edge portion of the insulator 614 has a curved surface. For example, when a positive photosensitive acrylic resin is used as a material for the insulator 614, it is preferable that only an upper edge portion of the insulator 614 have a curved surface with a radius of curvature (0.2 μm to 3 μm). The insulator 614 can be formed using either a negative type that becomes insoluble in an etchant by light irradiation or a positive type that becomes soluble in an etchant by light irradiation.

Over the first electrode 613, a layer 616 including a light-emitting layer and a second electrode 617 are formed. Here, various metals, alloys, electrically conductive compounds, or mixtures thereof can be used for a material of the first electrode 613. If the first electrode is used as an anode, it is preferable that the first electrode be formed using a metal, an alloy, an electrically conductive compound, or a mixture thereof, with a high work function (a work function of 4.0 eV or higher) among such materials. For example, the first electrode 613 can be formed using a single-layer film such as an indium tin oxide film containing silicon, an indium zinc oxide film, a titanium nitride film, a chromium film, a tungsten film, a Zn film, a Pt film, or the like; a stacked film of a titanium nitride film and a film containing aluminum as its main component; or a three-layer structure of a titanium nitride film, a film containing aluminum as its main component, and a titanium nitride film. Note that, when a stacked structure is employed, resistance of a wiring is low and a favorable ohmic contact can be obtained.

The layer 616 including a light-emitting layer is formed by various methods such as an evaporation method using an evaporation mask, an inkjet method, a spin coating method, or the like. The layer 616 including the light-emitting layer has the light-emitting layer shown in Embodiment 1. Further, a material used for the layer 616 including the light-emitting layer may be a low molecular material, a medium molecular material (the category includes an oligomer and a dendrimer) having an intermediate property between a high molecular material and a low molecular material, or a high molecular material. As the material for the layer 616 including the light-emitting layer, not only an organic compound but also an inorganic compound may be used.

As the material for the second electrode 617, various types of metals, alloys, electrically conductive compounds, mixtures thereof, or the like can be used. When the second electrode 617 is used as a cathode, it is preferable that the second electrode 617 be formed using a metal, an alloy, an electrically conductive compound, or a mixture thereof, with a low work function (a work function of 3.8 eV or lower) among such materials. As an example, elements belonging to Group 1 or Group 2 in the periodic table, i.e., alkali metals such as lithium (Li) and cesium (Cs), alkaline earth metals such as magnesium (Mg), calcium (Ca), and strontium (Sr), alloys containing any of these (MgAg, AlLi), and the like can be given. In the case where light generated in the layer 616 including the light-emitting layer is transmitted through the second electrode 617, the second electrode 617 may also be formed with a multilayer of a metal thin film whose thickness is made thin, and a transparent conductive film (indium tin oxide (ITO), indium tin oxide containing silicon or silicon oxide, indium zinc oxide (IZO), indium oxide containing tungsten oxide and zinc oxide (IWZO), or the like).

By attaching the sealing substrate 604 to the element substrate 610 with the sealing material 605, a light-emitting element 618 is provided in the space 607 which is surrounded by the element substrate 610, the sealing substrate 604, and the sealing material 605. Note that the space 607 is filled with a filler. There are cases where the space 607 may be filled with an inert gas (such as nitrogen or argon), or where the space 607 may be filled with the sealing material 605. As the sealing material 605, an epoxy-based resin is preferably used. In addition, it is desirable to use a material that allows permeation of moisture or oxygen as little as possible. As the sealing substrate 604, a plastic substrate formed of FRP (fiberglass-reinforced plastics), PVF (polyvinyl fluoride), polyester, acrylic, or the like can be used besides a glass substrate or a quartz substrate.

As described above, an active matrix image display device having the light-emitting element of this embodiment can be obtained.

Figure 3A:
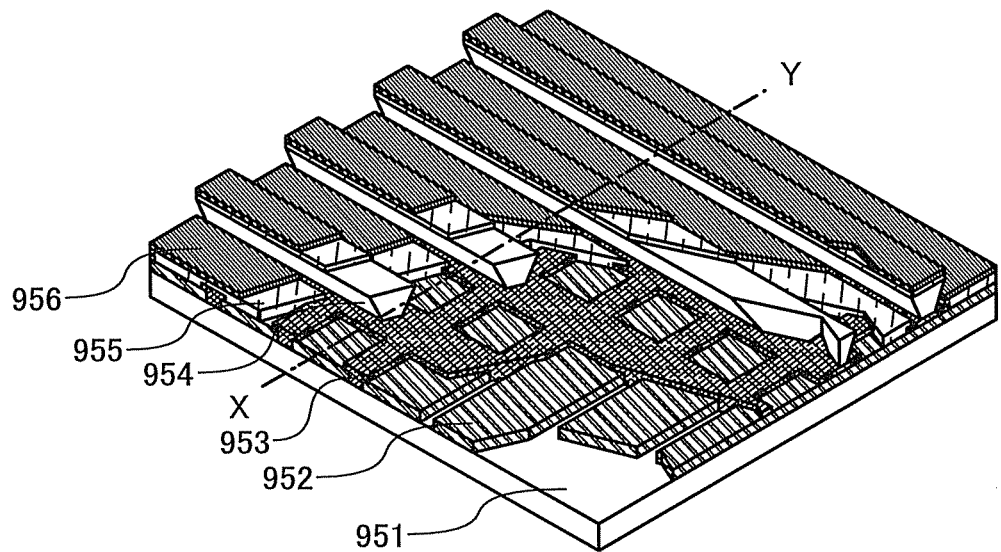
FIGS. 3A and 3B are schematic diagrams illustrating a light-emitting device which is an embodiment of the present invention.
Figure 3B:
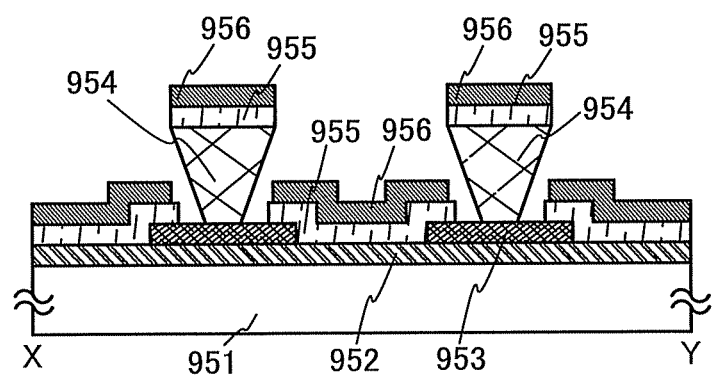

Although the active matrix image display device in which the driving of the light-emitting element is controlled by transistors has been described so far, the image display device may be of a passive type in which the light-emitting element is driven without particularly providing elements for driving, such as transistors. FIGS. 3A and 3B illustrate a passive matrix image display device which is formed using the light-emitting element described in Embodiment 1. In FIGS. 3A and 3B, a layer 955 including a light-emitting layer is provided between an electrode 952 and an electrode 956 over a substrate 951. The edge portion of the electrode 952 is covered with an insulating layer 953. A partition layer 954 is provided on the insulating layer 953. The sidewalls of the partition layer 954 slope so that the distance between one sidewall and the other sidewall is gradually reduced toward the surface of the substrate. In other words, a cross section taken in the direction of the short side of the partition layer 954 is trapezoidal, and the lower side (a side in contact with the insulating layer 953, which is one of a pair of parallel sides of the trapezoidal cross section) is shorter than the upper side (a side not in contact with the insulating layer 953, which is the other one of the pair of parallel sides). By providing the partition layer 954 in this manner, defects of the light-emitting element due to static charge and the like can be prevented.

As described above, since the image display device described in this embodiment has the light-emitting element described in Embodiment 1, the image display device has high emission efficiency, a long lifetime, and low driving voltage. Therefore, the image display device described in this embodiment has very low power consumption and a long lifetime.

Note that Embodiment 2 can be combined with another embodiment as appropriate.

Embodiment 3

The light-emitting element described in Embodiment 1 has high light emission efficiency, a long lifetime, and low driving voltage; therefore, the light-emitting element is suitable for a lighting device which is an example of a light-emitting device. Accordingly, in this embodiment, an application example of a lighting device using the light-emitting element described in Embodiment 1 is described.

Figure 4A:
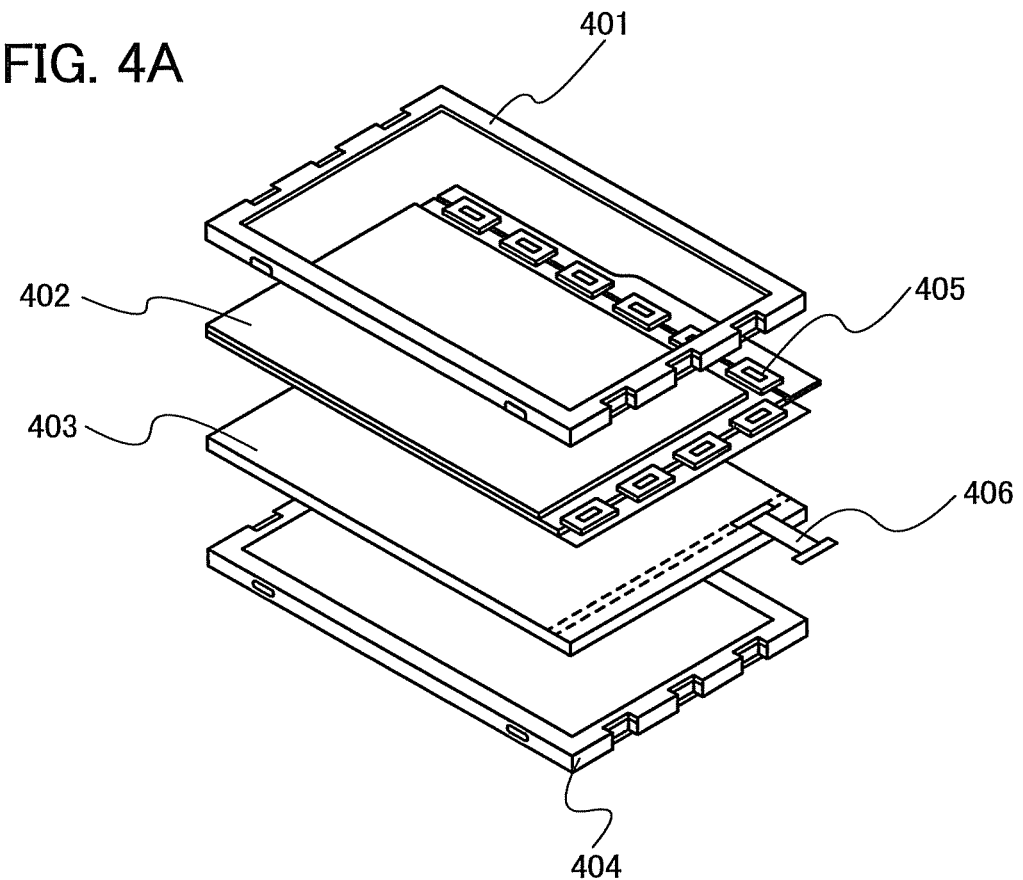
FIGS. 4A and 4B are schematic diagrams each illustrating an electronic device which is an embodiment of the present invention.

FIG. 4A shows an example of a liquid crystal display device in which the light-emitting element described in Embodiment 1 is used as a backlight which is one kind of lighting devices. The liquid crystal display device illustrated in FIG. 4A includes a housing 401, a liquid crystal layer 402, a backlight 403, and a housing 404, in which the liquid crystal layer 402 is connected to a driver IC 405. The light-emitting element described in Embodiment 1 is used as the backlight 403. Current is supplied to the backlight 403 through a terminal 406.

By using the light-emitting element described in Embodiment 1 for the backlight of the liquid crystal display device, a backlight having high light emission efficiency, a long lifetime, and low driving voltage can be obtained. Moreover, since a backlight using the light-emitting element described in Embodiment 1 is a plane emission type lighting device and can be formed in a large area, the liquid crystal display device can also have a larger area. Moreover, since the backlight using the light-emitting element described in Embodiment 1 is thin and consumes less electric power, reduction in thickness and power consumption of the display device is possible.

Figure 4B:
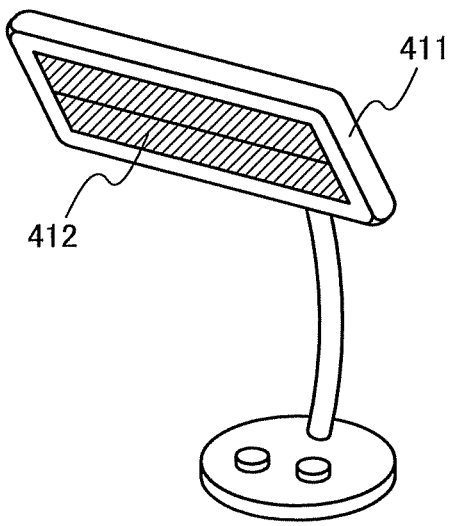

FIG. 4B illustrates an example in which a lighting device using the light-emitting element described in Embodiment 1 is used as a light source of a desk lamp. The desk lamp illustrated in FIG. 4B includes a housing 411 and a light source 412. The light-emitting element described in Embodiment 1 is used as the light source 412. Since the light-emitting element described in Embodiment 1 has high light emission efficiency, a long lifetime, and low driving voltage, power consumption of the desk lamp can be reduced and a lifetime thereof can be prolonged.

As described above, the lighting device described in this embodiment includes the light-emitting element described in Embodiment 1; thus, the light-emitting element has high light emission efficiency, a long lifetime, and low driving voltage. Therefore, the lighting device using the light-emitting element described in Embodiment 1 consumes very low power and has a long lifetime.

Embodiment 4

The image display device described in Embodiment 2 can display an excellent image. Therefore, electronic devices that are capable of providing an excellent image can be obtained by applying the image display device described in Embodiment 2 to display portions of the electronic devices. In addition, the image display device or the lighting device (i.e., a light-emitting device) including the light-emitting element described in Embodiment 1 consumes very low power and has a long lifetime. Therefore, electronic devices with low power consumption can be obtained by applying the light-emitting device to the display portions of the electronic devices, and for example, a telephone or the like that has long battery standing time, and the like can be obtained. Hereinafter, an example of an electronic device provided with the light-emitting device to which the light-emitting element described in Embodiment 1 is applied is described.

Figure 5A:
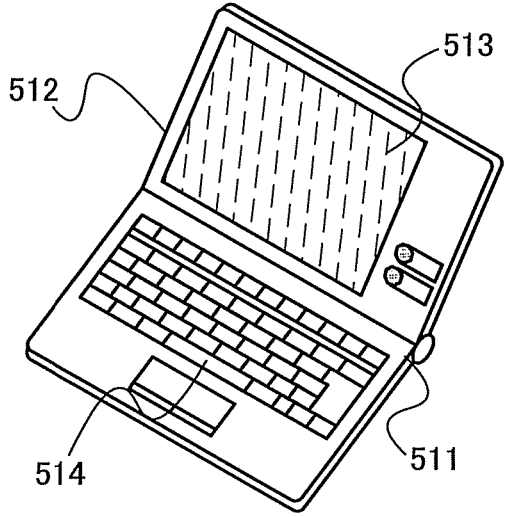
FIGS. 5A to 5D are schematic diagrams each illustrating an electronic device which is an embodiment of the present invention.

FIG. 5A is a computer which includes a main body 511, a housing 512, a display portion 513, a keyboard 514, and the like. In the computer, a light-emitting device including the light-emitting element described in Embodiment 1 is incorporated in the display portion 513. By providing the display portion 513 with the light-emitting element described in Embodiment 1, the computer can have low power consumption and the display portion 513 with a long lifetime.

Figure 5B:
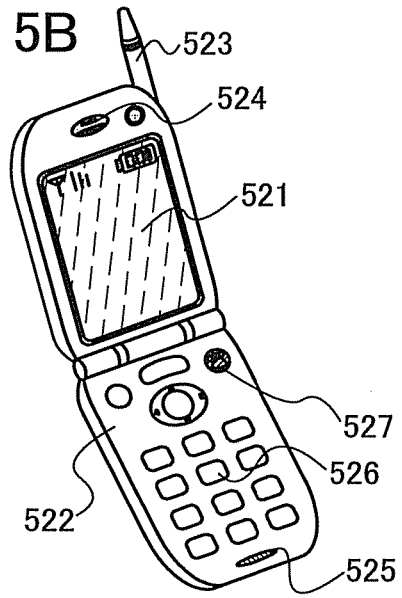

FIG. 5B is a telephone in which a main body 522 includes a display portion 521, an audio output portion 524, an audio input portion 525, operation switches 526 and 527, an antenna 523, and the like. In the telephone, a light-emitting device including the light-emitting element described in Embodiment 1 is incorporated in the display portion 521. By providing the display portion 521 with the light-emitting element described in Embodiment 1, the telephone can have low power consumption and the display portion 521 with a long lifetime.

Figure 5C:
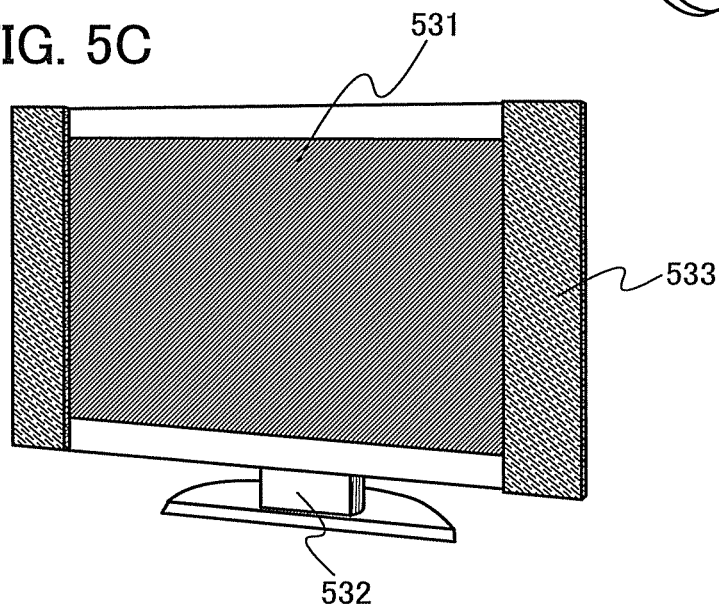

FIG. 5C is a television set which includes a display portion 531, a housing 532, a speaker 533, and the like. In the television set, a light-emitting device including the light-emitting element described in Embodiment 1 is incorporated in the display portion 531. By providing the display portion 531 with the light-emitting element described in Embodiment 1, the television set can have low power consumption and a long lifetime.

Figure 5D:
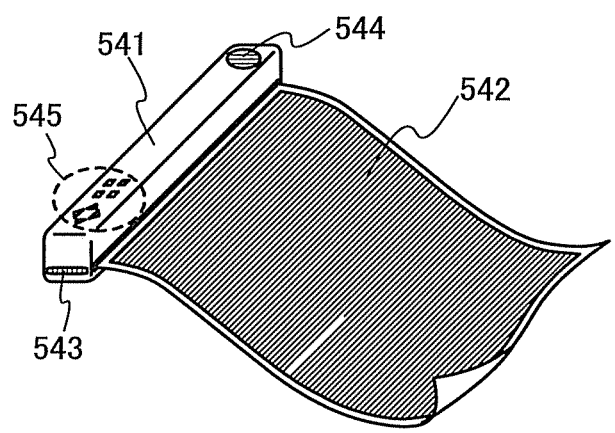

FIG. 5D is a flexible display which includes a main body 541, a display portion 542, an external memory slot 543, a speaker portion 544, operation keys 545, and the like. In addition, the main body 541 may be provided with a television receiving antenna, an external input terminal, an external output terminal, a buttery, or the like. In the flexible display, a light-emitting device including the light-emitting element described in Embodiment 1 is incorporated in the display portion 542. By providing the display portion 542 with the light-emitting element described in Embodiment 1, the flexible display can have low power consumption and a long lifetime.

As described above, the light-emitting device including the light-emitting element described in Embodiment 1 is suitable for a light-emitting device which is incorporated in display portions of various kinds of electronic devices.

Although the computer and the like are described in this embodiment, the light-emitting device including the light-emitting element described in Embodiment 1 may also be mounted on a navigation system or the like.

EXAMPLE 1

Figure 6:
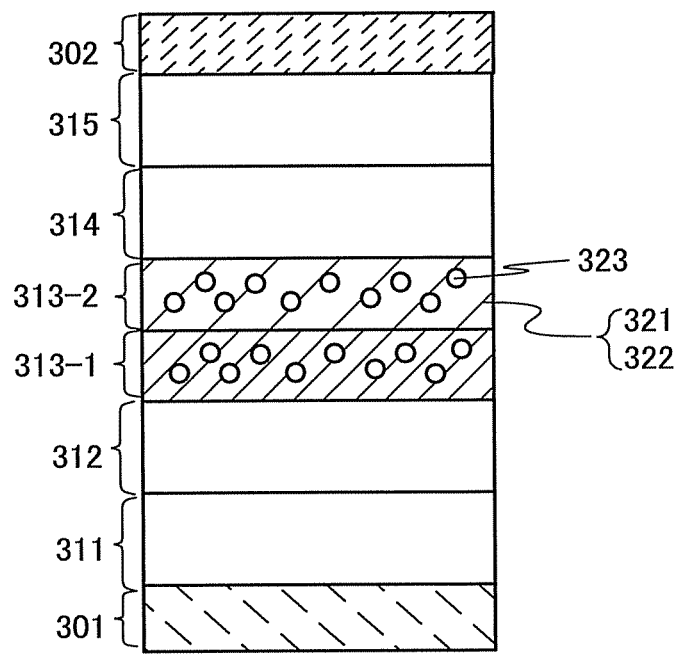
FIG. 6 is a schematic diagram illustrating a light-emitting element manufactured in any of Embodiments 1 to 4, which is an embodiment of the present invention.

In this example, the light-emitting element described in Embodiment 1 will be specifically exemplified with reference to a comparative example. Molecular structures of substances used in this example are represented by (i) to (iv) below. In addition, FIG. 6 illustrates an element structure.

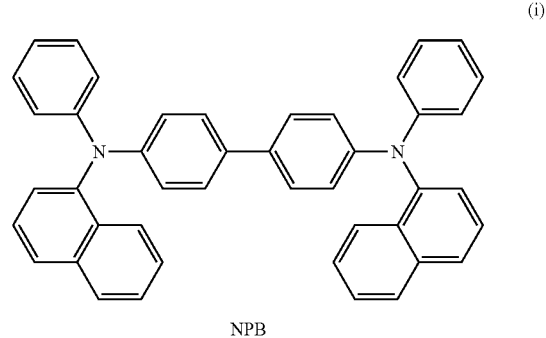

(i)

NPB

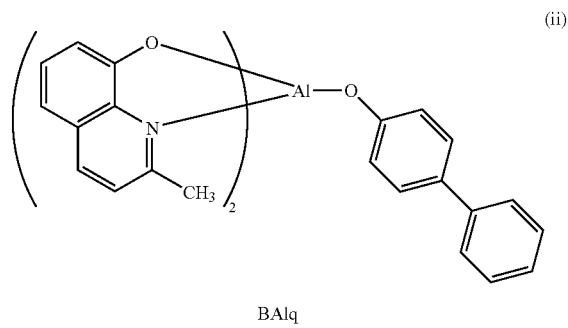

(ii)

BAlq

-continued

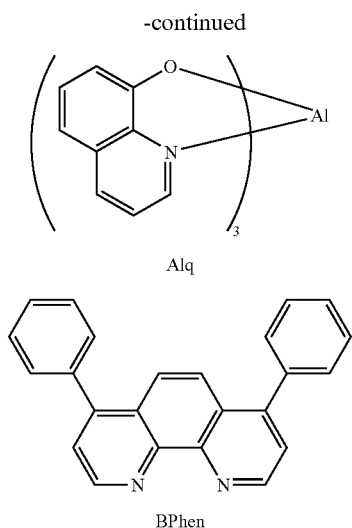

Alq

BPhen

<<Manufacturing of Light-Emitting Elements 1 to 3 and a Comparative Light-Emitting Element 1>>

First, over a glass substrate, an indium tin silicon oxide (ITSO) film was formed to a thickness of 110 nm as the first electrode 301 functioning as an anode. The periphery of a surface of the first electrode 301 was covered with a polyimide film so that an area of 2 mm×2 mm of the surface was exposed. As pretreatment for forming the light-emitting element over the substrate, the surface of the substrate was washed with ozone water. Next, after the substrate was baked at 200° C. for an hour, UV ozone treatment was performed for 370 seconds. Then, the substrate was transferred into a vacuum evaporation apparatus whose pressure was reduced to about $10^{-4}$ Pa, and vacuum baking at 170° C. for 30 minutes was conducted in a heating chamber of the vacuum evaporation apparatus, and then the substrate was cooled down for about 30 minutes.

Next, the substrate was fixed to a holder provided inside a vacuum evaporation apparatus so that the surface on which the first electrode 301 was formed faced downward.

After pressure in the vacuum evaporation apparatus was reduced to $10^{-4}$ Pa, NPB represented by the structural formula (i) and molybdenum(VI) oxide were co-evaporated so as to meet NPB:molybdenum(VI) oxide=4:1 (mass ratio), whereby the hole-injecting layer 311 was formed. The thickness of the hole-injecting layer 311 was 50 nm in this example. Note that the co-evaporation is an evaporation method in which some different substances are evaporated from some different evaporation sources at the same time. Next, NPB was deposited to be 10 nm thick, whereby the hole-transporting layer 312 was formed.

Subsequently, the first light-emitting layer 313-1 in contact with the hole-transporting layer 312 was formed to a thickness of 20 nm. In order to form the first light-emitting layer 313-1, BAlq represented by the structural formula (ii) was used as the host material; NPB, the hole-transporting material; and (acetylacetonato)bis(2,3,5-triphenylpyrazinato)iridium(III) (abbreviation: Ir(tppr)$_2$(acac)) represented by the structural formula (D10) in Embodiment 1, the light-emitting material, and these materials were co-evaporated. Here, the mass ratio of each substance in the first light-emitting layer 313-1 was set as follows: in the light-emitting element 1, BAlq:NPB:Ir(tppr)$_2$(acac)=1:1:0.06; in the light-emitting element 2, BAlq:NPB:Ir(tppr)$_2$(acac)=1:0.5:0.06; in the light-emitting element 3, BAlq:NPB:Ir(tppr)$_2$(acac)=1:0.25: 0.06; and in the comparative light-emitting element 1, BAlq: NPB:Ir(tppr)$_2$(acac)=1:0.1:0.06.

Next, the second light-emitting layer 313-2 in contact with the first light-emitting layer 313-1 was formed to a thickness of 20 nm. In order to form the second light-emitting layer 313-2, in a similar manner to the first light-emitting layer 313-1, BAlq was used as the host material; NPB, the hole-transporting material; and Ir(tppr)$_2$(acac), the light-emitting material, and these materials were co-evaporated. The mass ratio of each substance in the second light-emitting layer 313-2 was set as follows: in the light-emitting elements 1 to 3 and the comparative light-emitting element 1, BAlq:NPB:Ir (tppr)$_2$(acac)=1:0.1:0.06.

In such a manner, the light-emitting elements 1 to 3 each have two light-emitting layers in which the concentration of the hole-transporting material of the first light-emitting layer 313-1 which is close to the anode is higher than the concentration of the hole-transporting material of the second light-emitting layer 313-2 which is close to the cathode. That is, the light-emitting elements 1 to 3 each have a structure of the light-emitting element described in Embodiment 1. On the other hand, in the comparative light-emitting element 1, the first light-emitting layer 313-1 and the second light-emitting layer 313-2 have the same composition, and the first light-emitting layer 313-1 and the second light-emitting layer 313-2 can be regarded as a light-emitting element including one light-emitting layer with a thickness of 40 nm.

Then, Alq represented by the structural formula (iii) was evaporated to a thickness of 10 nm, and BPhen represented by the structural formula (iv) was evaporated to a thickness of 20 nm, whereby the electron-transporting layer 314 was formed. Further, the electron-injecting layer 315 in contact with the electron-transporting layer 314 was formed. In this example, as the electron-injecting layer 315, lithium fluoride was deposited to have a thickness of 1 nm. Lastly, aluminum was deposited to have a thickness of 200 nm as the second electrode 302 functioning as a cathode. Accordingly, a light-emitting element of this example was obtained. Note that in all of the above evaporation steps, a resistance heating method was adopted.

Note that an optimal mass ratio in terms of light emission efficiency and a lifetime is selected for the mass ratio of the three components of the light-emitting layer in the comparative light-emitting element 1 in the case where the light-emitting layer having a thickness of 40 nm is formed to have a single-layer structure.

<<Operation Characteristics of the Light-Emitting Elements 1 to 3 and the Comparative Light-Emitting Element 1>>

The thus obtained light-emitting elements 1 to 3 and comparative light-emitting element 1 were put into a glove box under a nitrogen atmosphere so that the light-emitting elements were sealed from atmospheric air. Then, the operation characteristics of these light-emitting elements were measured. The measurement was carried out at a room temperature (in the atmosphere kept at 25° C.).

Figure 7:
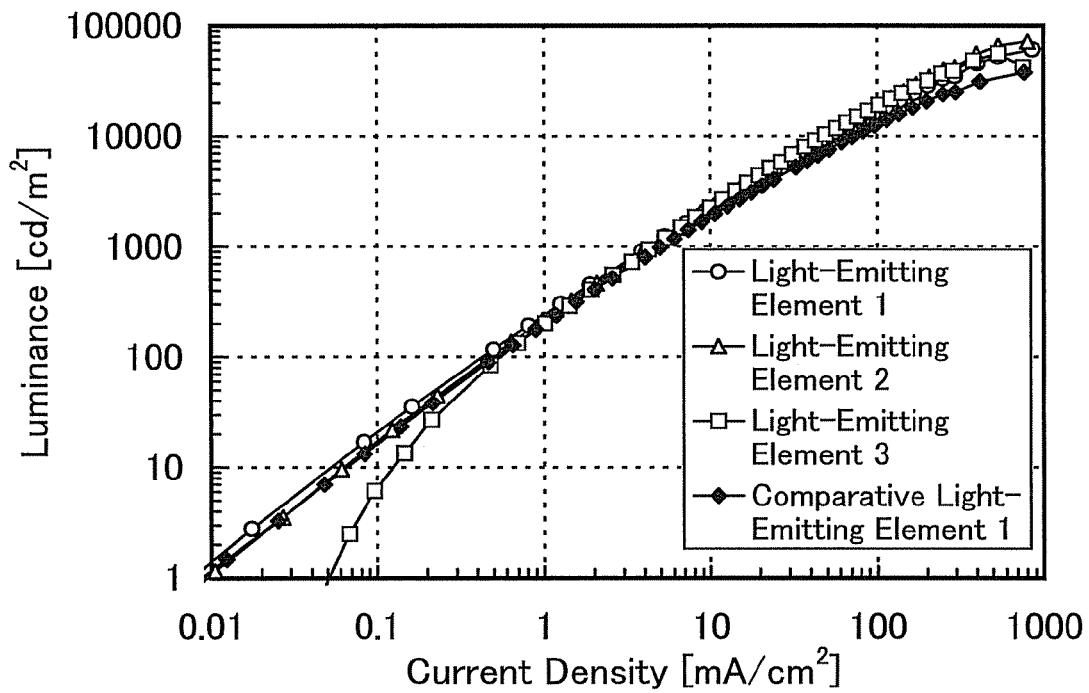
FIG. 7 is a graph showing current density-luminance characteristics of light-emitting elements 1 to 3 and a comparative light-emitting element 1.
Figure 8:
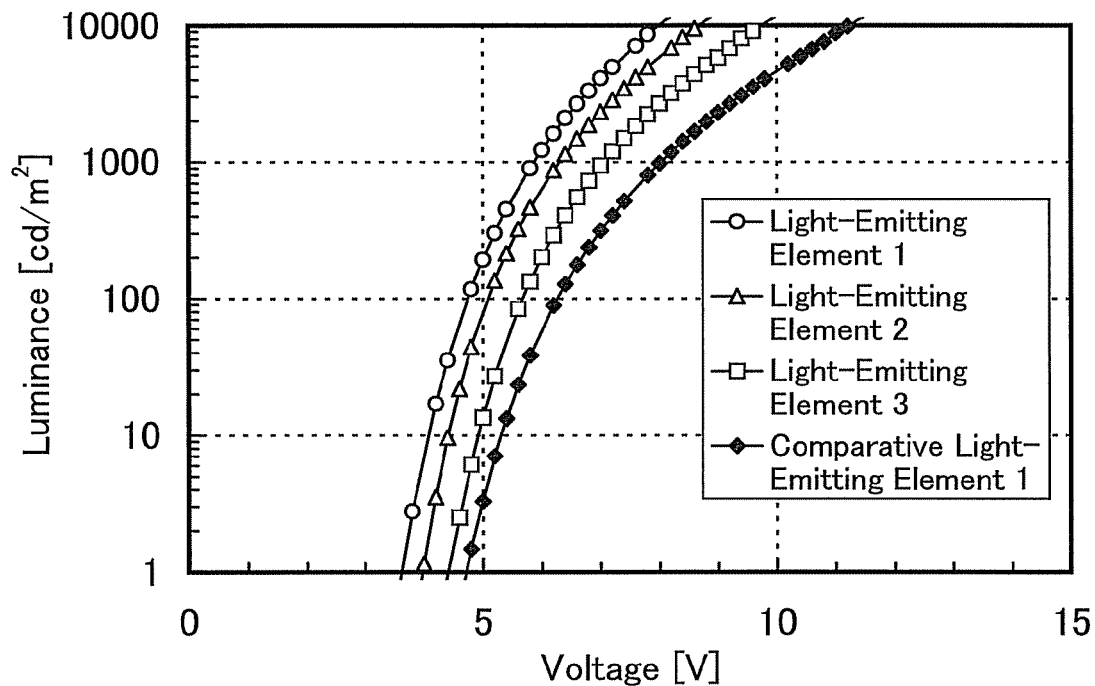
FIG. 8 is a graph showing voltage-luminance characteristics of the light-emitting elements 1 to 3 and the comparative light-emitting element 1.
Figure 9:
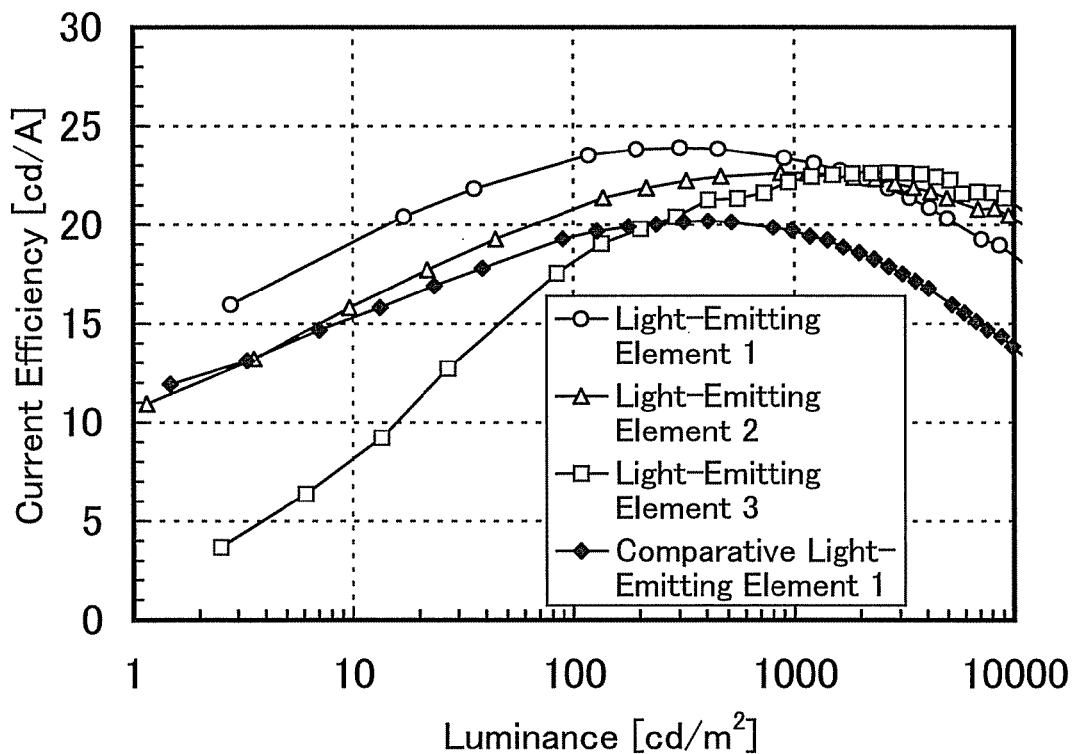
FIG. 9 is a graph showing luminance-current efficiency characteristics of the light-emitting elements 1 to 3 and the comparative light-emitting element 1.
Figure 10:
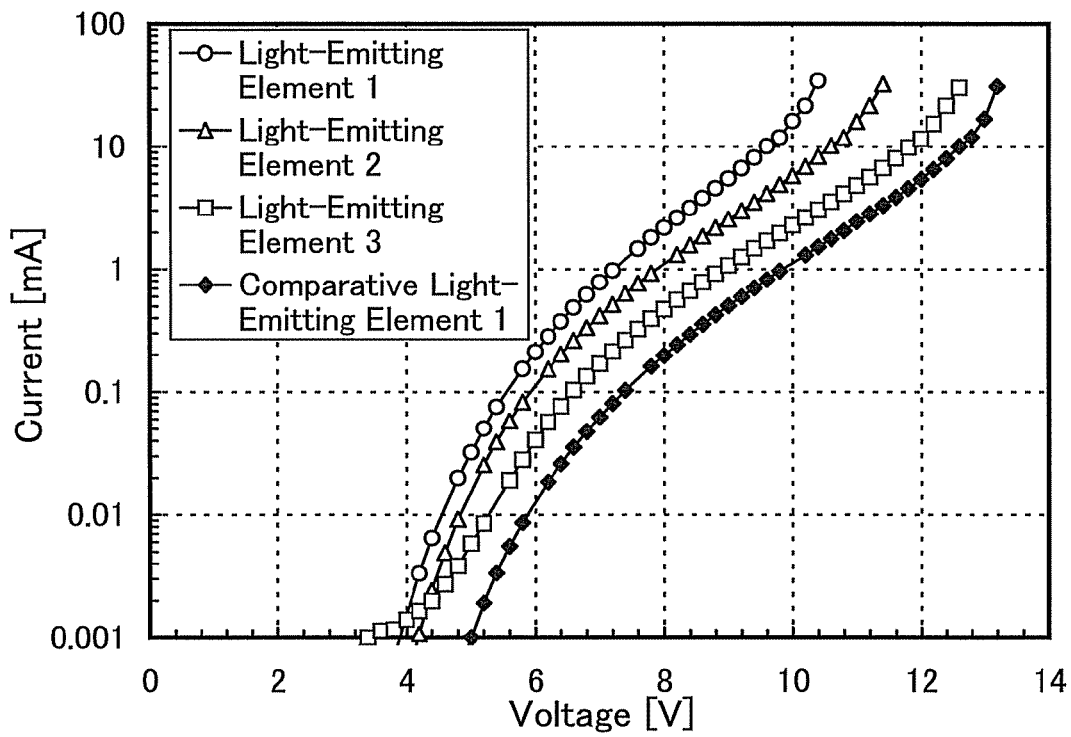
FIG. 10 is a graph showing voltage-current characteristics of the light-emitting elements 1 to 3 and the comparative light-emitting element 1.
Figure 11:
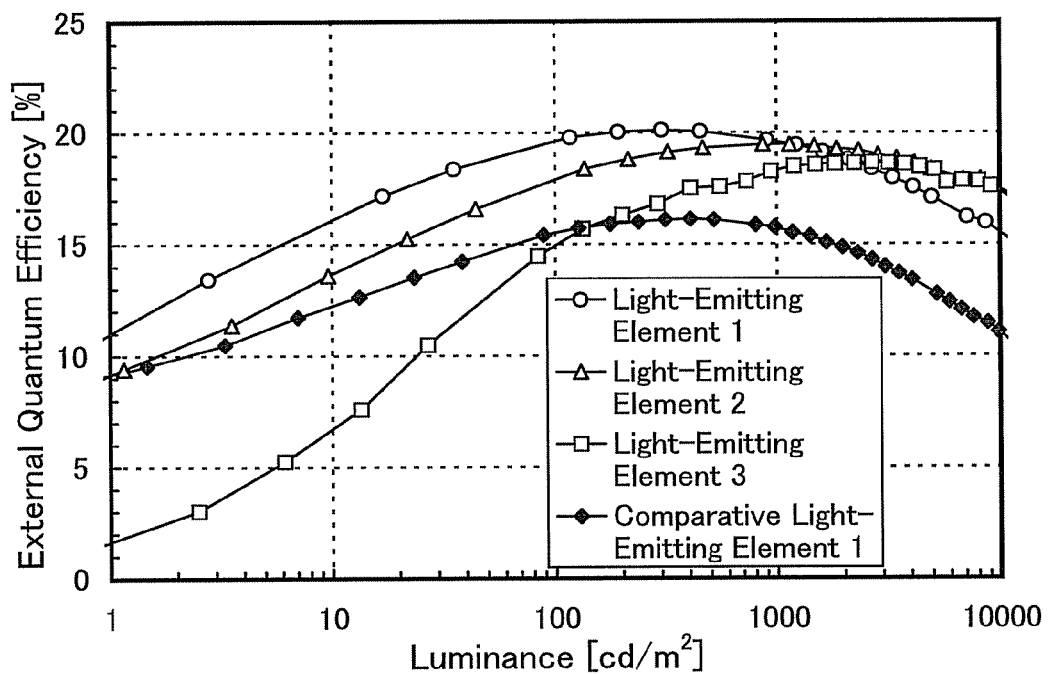
FIG. 11 is a graph showing luminance-external quantum efficiency characteristics of the light-emitting elements 1 to 3 and the comparative light-emitting element 1.
Figure 12:
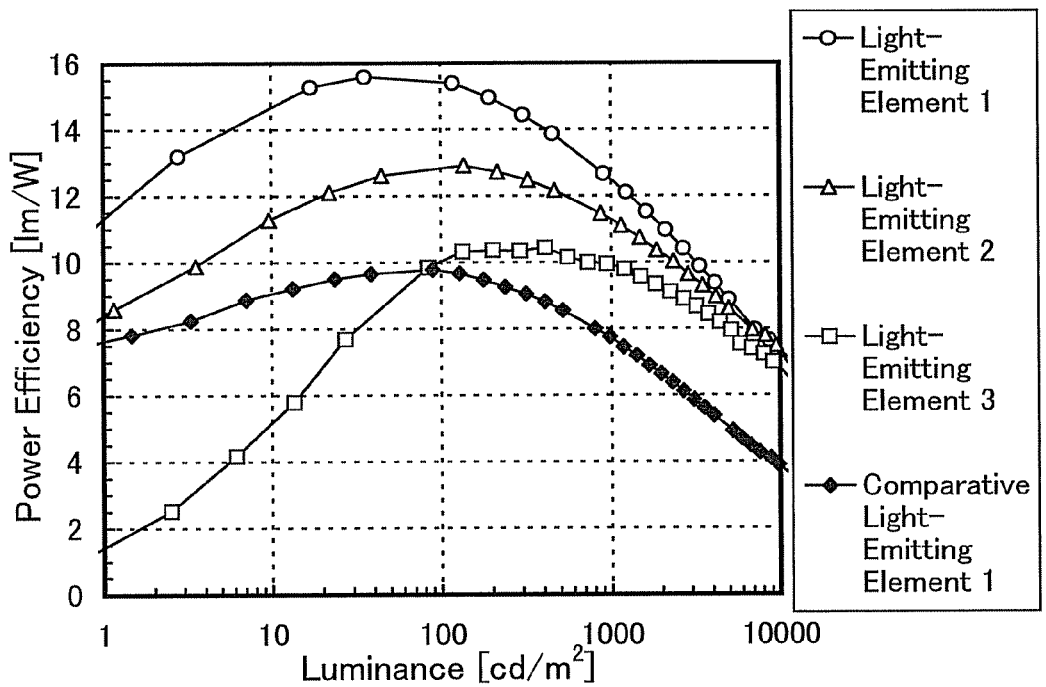
FIG. 12 is a graph showing luminance-power efficiency characteristics of the light-emitting elements 1 to 3 and the comparative light-emitting element 1.

The current density-luminance characteristics of the light-emitting elements are shown in FIG. 7, and the voltage-luminance characteristics thereof are shown in FIG. 8. The luminance-current efficiency characteristics of the light-emitting elements are shown in FIG. 9, and the voltage-current characteristics thereof are shown in FIG. 10. The luminance-external quantum efficiency characteristics of the light-emitting elements are shown in FIG. 11, and the luminance-power efficiency characteristics thereof are shown in FIG. 12. Note that the emission spectra of the light-emitting elements were almost the same and the color of emission was red, which was derived from Ir(tppr)$_2$(acac).

It can be seen from FIGS. 7 to 10 that the current efficiency and the driving voltage of the light-emitting elements 1 to 3 are improved as compared to the comparative light-emitting element 1. In addition, it can be seen from FIG. 12 that the power efficiency of the light-emitting elements 1 to 3 is significantly improved as compared to the comparative light-emitting element 1. Further, it can be seen from FIG. 11 that reduction in efficiency of the light-emitting elements 1 to 3 on the high luminance side is small and T-T annihilation can be suppressed as compared to the comparative light-emitting element 1.

Table 1 shows initial values of main characteristics of the light-emitting elements at a practical luminance of about 1000 cd/cm$^2$.

TABLE 1

|  | Voltage [V] | Luminance [cd/m$^2$] | Current Efficiency [cd/A] | Power Efficiency [lm/W] | Quantum Efficiency [%] |
| --- | --- | --- | --- | --- | --- |
| Light-Emitting Element 1 | 5.8 | 902 | 23.4 | 13 | 20 |
| Light-Emitting Element 2 | 6.2 | 868 | 22.6 | 11 | 19 |
| Light-Emitting Element 3 | 7.0 | 942 | 22.2 | 9.9 | 18 |
| Comparative Light-Emitting Element 1 | 8.0 | 980 | 19.7 | 7.7 | 16 |

It can be seen from Table 1 that the driving voltage of the light-emitting elements 1 to 3 is lower than that of the comparative light-emitting element 1 by 1.0 V to 2.2 V. In addition, it can also be seen that the current efficiency and the quantum efficiency of the light-emitting elements 1 to 3 are improved. As described above, the light-emitting elements each having the structure described in Embodiment 1 can achieve both low driving voltage and improvement of light emission efficiency, and from a synergistic effect thereof, an effect of reducing power consumption is significant, and the power efficiency serving as a barometer is increased by about 30% to 70%.

As for LUMO levels of the host material (BAlq), the hole-transporting material (NPB), and the light-emitting material (Ir(tppr)$_2$(acac)) of this example, Japanese Published Patent Application No. 2008-160098 discloses that BAlq has a LUMO level of −2.54 eV, and Ir(tppr)$_2$(acac) has a LUMO level of −3.00 eV which are measured under the same condition as this example. In addition, it is disclosed in Taiju Tsuboi, and three others, Current Applied Physics, Vol. 5, pp. 47-54 (2005) that NPB (α-NPB in the reference) has a higher LUMO level than BAlq. As described above, it can be seen that the LUMO level of the light-emitting material is lower than the LUMO levels of the host material and the hole-transporting material by 0.2 eV or more in this example, and thus, such significant effects can be obtained. Note that although obtained values of the LUMO level slightly differ according to measurement methods, a relative relationship does not change; thus, the comparison described above was performed.

As described above, by manufacturing the light-emitting element described in Embodiment 1, both high light emission efficiency and low driving voltage can be achieved. Therefore, by manufacturing the light-emitting element described in Embodiment 1, a light-emitting element with high light emission efficiency and low driving voltage can be obtained.

REFERENCE EXAMPLE 1

Although the light-emitting elements 1 to 3 are elements whose composition (mass ratio) of the host material, the hole-transporting material, and the light-emitting material of the second light-emitting layer is fixed and whose mass ratio of the host material and the hole-transporting material of the first light-emitting layer is changed, in this reference example, an element whose composition of the first light-emitting layer is fixed and whose mass ratio of the host material and the hole-transporting material of the second light-emitting layer is changed is described. Note that an element structure is the same as the light-emitting elements 1 to 3 and the comparative light-emitting element 1, and corresponds to the structure illustrated in FIG. 6.

<<Manufacturing of Comparative Light-Emitting Elements 2 to 4>>

The process from the step of forming the first electrode 301 functioning as an anode to the step of forming the hole-transporting layer 312 was performed in a similar manner to the light-emitting elements 1 to 3 and the comparative light-emitting element 1.

Subsequently, the first light-emitting layer 313-1 was formed to a thickness of 20 nm. In order to form the first light-emitting layer 313-1, BAlq was used as the host material; NPB, the hole-transporting material; and Ir(tppr)$_2$(acac), the light-emitting material, and these materials were co-evaporated. The mass ratio of each substance in the first light-emitting layer 313-1 was set as follows: in the comparative light-emitting elements 2 to 4, BAlq:NPB:Ir(tppr)$_2$(acac)=1:0.1:0.06.

Next, the second light-emitting layer 313-2 was formed to a thickness of 20 nm. In order to form the second light-emitting layer 313-2, BAlq was used as the host material; NPB, the hole-transporting material; and Ir(tppr)$_2$(acac), the light-emitting material, and these materials were co-evaporated. The mass ratio of each substance in the second light-emitting layer 313-2 was set as follows: in the comparative light-emitting element 2, BAlq:NPB:Ir(tppr)$_2$(acac)=1:0.25:0.06; in the comparative light-emitting element 3, BAlq:NPB:Ir(tppr)$_2$(acac)=1:0.5:0.06; and in the comparative light-emitting element 4, BAlq:NPB:Ir(tppr)$_2$(acac)=1:1:0.06.

In such a manner, the comparative light-emitting elements 2 to 4 each have two light-emitting layers in which a ratio of components of the first light-emitting layer 313-1 is fixed and the concentration of the hole-transporting material of the first light-emitting layer 313-1 which is close to the anode is lower than that of the second light-emitting layer 313-2 which is close to the cathode.

Then, in a similar manner to the light-emitting elements 1 to 3 and the comparative light-emitting element 1, the electron-transporting layer 314, the electron-injecting layer 315, and the second electrode 302 functioning as a cathode were formed, whereby a light-emitting element was formed.

Note that the mass ratio of the host material and the hole-transporting material (the host material:the hole-transporting material) in the light-emitting layers of the light-emitting elements 1 to 3 and the comparative light-emitting elements 1 to 4 are described below.

TABLE 2

|  | Host Material:Hole-Transporting Material | |
| --- | --- | --- |
|  | First Light-Emitting Layer | Second Light-Emitting Layer |
| Light-Emitting Element 1 | 1:1 | 1:0.1 |
| Light-Emitting Element 2 | 1:0.5 | 1:0.1 |

TABLE 2-continued

| | Host Material:Hole-Transporting Material | |
|---|---|---|
| | First Light-Emitting Layer | Second Light-Emitting Layer |
| Light-Emitting Element 3 | 1:0.25 | 1:0.1 |
| Comparative Light-Emitting Element 1 | 1:0.1 | 1:0.1 |
| Comparative Light-Emitting Element 2 | 1:0.1 | 1:0.25 |
| Comparative Light-Emitting Element 3 | 1:0.1 | 1:0.5 |
| Comparative Light-Emitting Element 4 | 1:0.1 | 1:1 |

<<Operation Characteristics of the Comparative Light-Emitting Elements 2 to 4>>

The thus obtained comparative light-emitting elements 2 to 4 were put into a glove box under a nitrogen atmosphere so that the light-emitting elements were sealed from atmospheric air. Then, the operation characteristics of these light-emitting elements were measured. The measurement was carried out at a room temperature (in the atmosphere kept at 25° C.).

Figure 13:
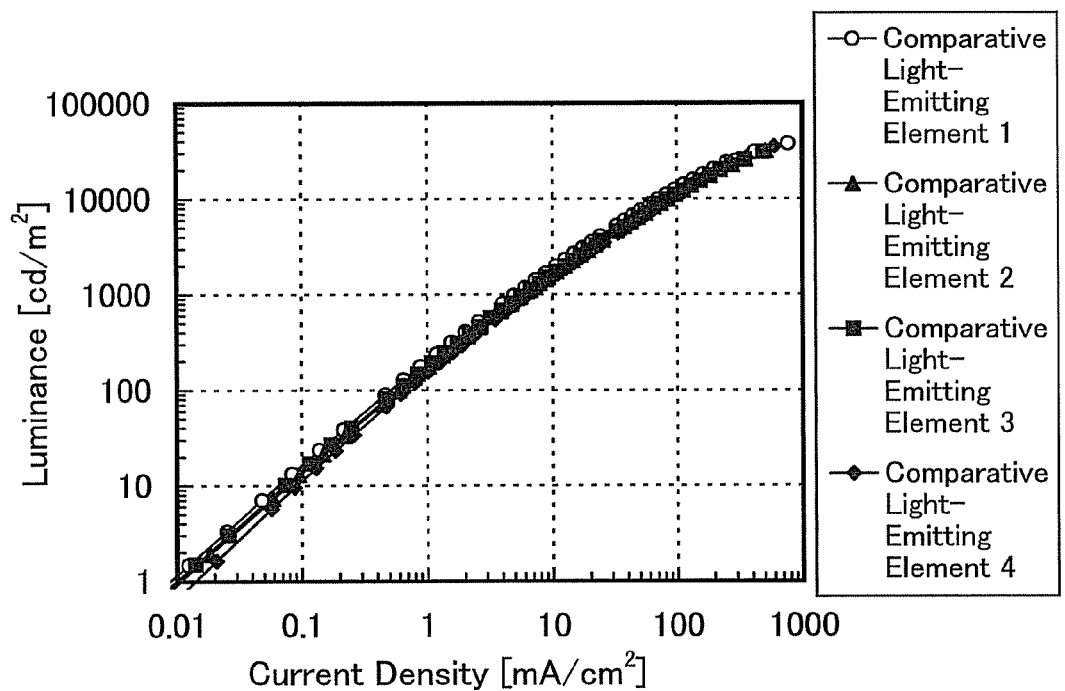
FIG. 13 is a graph showing current density-luminance characteristics of the comparative light-emitting element 1 and comparative light-emitting elements 2 to 4.
Figure 14:
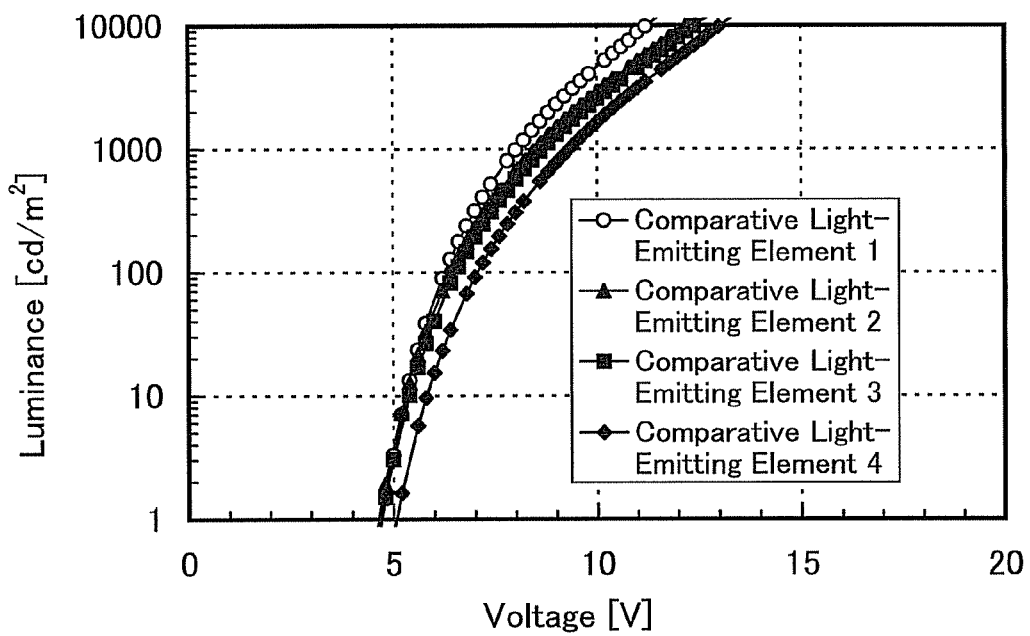
FIG. 14 is a graph showing voltage-luminance characteristics of the comparative light-emitting elements 1 to 4.
Figure 15:
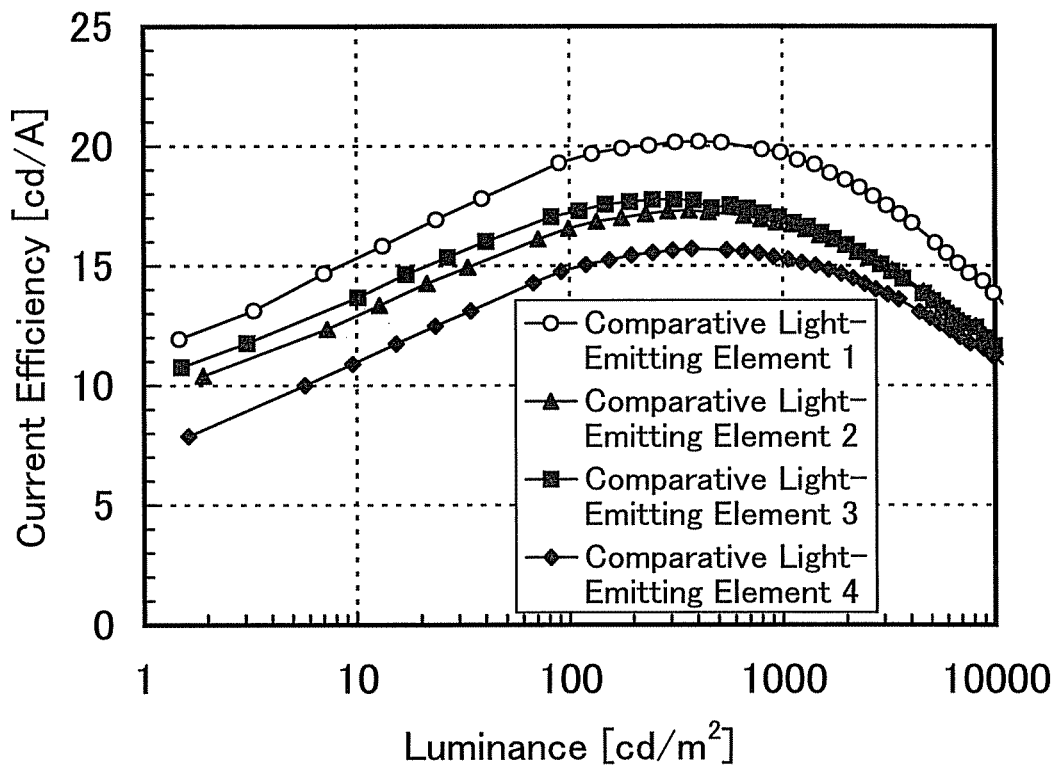
FIG. 15 is a graph showing luminance-current efficiency characteristics of the comparative light-emitting elements 1 to 4.
Figure 16:
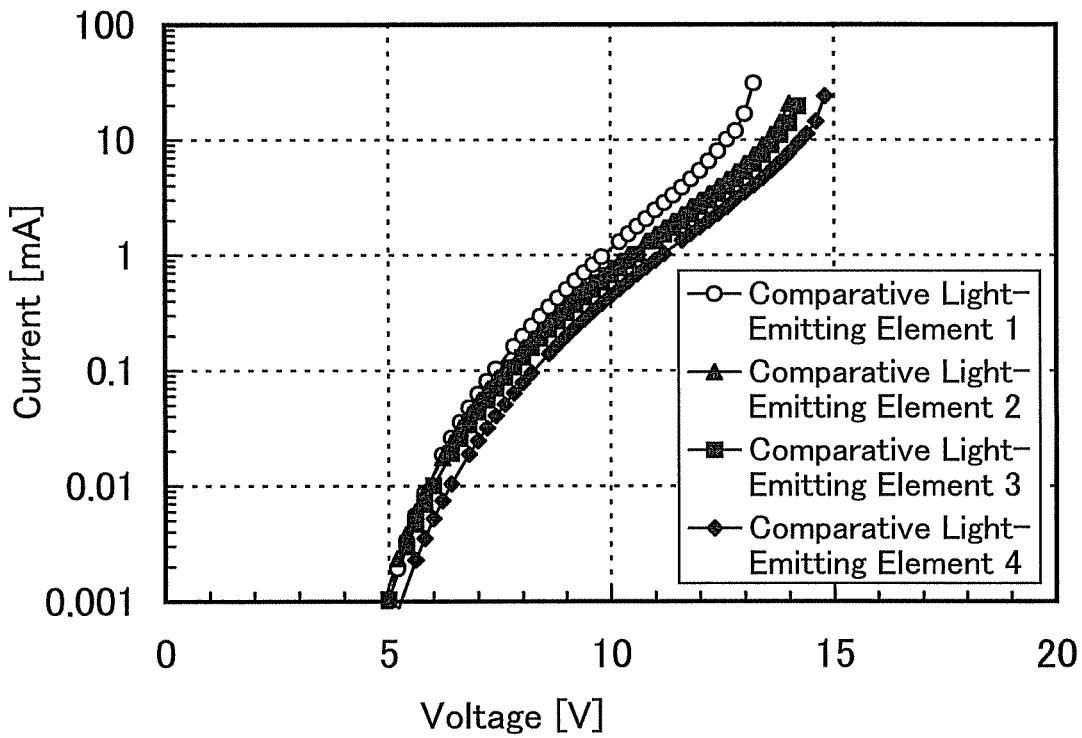
FIG. 16 is a graph showing voltage-current characteristics of the comparative light-emitting elements 1 to 4.
Figure 17:
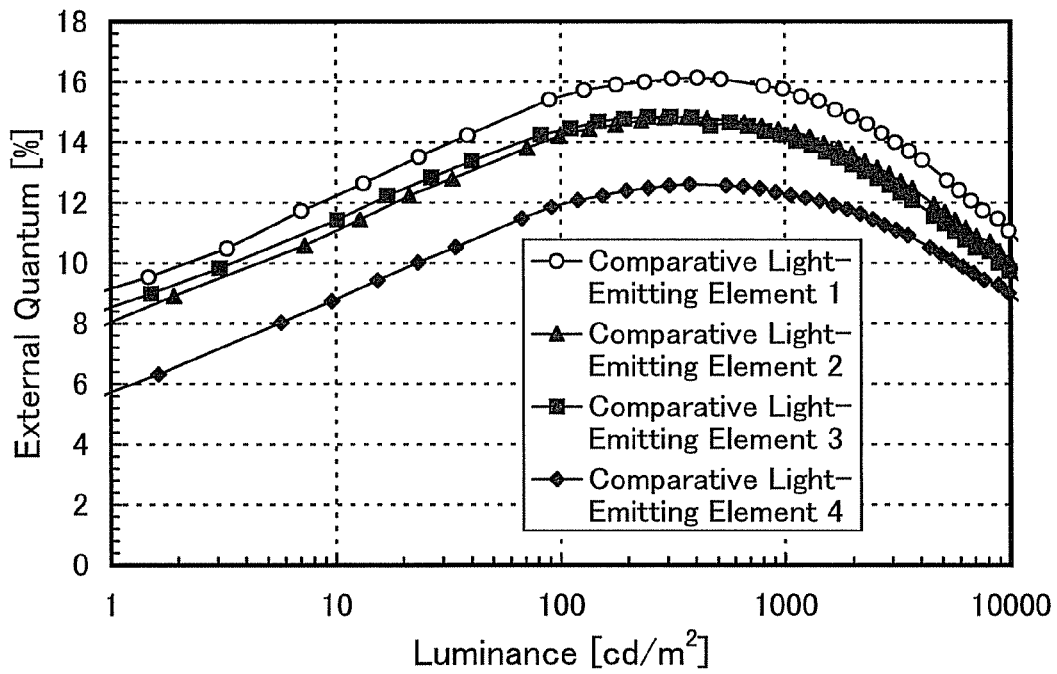
FIG. 17 is a graph showing luminance-external quantum efficiency characteristics of the comparative light-emitting elements 1 to 4.
Figure 18:
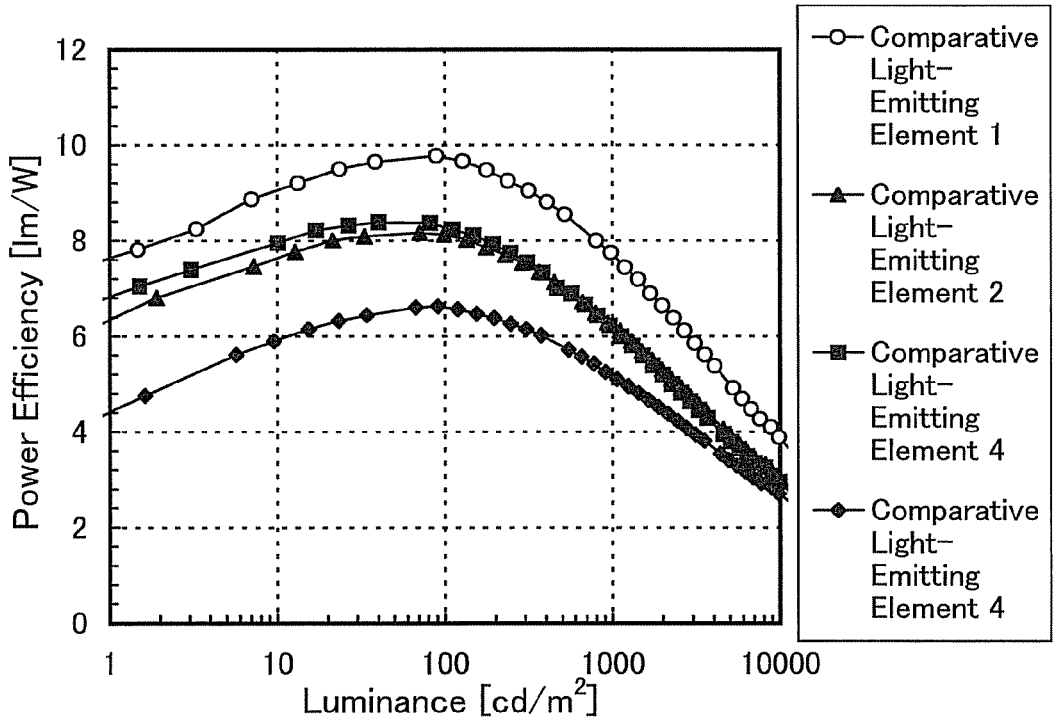
FIG. 18 is a graph showing luminance-power efficiency characteristics of the comparative light-emitting elements 1 to 4.

The current density-luminance characteristics of the comparative light-emitting elements 2 to 4 are shown in FIG. 13, and the voltage-luminance characteristics thereof are shown in FIG. 14. The luminance-current efficiency characteristics of the light-emitting elements are shown in FIG. 15, and the voltage-current characteristics thereof are shown in FIG. 16. The luminance-external quantum efficiency characteristics of the light-emitting elements are shown in FIG. 17, and the luminance-power efficiency characteristics thereof are shown in FIG. 18. Note that, in each diagram of characteristics, a characteristic curve of the comparative light-emitting element 1 is also shown for easily comparing the comparative light-emitting elements 2 to 4 with the light-emitting elements 1 to 3. The emission spectra of the light-emitting elements were almost the same and the color of emission was red, which was derived from Ir(tppr)$_2$(acac).

It can be seen from FIGS. 13 to 18 that each characteristic of the comparative light-emitting element 1 is better than that of the comparative light-emitting elements 2 to 4. The light-emitting elements 1 to 3 which are the light-emitting elements described in Embodiment 1 show favorable characteristics as compared to the comparative light-emitting element 1; thus, it can be seen that the structure of the light-emitting element described in Embodiment 1 is effective. In addition, it can be seen that each characteristic tends to deteriorate in accordance with increase in the concentration of the hole-transporting material in the second light-emitting layer 313-2.

Table 3 shows initial values of main characteristics of the light-emitting elements at a practical luminance of about 1000 cd/cm$^2$.

TABLE 3

| | Voltage [V] | Luminance [cd/m$^2$] | Current Efficiency [cd/A] | Power Efficiency [lm/W] | Quantum Efficiency [[%] |
|---|---|---|---|---|---|
| Comparative Light-Emitting Element 1 | 8.0 | 980 | 19.7 | 7.7 | 16 |
| Comparative Light-Emitting Element 2 | 8.4 | 935 | 16.8 | 6.3 | 14 |
| Comparative Light-Emitting Element 3 | 8.6 | 961 | 17.0 | 6.2 | 14 |
| Comparative Light-Emitting Element 4 | 9.4 | 1060 | 15.3 | 5.1 | 12 |

EXAMPLE 2

In this example, a light-emitting element having a structure different from that in Example 1 is specifically described. Note that substances used in this example are the same as those in Example 1; thus, molecular structures are not shown. The molecular structures shown in Example 1 are to be referred to. In this example, a light-emitting element in which the second light-emitting layer 313-2 has a thickness different from that in Example 1 is described with reference to FIG. 6.

<<Manufacturing of Light-Emitting elements 4 and 5 and a Comparative Light-Emitting Element 5>>

The process from the step of forming the first electrode 301 functioning as an anode to the step of forming the hole-transporting layer 312 was performed in a similar manner to the light-emitting elements 1 to 3 and the comparative light-emitting element 1.

Subsequently, over the hole-transporting layer 312, the first light-emitting layer 313-1 was formed to a thickness of 20 nm. In order to form the first light-emitting layer 313-1, BAlq represented by the structural formula (ii) was used as the host material; NPB, the hole-transporting material; and (acetylacetonato)bis(2,3,5-triphenylpyrazinato)iridium(III) (abbreviation: Ir(tppr)$_2$(acac)) represented by the structural formula (D10) in Example 1, the light-emitting material, and these materials were co-evaporated. Here, the mass ratio of each substance in the first light-emitting layer 313-1 was set as follows: in the light-emitting element 4, BAlq:NPB:Ir(tppr)$_2$(acac)=1:0.25:0.06; in the light-emitting element 5, BAlq:NPB:Ir(tppr)$_2$(acac)=1:0.5:0.06; and in the comparative light-emitting element 5, BAlq:NPB:Ir(tppr)$_2$(acac)=1:0.1:0.06.

Next, over the first light-emitting layer 313-1, the second light-emitting layer 313-2 was formed to a thickness of 30 nm. In order to form the second light-emitting layer 313-2, in a similar manner to the first light-emitting layer 313-1, BAlq was used as the host material; NPB, the hole-transporting material; and Ir(tppr)$_2$(acac), the light-emitting material, and these materials were co-evaporated. The mass ratio of each substance in the second light-emitting layer 313-2 was set as follows: in the light-emitting elements 4 and 5 and the comparative light-emitting element 5, BAlq NPB:Ir(tppr)$_2$(acac)=1:0.1:0.06.

In such a manner, in the light-emitting elements 4 and 5, the concentration of the hole-transporting material of the first light-emitting layer 313-1 which is close to the anode is higher than the concentration of the hole-transporting material of the second light-emitting layer 313-2 which is close to the cathode. That is, the light-emitting elements 4 and 5 each have a structure of the light-emitting element described in Embodiment 1. On the other hand, in the comparative light-emitting element 5, the first light-emitting layer 313-1 and the second light-emitting layer 313-2 have the same composition, and the first light-emitting layer 313-1 and the second light-emitting layer 313-2 can be regarded as a light-emitting element including one light-emitting layer with a thickness of 50 nm.

After that, as in Example 1, the electron-transporting layer 314, the electron-injecting layer 315, and the second electrode 302 functioning as a cathode were formed, whereby a light-emitting element was formed.

<<Operation Characteristics of the Light-Emitting Elements 4 and 5 and the Comparative Light-Emitting Element 5>>

The thus obtained light-emitting elements 4 and 5 and comparative light-emitting element 5 were put into a glove box under a nitrogen atmosphere as in Example 1 so that the light-emitting elements were sealed from atmospheric air. Then, the operation characteristics of these light-emitting elements were measured. The measurement was carried out at a room temperature (in the atmosphere kept at 25° C.).

Figure 19:
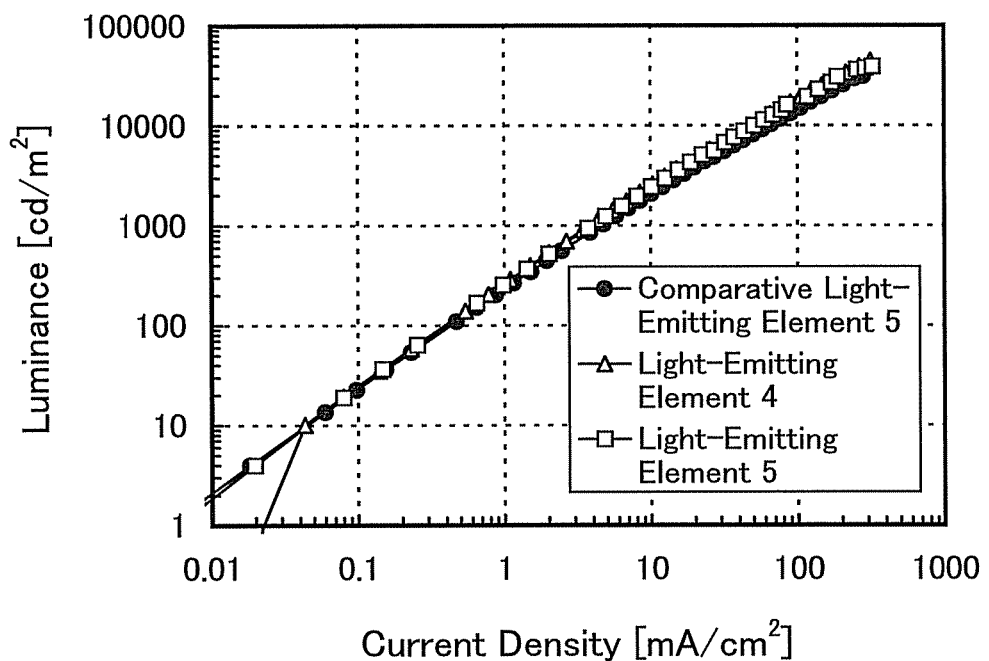
FIG. 19 is a graph showing current density-luminance characteristics of light-emitting elements 4 and 5 and a comparative light-emitting element 5.
Figure 20:
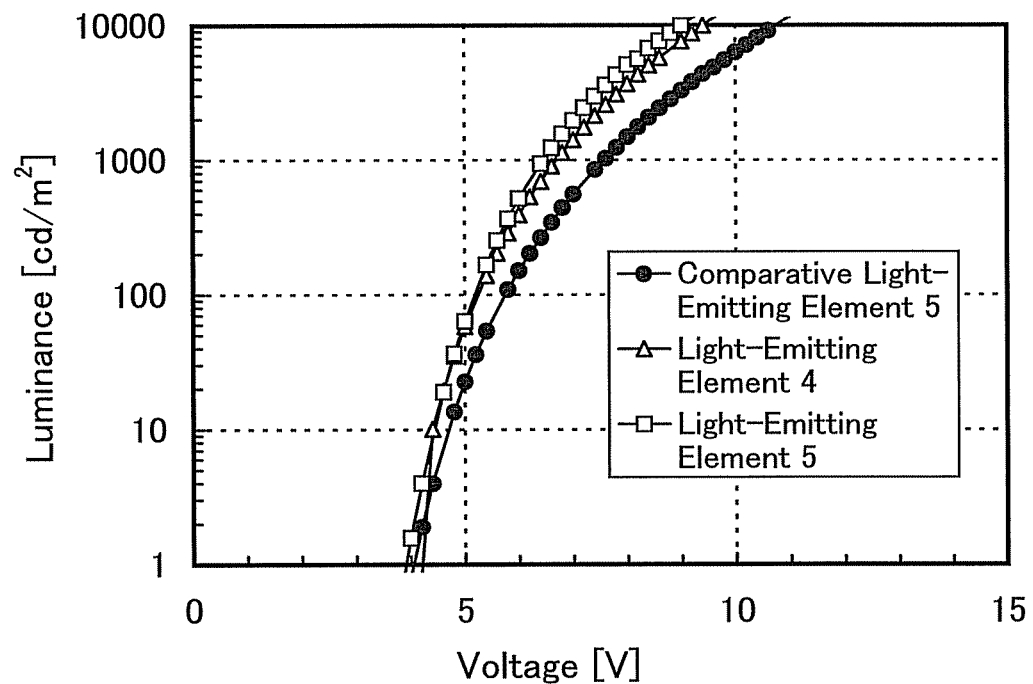
FIG. 20 is a graph showing voltage-luminance characteristics of the light-emitting elements 4 and 5 and the comparative light-emitting element 5.
Figure 21:
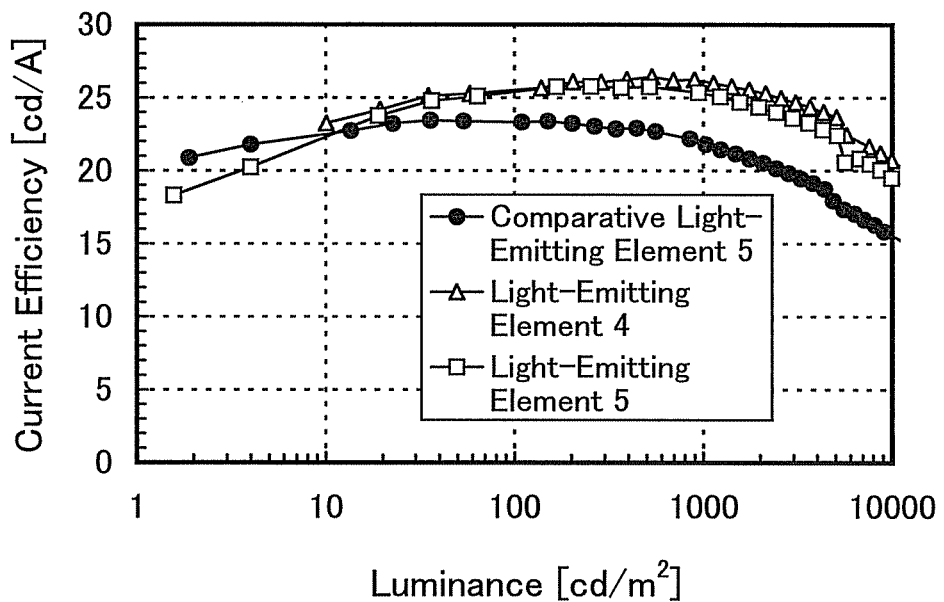
FIG. 21 is a graph showing luminance-current efficiency characteristics of the light-emitting elements 4 and 5 and the comparative light-emitting element 5.
Figure 22:
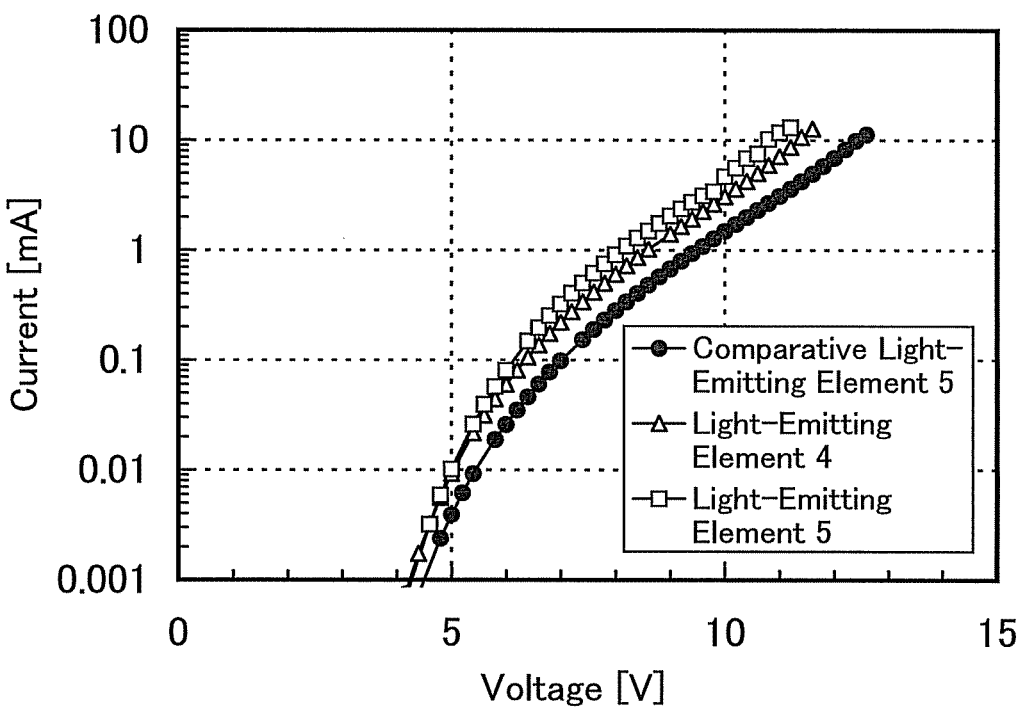
FIG. 22 is a graph showing voltage-current characteristics of the light-emitting elements 4 and 5 and the comparative light-emitting element 5.
Figure 23:
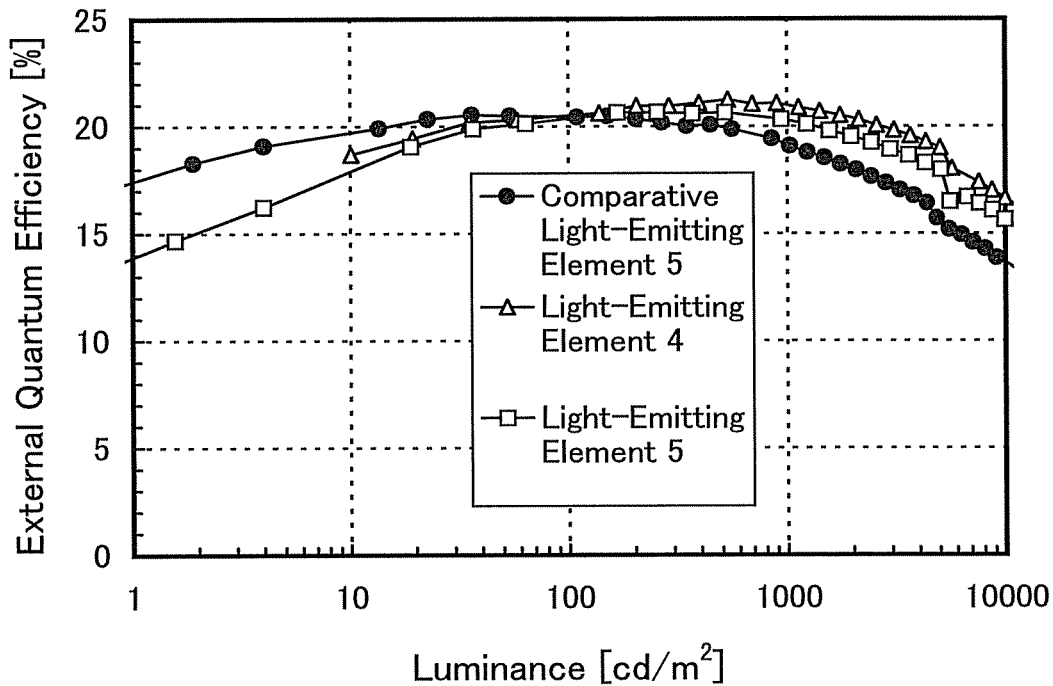
FIG. 23 is a graph showing luminance-external quantum efficiency characteristics of the light-emitting elements 4 and 5 and the comparative light-emitting element 5.
Figure 24:
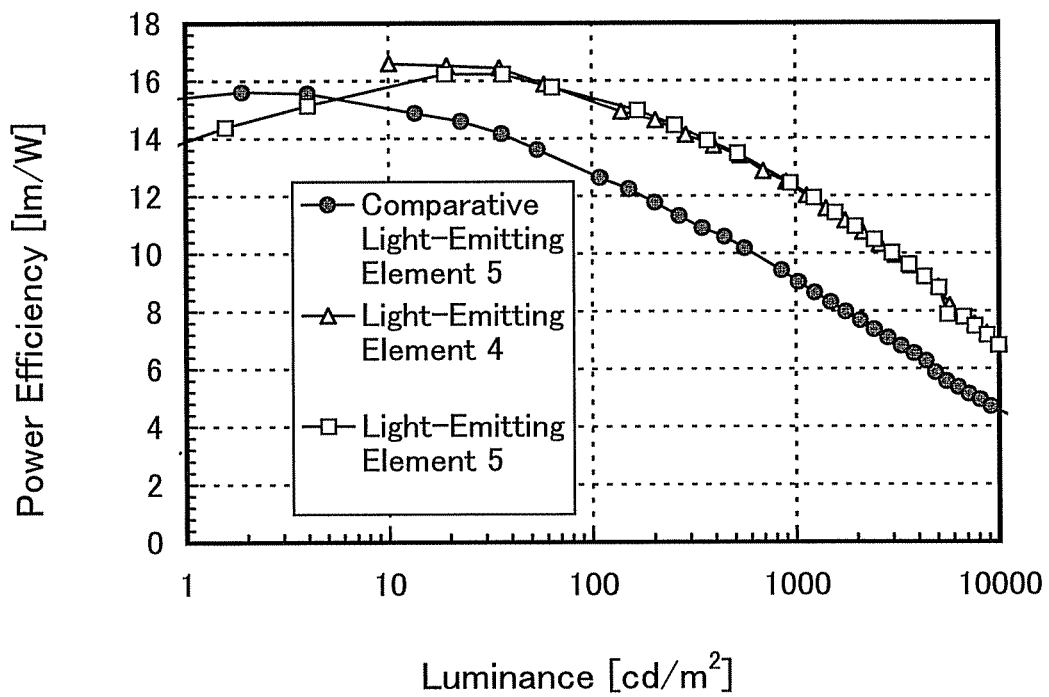
FIG. 24 is a graph showing luminance-power efficiency characteristics of the light-emitting elements 4 and 5 and the comparative light-emitting element 5.

The current density-luminance characteristics of the light-emitting elements 4 and 5 and the comparative light-emitting element 5 are shown in FIG. 19, and the voltage-luminance characteristics thereof are shown in FIG. 20. The luminance-current efficiency characteristics of the light-emitting elements are shown in FIG. 21, and the voltage-current characteristics thereof are shown in FIG. 22. The luminance-external quantum efficiency characteristics of the light-emitting elements are shown in FIG. 23, and the luminance-power efficiency characteristics thereof are shown in FIG. 24. The emission spectra of the light-emitting elements were almost the same and the color of emission was red, which was derived from Ir(tppr)$_2$(acac).

It can be seen from FIGS. 19 to 22 that the current efficiency and the driving voltage of the light-emitting elements 4 and 5 are improved as compared to the comparative light-emitting element 5. In addition, it can be seen from FIG. 24 that the power efficiency of the light-emitting elements 4 and 5 is significantly improved as compared to the comparative light-emitting element 5. In addition, it can be seen from FIG. 23 that reduction in efficiency of the light-emitting elements 4 and 5 on the high luminance side is small and T-T annihilation can be suppressed as compared to the comparative light-emitting element 5.

Table 4 shows initial values of main characteristics of the light-emitting elements at a practical luminance of about 1000 cd/cm$^2$.

TABLE 4

|  | Voltage [V] | Luminance [cd/m$^2$] | Current Efficiency [cd/A] | Power Efficiency [lm/W] | Quantum Efficiency [[%] |
|---|---|---|---|---|---|
| Light-Emitting Element 4 | 6.6 | 899 | 26.2 | 12 | 21 |
| Light-Emitting Element 5 | 6.4 | 941 | 25.4 | 12 | 20 |
| Comparative Light-Emitting Element 5 | 7.6 | 1030 | 21.8 | 9.0 | 19 |

It can be seen from Table 4 that first, the driving voltage of the light-emitting elements 4 and 5 is lower than that of the comparative light-emitting element 5 by about 1.0 V. In addition, it can also be seen that the current efficiency and the quantum efficiency of the light-emitting elements 4 and 5 are improved. As described above, the light-emitting elements each having the structure described in Embodiment 1 can achieve both low driving voltage and improvement of light emission efficiency, and from a synergistic effect thereof, an effect of reducing power consumption is significant, and the power efficiency serving as a barometer is increased by about 30%.

Figure 25:
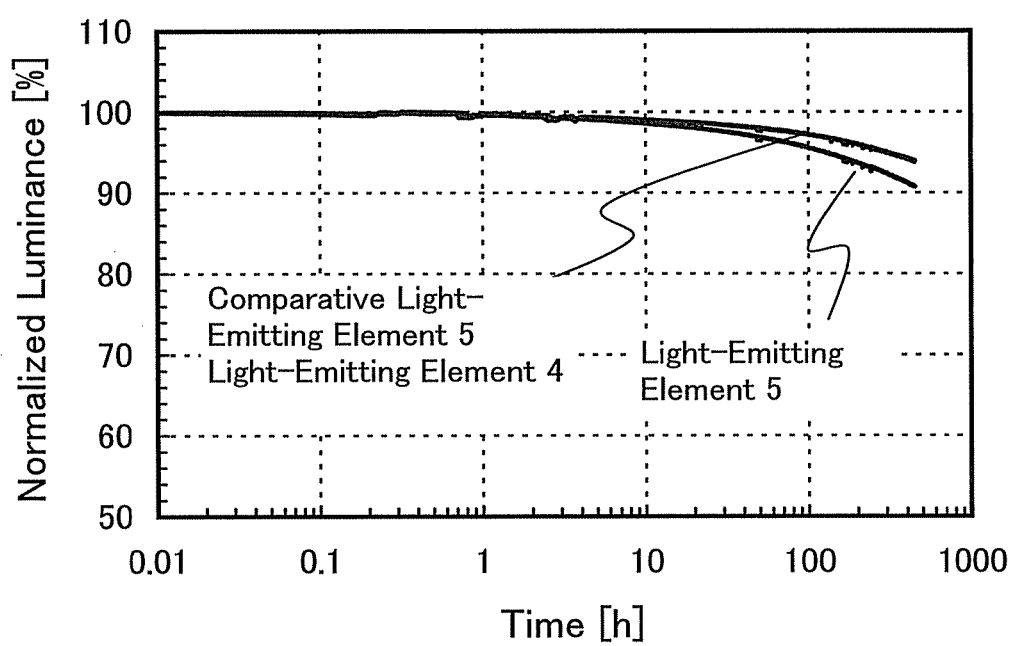
FIG. 25 is a graph showing luminance degradation curves of the light-emitting elements 4 and 5 and the comparative light-emitting element 5.

Next, the initial luminance was set at 1000 cd/m$^2$, and these elements were driven at the constant current density. At that time, luminance degradation curves as seen in FIG. 25 were obtained. In FIG. 25, the horizontal axis represents time and the vertical axis represents relative luminance (%) (referred to normalized luminance) where the initial luminance is 100. As apparent from FIG. 25, the light-emitting elements 4 and 5 each have a lifetime which is as long as the lifetime of the comparative light-emitting element 5.

As described above, by manufacturing the light-emitting element described in Embodiment 1, three advantages of high light emission efficiency, a long lifetime, and low driving voltage can be achieved. Therefore, by manufacturing the light-emitting element described in Embodiment 1, a light-emitting element with high light emission efficiency, a long lifetime, and low driving voltage can be obtained.

EXAMPLE 3

In this example, a light-emitting element having a structure different from that in Example 1 is specifically described with reference to a comparative example. Specifically, a light-emitting element in which a light-emitting material contained in the first light-emitting layer 313-1 and the second light-emitting layer 313-2 is different from that in the light-emitting element described in Example 1 is described with reference to FIG. 6. Note that structures and materials other than the light-emitting material are the same as those in Example 1; thus, the description of the same structures and materials is omitted.

<<Manufacturing of a Light-Emitting Element 6 and a Comparative Light-emitting Element 6>>

The process from the step of forming the first electrode 301 functioning as an anode to the step of forming the hole-transporting layer 312 was performed in a similar manner to the light-emitting elements 1 to 3 and the comparative light-emitting element 1.

Subsequently, the light-emitting layer 313-1 in contact with the hole-transporting layer 312 was formed to a thickness of 20 nm. In order to form the first light-emitting layer 313-1, BAlq was used as the host material; NPB, the hole-transporting material; and bis(2,3,5-triphenylpyrazinato)(dipivaloylmethanato)iridium(III) (abbreviation: [Ir(tppr)$_2$(dpm)]) represented by the structural formula (D11) in Embodiment 1, the light-emitting material, and these materials were co-evaporated. Here, the mass ratio of each substance in the first light-emitting layer 313-1 was set as follows: in the light-emitting element 6, BAlq:NPB:Ir(tppr)$_2$(dpm)=1:0.25:0.06; and in the comparative light-emitting element 6, BAlq:NPB:Ir(tppr)$_2$(dpm)=1:0.1:0.06.

Next, the second light-emitting layer 313-2 in contact with the first light-emitting layer 313-1 was formed to a thickness of 20 nm. In order to form the second light-emitting layer 313-2, in a similar manner to the first light-emitting layer 313-1, BAlq was used as the host material; NPB, the hole-transporting material; and Ir(tppr)$_2$(dpm), the light-emitting material, and these materials were co-evaporated. The mass ratio of each substance in the second light-emitting layer 313-2 was set as follows: in the light-emitting element 6 and the comparative light-emitting element 6, BAlq:NPB:Ir(tppr)$_2$(dpm)=1:0.1:0.06.

In such a manner, in the light-emitting element 6, the concentration of the hole-transporting material of the first light-emitting layer 313-1 which is close to the anode is higher than the concentration of the hole-transporting material of the second light-emitting layer 313-2 which is close to the cathode. That is, the light-emitting layer 6 has a structure of the light-emitting element described in Embodiment 1. On the other hand, in the comparative light-emitting element 6, the first light-emitting layer 313-1 and the second light-emitting layer 313-2 have the same composition, and the first light-emitting layer 313-1 and the second light-emitting layer 313-2 can be regarded as a light-emitting element including one light-emitting layer with a thickness of 40 nm.

Then, as in Example 1, the electron-transporting layer 314, the electron-injecting layer 315, and the second electrode 302 functioning as a cathode were formed, whereby a light-emitting element was formed.

<<Operation Characteristics of the Light-Emitting Element 6 and the Comparative Light-Emitting Element 6>>

The thus obtained light-emitting element 6 and comparative light-emitting element 6 were put into a glove box under a nitrogen atmosphere so that the light-emitting elements were sealed from atmospheric air. Then, the operation characteristics of these light-emitting elements were measured. The measurement was carried out at a room temperature (in the atmosphere kept at 25° C.).

Figure 30:
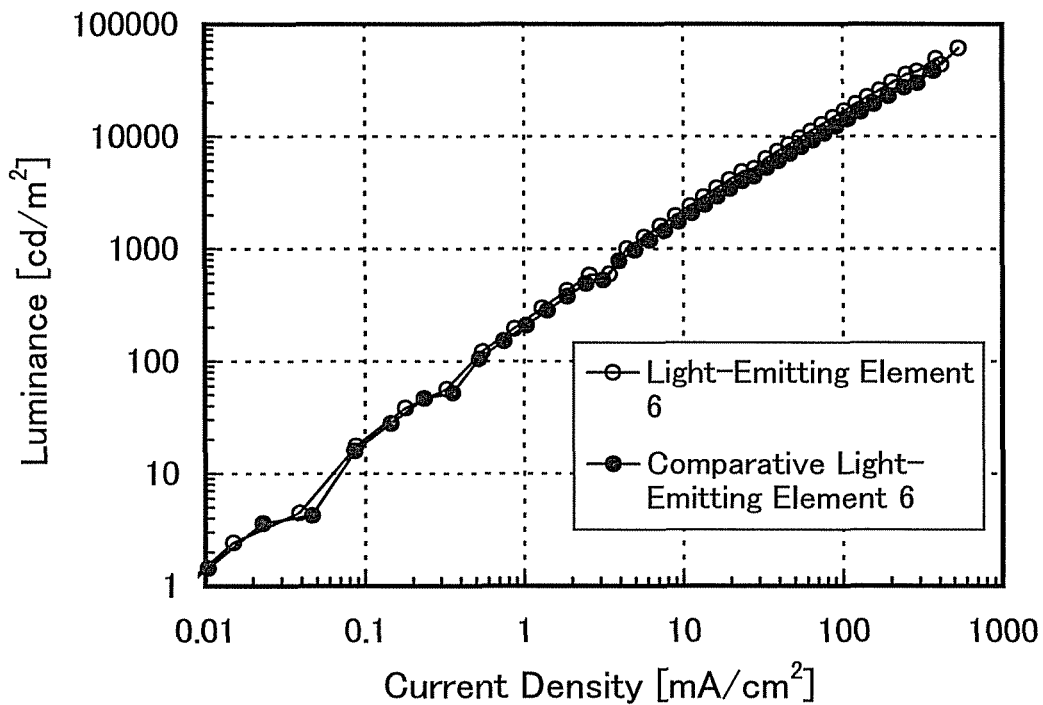
FIG. 30 is a graph showing current density-luminance characteristics of a light-emitting element 6 and a comparative light-emitting element 6.
Figure 31:
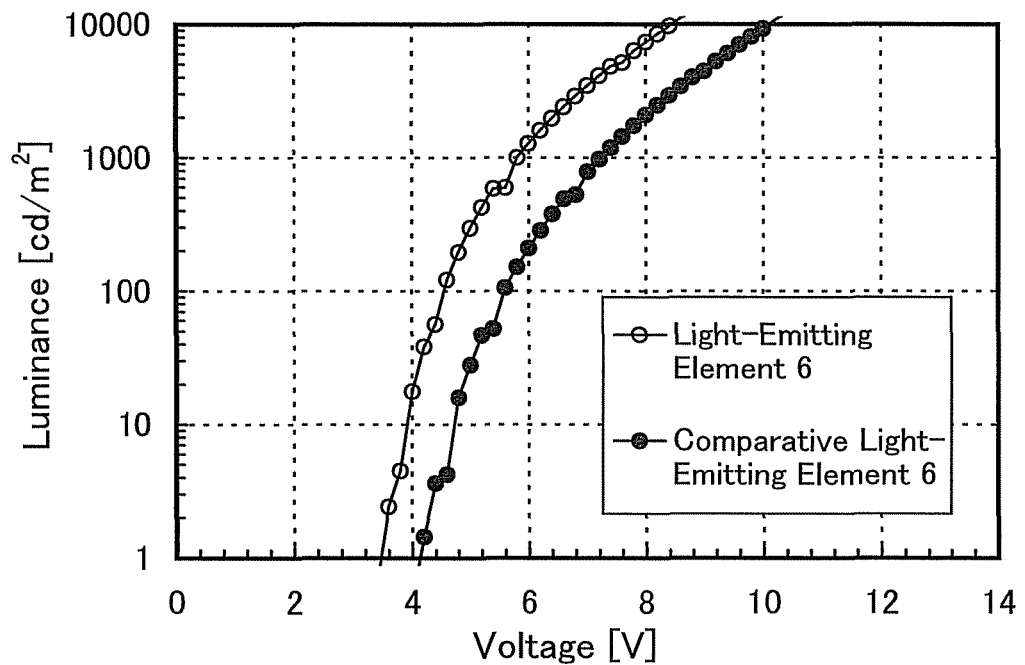
FIG. 31 is a graph showing voltage-luminance characteristics of the light-emitting element 6 and the comparative light-emitting element 6.
Figure 32:
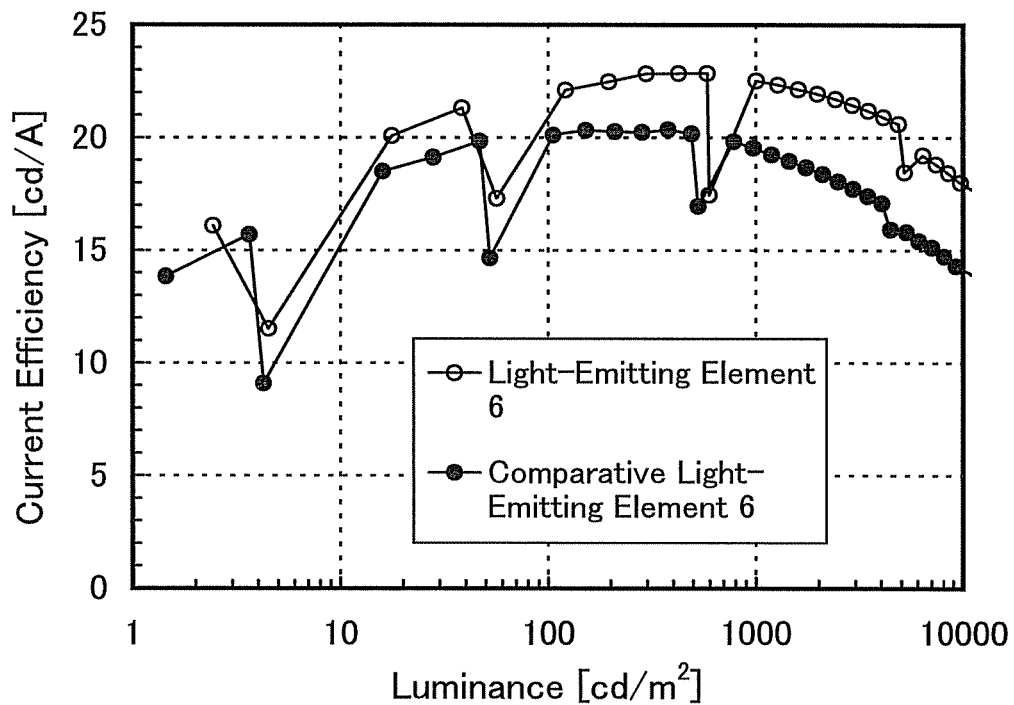
FIG. 32 is a graph showing luminance-current efficiency characteristics of the light-emitting element 6 and the comparative light-emitting element 6.
Figure 33:
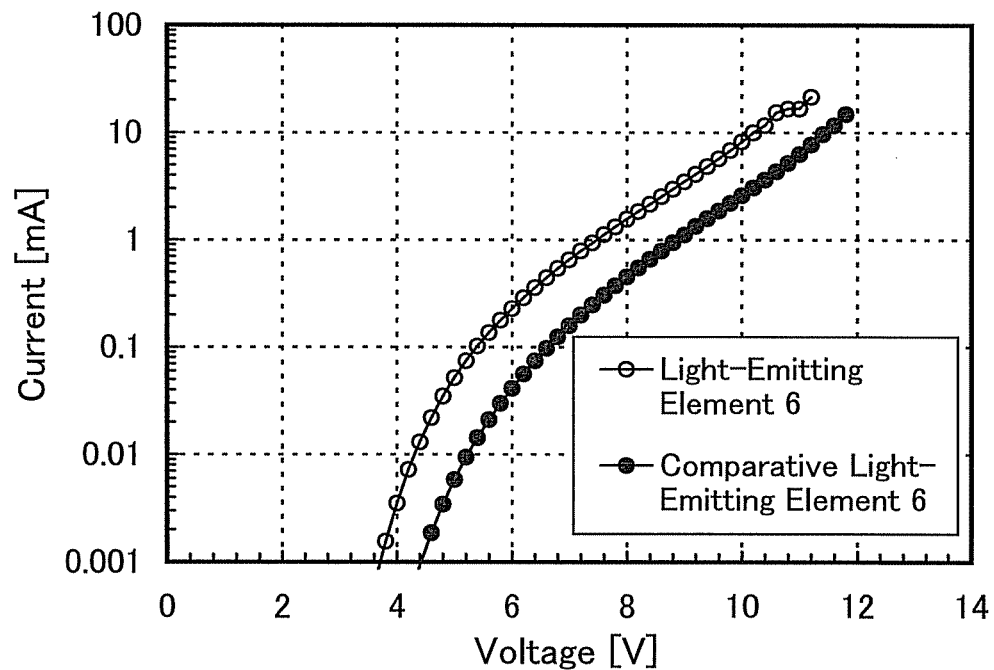
FIG. 33 is a graph showing voltage-current characteristics of the light-emitting element 6 and the comparative light-emitting element 6.
Figure 34:
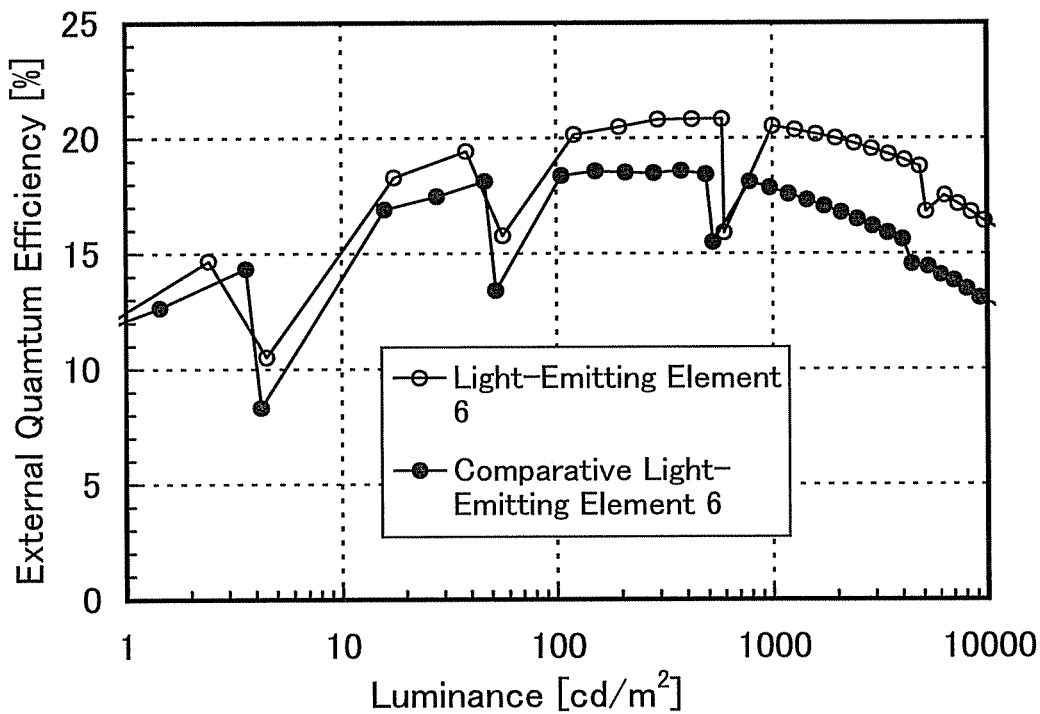
FIG. 34 is a graph showing luminance-external quantum efficiency characteristics of the light-emitting element 6 and the comparative light-emitting element 6.
Figure 35:
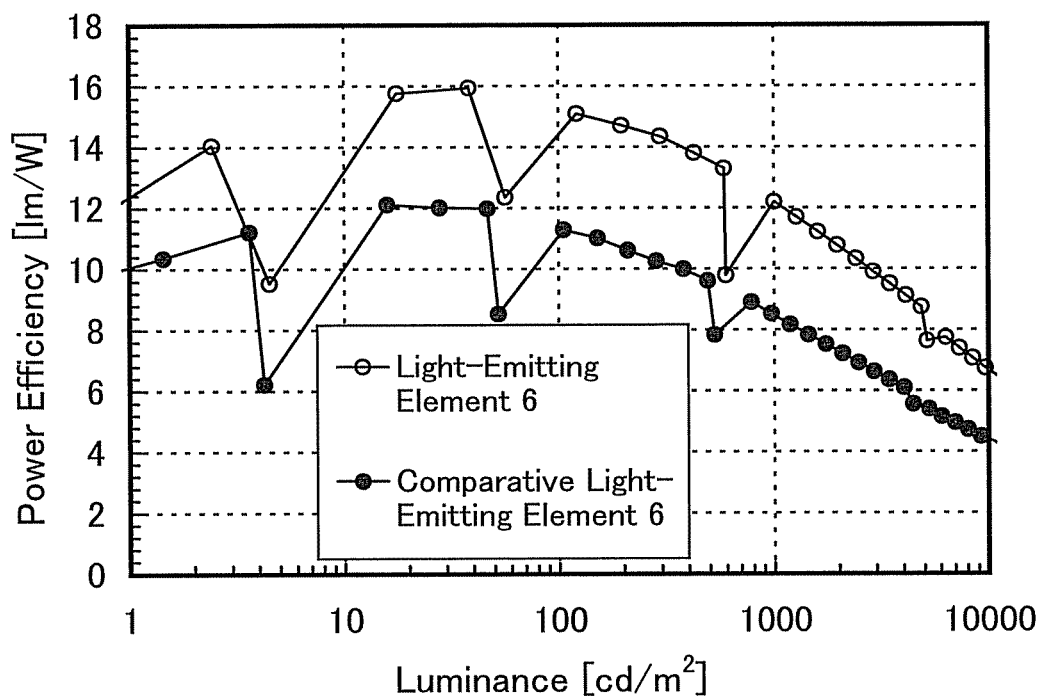
FIG. 35 is a graph showing luminance-power efficiency characteristics of the light-emitting element 6 and the comparative light-emitting element 6.

The current density-luminance characteristics of the light-emitting element 6 and the comparative light-emitting element 6 are shown in FIG. 30, and the voltage-luminance characteristics thereof are shown in FIG. 31. The luminance-current efficiency characteristics of the light-emitting elements are shown in FIG. 32, and the voltage-current characteristics thereof are shown in FIG. 33. The luminance-external quantum efficiency characteristics of the light-emitting elements are shown in FIG. 34, and the luminance-power efficiency characteristics thereof are shown in FIG. 35. Note that the emission spectra of the light-emitting elements were almost the same and the color of emission was red, which was derived from Ir(tppr)$_2$(dpm). In addition, the CIE chromaticity coordinates of both of the light-emitting elements were (x, y)=(0.67, 0.33), and the emission colors were red defined by NTSC.

It can be seen from FIGS. 30 to 33 that the current efficiency and the driving voltage of the light-emitting element 6 are improved as compared to the comparative light-emitting element 6. In addition, it can be seen from FIG. 35 that the power efficiency of the light-emitting element 6 is significantly improved as compared to the comparative light-emitting element 6. In addition, it can be seen from FIG. 34 that reduction in efficiency of the light-emitting element 6 on the high luminance side is small and T-T annihilation can be suppressed as compared to the comparative light-emitting element 6.

Table 5 shows initial values of main characteristics of the light-emitting elements at a practical luminance of about 1000 cd/cm$^2$.

TABLE 5

|  | Voltage [V] | Luminance [cd/m$^2$] | Current Efficiency [cd/A] | Power Efficiency [lm/W] | Quantum Efficiency [[%] |
|---|---|---|---|---|---|
| Light-Emitting Element 6 | 5.8 | 1004 | 22.5 | 12 | 21 |
| Comparative Light-Emitting Element 6 | 7.2 | 973 | 19.5 | 8.5 | 18 |

It can be seen from Table 5 that first, the driving voltage of the light-emitting element 6 is lower than that of the comparative light-emitting element 6. In addition, it can also be seen that the current efficiency and the quantum efficiency of the light-emitting element 6 are improved. As described above, the light-emitting element having the structure described in Embodiment 1 can achieve both low driving voltage and improvement of light emission efficiency, and from a synergistic effect thereof, an effect of reducing power consumption is significant, and the power efficiency serving as a barometer is increased by about 30%.

Figure 36:
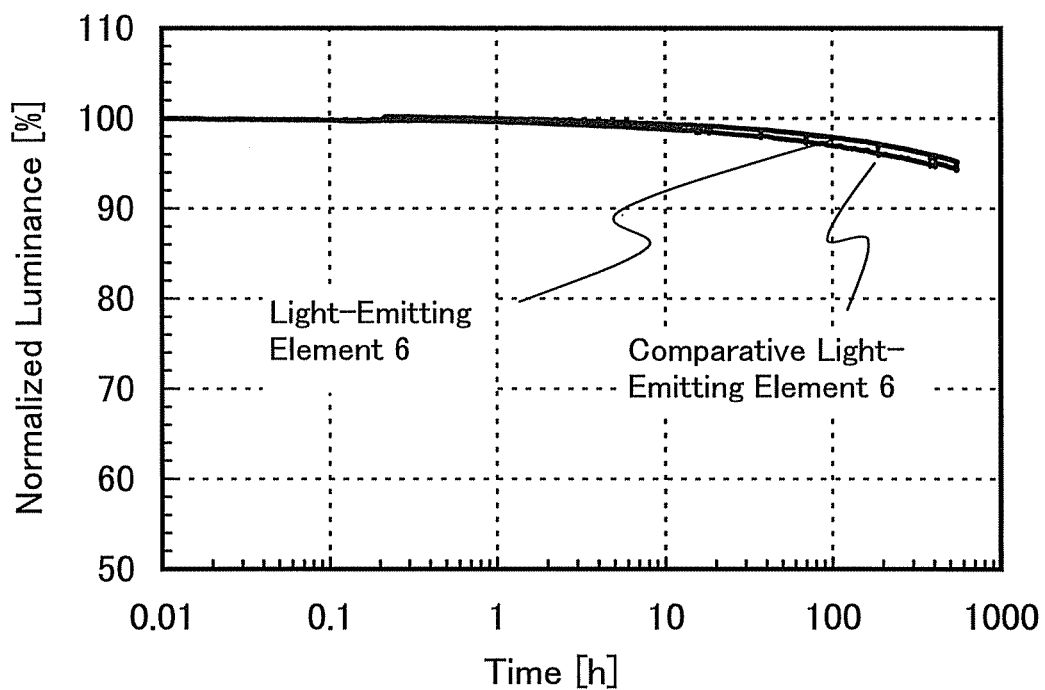
FIG. 36 is a graph showing luminance degradation curves of the light-emitting element 6 and the comparative light-emitting element 6.

Next, the initial luminance was set at 1000 cd/m$^2$, and these elements were driven at the constant current density. At that time, luminance degradation curves as seen in FIG. 36 were obtained. In FIG. 36, the horizontal axis represents time and the vertical axis represents relative luminance (%) (referred to as normalized luminance) where the initial luminance is 100. As apparent from FIG. 36, the light-emitting element 6 has a lifetime which is as long as the lifetime of the comparative light-emitting element 6.

As described above, by manufacturing the light-emitting element described in Embodiment 1, three advantages of high light emission efficiency, a long lifetime, and low driving voltage can be achieved. Therefore, by manufacturing the light-emitting element described in Embodiment 1, a light-emitting element with high light emission efficiency, a long lifetime, and low driving voltage can be obtained.

EXAMPLE 4

In this example, a light-emitting element having a structure different from that in Example 1 is specifically described with reference to a comparative example. Specifically, a light-emitting element having materials different from those of the light-emitting element described in Example 1 is described with reference to FIG. 6. Note that structures and materials are partially the same as those of the light-emitting element described in Example 1; thus, the description of the same structures and materials is omitted in this example. Note that molecular structures of substances used in this example are represented by the following structural formulae (v) and (vi) below.

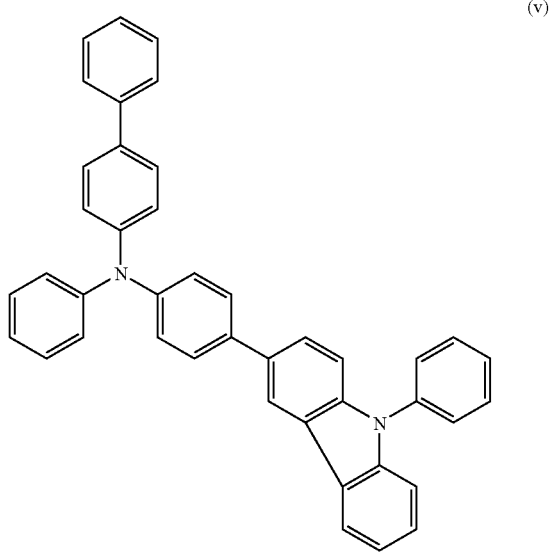

(v)

PCBA1BP

-continued

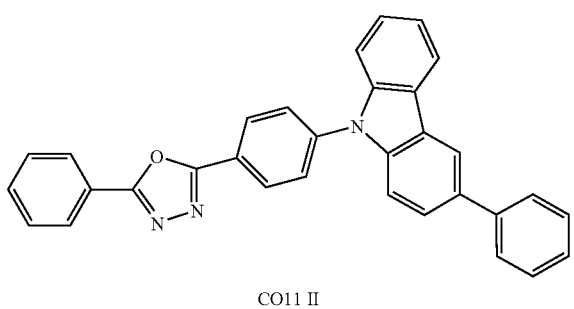

CO11 II
(vi)

<<Manufacturing of Light-Emitting Elements 7 and 8 and a Comparative Light-Emitting Element 7>>

The first electrode 301 functioning as an anode was manufactured in a similar manner to the light-emitting elements 1 to 3 and the comparative light-emitting element 1.

Next, the substrate was fixed to a holder provided inside a vacuum evaporation apparatus so that the surface on which the first electrode 301 was formed faced downward.

After pressure in the vacuum evaporation apparatus was reduced to $10^{-4}$ Pa, PCBA1BP represented by the structural formula (v) and molybdenum(VI) oxide were co-evaporated so as to meet PCBA1BP:molybdenum(VI) oxide=4:2 (mass ratio), whereby the hole-injecting layer 311 was formed. In this example, the hole-injecting layer 311 was formed to a thickness of 50 nm. Next, PCBA1BP was evaporated to be 10 nm thick, whereby the hole-transporting layer 312 was formed.

Subsequently, the first light-emitting layer 313-1 in contact with the hole-transporting layer 312 was formed to a thickness of 20 nm. In order to form the first light-emitting layer 313-1, CO11II represented by the structural formula (vi) was used as the host material; PCBA1BP, the hole-transporting material; and bis{2-(4-fluorophenyl)-3,5-dimethylpyrazinato}(picolinato)iridium(III) (abbreviation: [Ir(dmFppr)$_2$(pic)]) represented by the structural formula (D24) in Example 1, the light-emitting material, and these materials were co-evaporated. Here, the mass ratio of each substance in the first light-emitting layer 313-1 was set as follows: in the light-emitting element 7, CO11II:PCBA1BP:Ir(dmFppr)$_2$(pic)=1:0.5:0.1; in the light-emitting element 8, CO11II:PCBA1BP:Ir(dmFppr)$_2$(pic)=1:0.25:0.1; and in the comparative light-emitting element 7, CO11II:PCBA1BP:Ir(dmFppr)$_2$(pic)=1:0.1:0.1.

Next, the second light-emitting layer 313-2 in contact with the first light-emitting layer 313-1 was formed to a thickness of 20 nm. In order to form the second light-emitting layer 313-2, in a similar manner to the first light-emitting layer 313-1, CO11II was used as the host material; PCBA1BP, the hole-transporting material; and Ir(dmFppr)$_2$(pic), the light-emitting material, and these materials were co-evaporated. The mass ratio of each substance in the second light-emitting layer 313-2 was set as follows: in the light-emitting elements 7 and 8 and the comparative light-emitting element 7, CO11II:PCBA1BP:Ir(dmFppr)$_2$(pic)=1:0.1:0.1.

In such a manner, the light-emitting elements 7 and 8 each have two light-emitting layers in which the concentration of the hole-transporting material of the first light-emitting layer 313-1 which is close to the anode is higher than the concentration of the hole-transporting material of the second light-emitting layer 313-2 which is close to the cathode. That is, the light-emitting elements 7 and 8 each have a structure of the light-emitting element described in Embodiment 1. On the other hand, in the comparative light-emitting element 7, the first light-emitting layer 313-1 and the second light-emitting layer 313-2 have the same composition, and the first light-emitting layer 313-1 and the second light-emitting layer 313-2 can be regarded as a light-emitting element including one light-emitting layer with a thickness of 40 nm.

Then, as in Example 1, the electron-transporting layer 314, the electron-injecting layer 315, and the second electrode 302 functioning as a cathode were formed, whereby a light-emitting element was formed.

Note that an optimal mass ratio in terms of light emission efficiency and a lifetime is selected for the mass ratio of the three components of the light-emitting layer in the comparative light-emitting element 7 in the case where the light-emitting layer having a thickness of 40 nm is formed to have a single-layer structure.

<<Operation Characteristics of the Light-Emitting Elements 7 and 8 and the Comparative Light-Emitting Element 7>>

The thus obtained light-emitting elements 7 and 8 and comparative light-emitting element 7 were put into a glove box under a nitrogen atmosphere as in Example 1 so that the light-emitting elements were sealed from atmospheric air. Then, the operation characteristics of these light-emitting elements were measured. The measurement was carried out at a room temperature (in the atmosphere kept at 25° C.).

Figure 37:
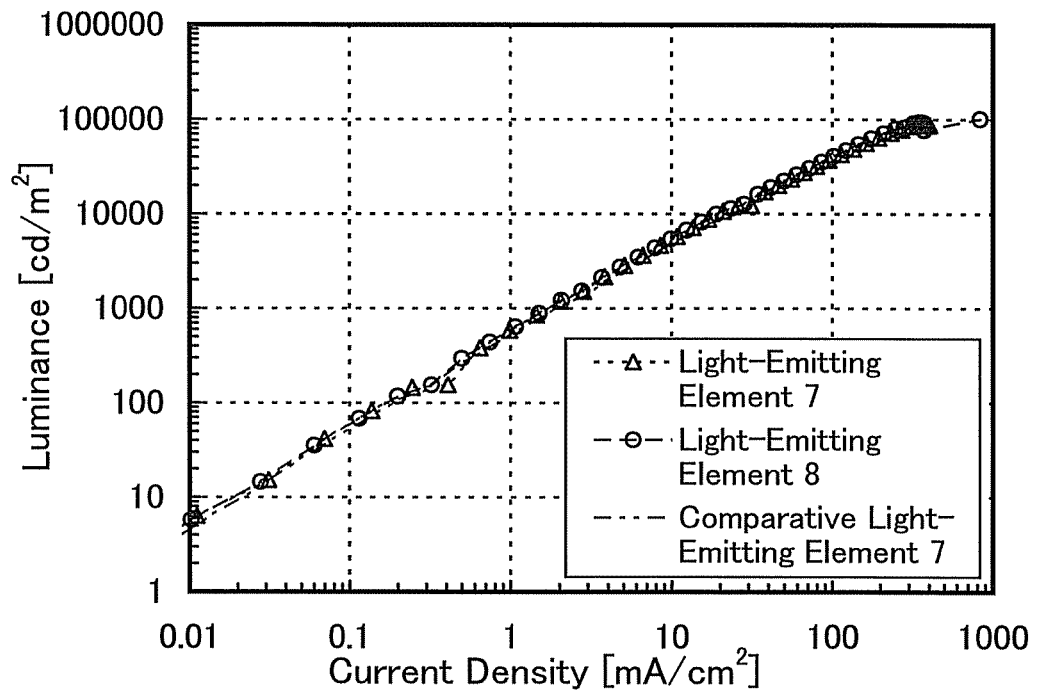
FIG. 37 is a graph showing current density-luminance characteristics of light-emitting elements 7 and 8 and a comparative light-emitting element 7.
Figure 38:
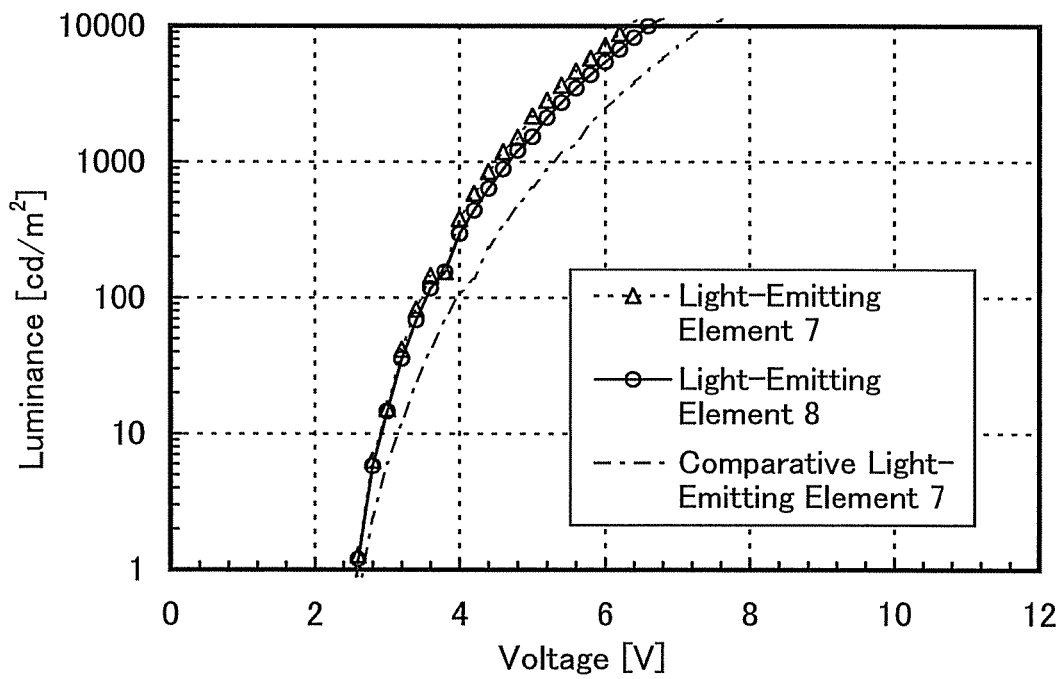
FIG. 38 is a graph showing voltage-luminance characteristics of the light-emitting elements 7 and 8 and the comparative light-emitting element 7.
Figure 39:
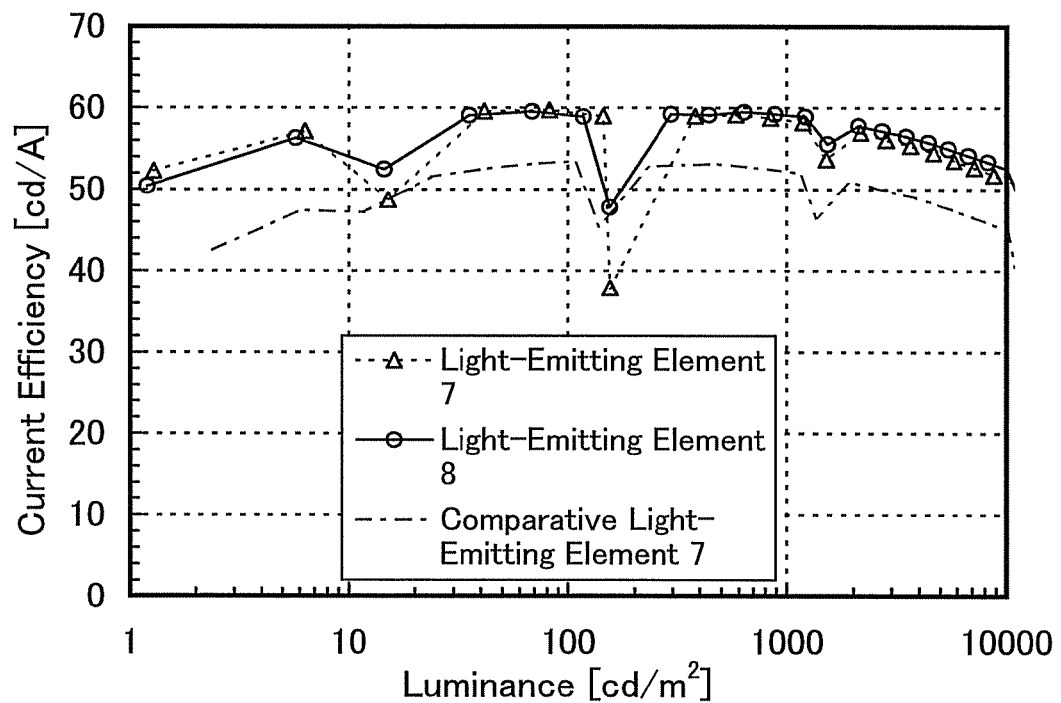
FIG. 39 is a graph showing luminance-current efficiency characteristics of the light-emitting elements 7 and 8 and the comparative light-emitting element 7.
Figure 40:
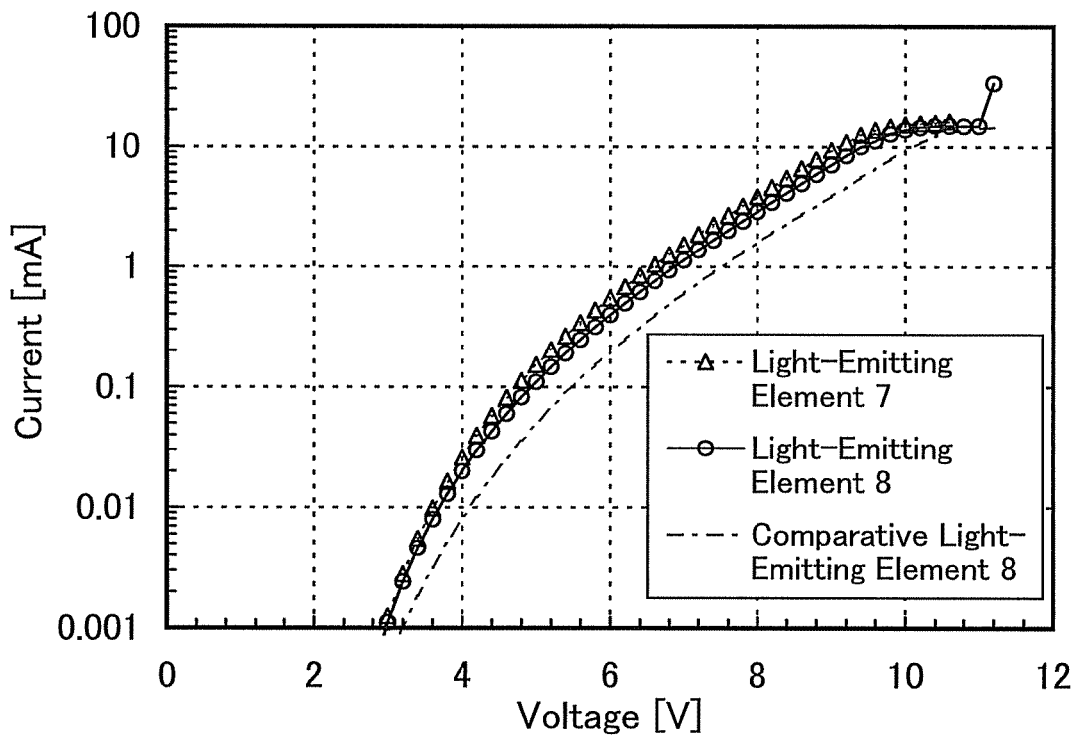
FIG. 40 is a graph showing voltage-current characteristics of the light-emitting elements 7 and 8 and the comparative light-emitting element 7.
Figure 41:
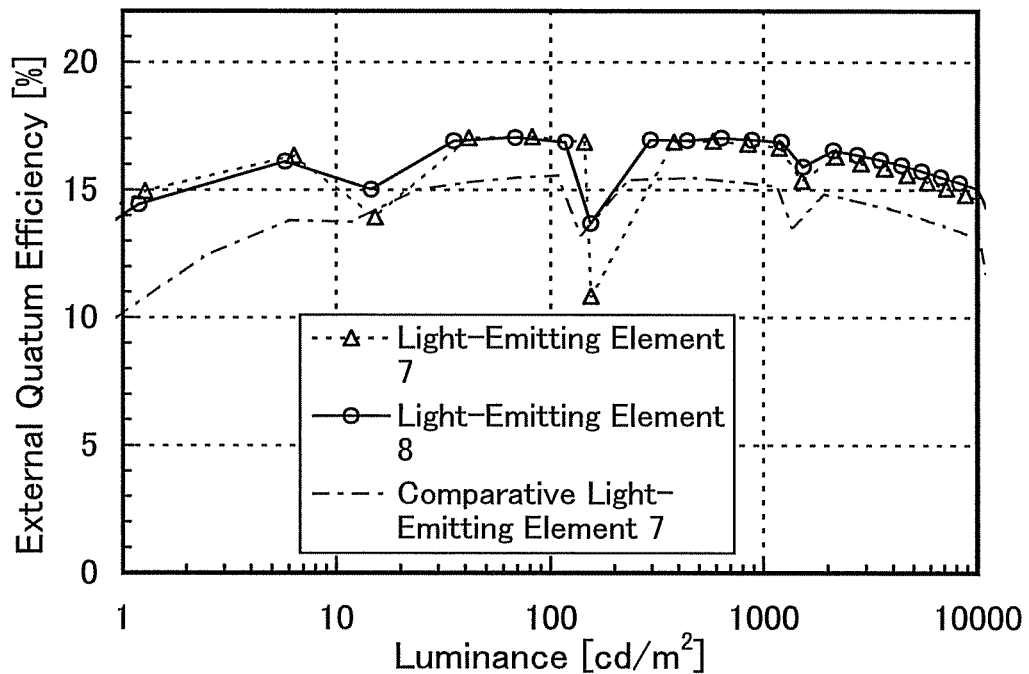
FIG. 41 is a graph showing luminance-external quantum efficiency characteristics of the light-emitting elements 7 and 8 and the comparative light-emitting element 7.
Figure 42:
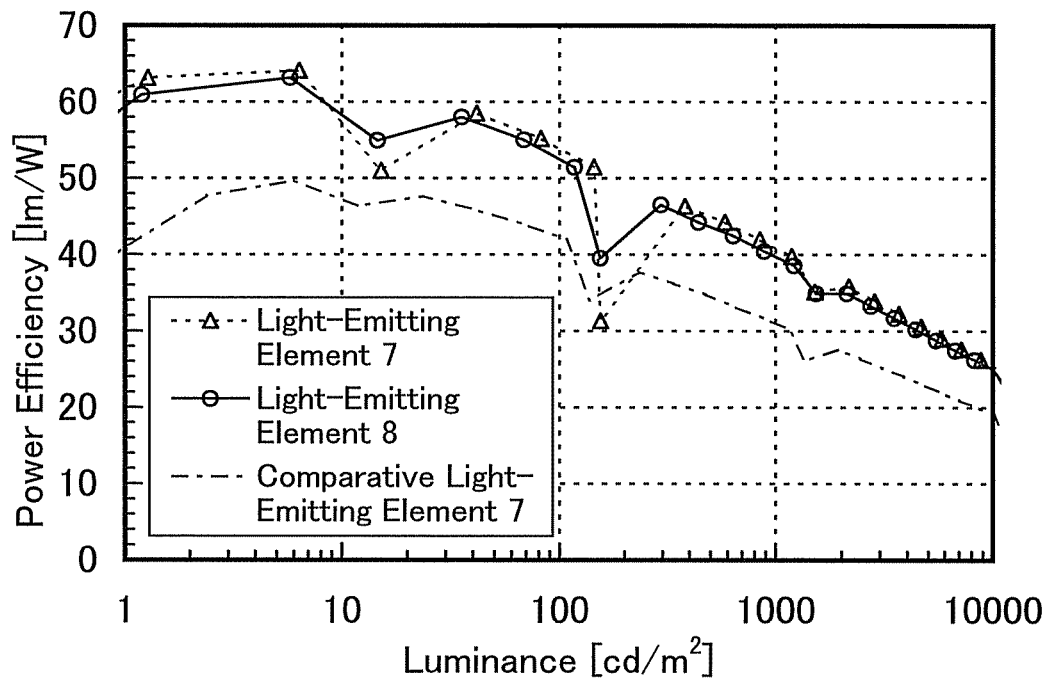
FIG. 42 is a graph showing luminance-power efficiency characteristics of the light-emitting elements 7 and 8 and the comparative light-emitting element 7.

The current density-luminance characteristics of the light-emitting elements 7 and 8 and the comparative light-emitting element 7 are shown in FIG. 37, and the voltage-luminance characteristics thereof are shown in FIG. 38. The luminance-current efficiency characteristics of the light-emitting elements are shown in FIG. 39, and the voltage-current characteristics thereof are shown in FIG. 40. The luminance-external quantum efficiency characteristics of the light-emitting elements are shown in FIG. 41, and the luminance-power efficiency characteristics thereof are shown in FIG. 42. Note that the emission spectra of the light-emitting elements were almost the same and the color of emission was green, which was derived from Ir(dmFppr)$_2$(pic). In addition, the CIE chromaticity coordinates of the light-emitting elements 7 and 8 were (x, y)=(0.40, 0.58) while the CIE chromaticity coordinates of the comparative light-emitting element 7 was (x, y)=(0.41, 0.57); thus, by application of an embodiment of the present invention, chromaticity was slightly improved.

It can be seen from FIGS. 37 to 40 that first, the current efficiency and the driving voltage of the light-emitting elements 7 and 8 are improved as compared to the comparative light-emitting element 7. In addition, it can be seen from FIG. 42 that the power efficiency of the light-emitting elements 7 and 8 is significantly improved as compared to the comparative light-emitting element 7. In addition, it can be seen from FIG. 41 that reduction in efficiency of the light-emitting elements 7 and 8 on the high luminance side is small and T-T annihilation can be suppressed as compared to the comparative light-emitting element 7. Table 6 shows initial values of main characteristics of the light-emitting elements at a practical luminance of about 1000 cd/cm$^2$.

TABLE 6

|  | Voltage [V] | Luminance [cd/m$^2$] | Current Efficiency [cd/A] | Power Efficiency [lm/W] | Quantum Efficiency [[%] |
|---|---|---|---|---|---|
| Light-Emitting Element 7 | 4.4 | 846 | 58.7 | 42 | 17 |
| Light-Emitting Element 8 | 4.6 | 887 | 59.2 | 40 | 17 |

TABLE 6-continued

| | Voltage [V] | Luminance [cd/m$^2$] | Current Efficiency [cd/A] | Power Efficiency [lm/W] | Quantum Efficiency [[%] |
|---|---|---|---|---|---|
| Comparative Light-Emitting Element 7 | 5.2 | 876 | 52.4 | 32 | 15 |

It can be seen from Table 6 that the driving voltage of the light-emitting elements 7 and 8 is lower than that of the comparative light-emitting element 7. In addition, it can also be seen that the current efficiency and the quantum efficiency of the light-emitting elements 7 and 8 are improved. As described above, the light-emitting element having the structure described in Embodiment 1 can achieve both low driving voltage and improvement of light emission efficiency, and from a synergistic effect thereof, an effect of reduction in power consumption is significant, and the power efficiency serving as a barometer is increased by about 30%.

Figure 43:
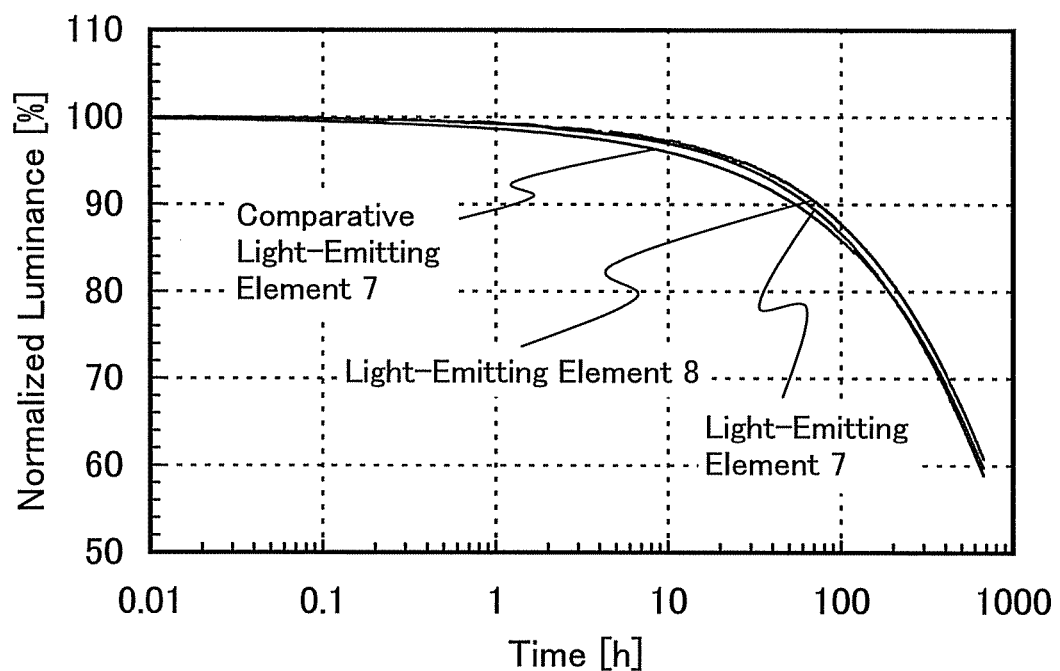
FIG. 43 is a graph showing luminance degradation curves of the light-emitting elements 7 and 8 and the comparative light-emitting element 7.

Next, the initial luminance was set at 1000 cd/m$^2$, and these elements were driven at the constant current density. At that time, illuminance degradation curves as seen in FIG. 43 were obtained. In FIG. 43, the horizontal axis represents time and the vertical axis represents relative luminance (%) (referred to normalized luminance) where the initial luminance is 100. As apparent from FIG. 43, the light-emitting elements 7 and 8 each have a lifetime which is as long as the lifetime of the comparative light-emitting element 7.

As described above, by manufacturing the light-emitting element described in Embodiment 1, three advantages of high light emission efficiency, a long lifetime, and low driving voltage can be achieved. Therefore, by manufacturing the light-emitting element described in Embodiment 1, a light-emitting element with high light emission efficiency, a long lifetime, and low driving voltage can be obtained.

REFERENCE EXAMPLE 2

In Reference Example 2, synthesis methods of the organometallic complexes represented by the structural formulae (D29) and (D30) in Embodiment 1 are described.

SYNTHESIS EXAMPLE 1

In this synthesis example, a synthesis example of an organometallic complex represented by the structural formula (D29) in Embodiment 1, (acetylacetonato)bis[2-(4-methoxyphenyl)-3,5-dimethylpyrazinato)iridium(III) (abbreviation: [Ir(dmmoppr)$_2$(acac)]), is specifically described.

Step 1: Synthesis of 2-(4-methoxyphenyl)-3,5-dimethylpyrazine (abbreviation: Hdnmmoppr)

First, to a recovery flask equipped with a reflux pipe were placed 1.03 g of 2-chloro-3,5-dimethylpyrazine, 1.09 g of 4-methoxyphenylboronic acid, 0.76 g of sodium carbonate, 0.032 g of bis(triphenylphosphine)palladium(II)dichloride (abbreviation: Pd(PPh$_3$)$_2$Cl$_2$), 10 mL of water, and 10 mL of acetonitrile, and the atmosphere in the flask was replaced with argon. This reaction container was subjected to irradiation with a microwave (2.45 GHz, 100 W) for 10 minutes to be heated. Then, water was added to this solution, and an organic layer was extracted with dichloromethane. The obtained organic layer was washed with water and dried with magnesium sulfate. After drying, the solution was filtrated. The solvent of this solution was distilled off, whereby a pyrazine derivative Hdmmoppr (dark yellow liquid, yield: 99%), which was a target substance, was obtained. For the irradiation with a microwave, a microwave synthesis system (Discover, manufactured by CEM Corporation) was used. A synthesis scheme of Step 1 is shown by the following (A-1).

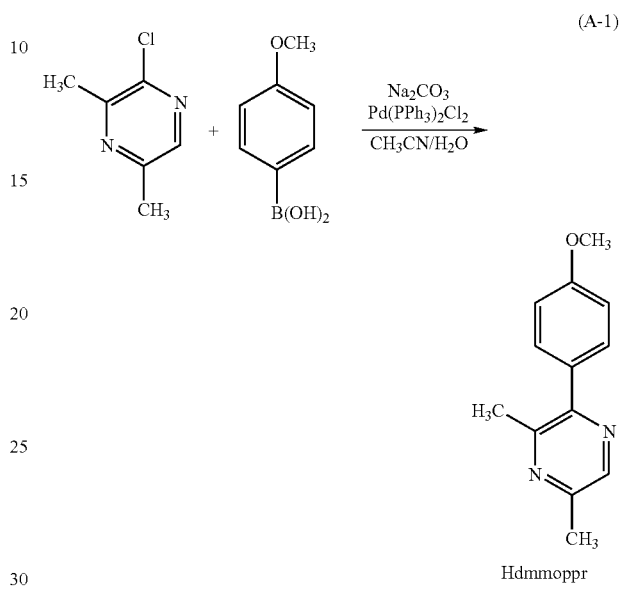

Step 2: Synthesis of di-μ-chloro-bis[bis{2-(4-methoxyphenyl)-3,5-dimethylpyrazine}iridium(III)](abbreviation: [Ir(dmmoppr)$_2$Cl]$_2$ Next, to a recovery flask equipped with a reflux pipe were placed 15 mL of 2-ethoxyethanol, 5 mL of water, 1.58 g of the Hdmmoppr which was obtained in the above Step 1, and 0.88 g of iridium chloride hydrate (IrCl$_3$.H$_2$O) (produced by Sigma-Aldrich Corp.), and the atmosphere in the flask was replaced with argon. Then, this reaction container was subjected to irradiation with a microwave (2.45 GHz, 100 W) for 30 minutes to be reacted. The solution after the reaction was concentrated and a residue obtained was washed with ethanol, whereby a binuclear complex [Ir(dmmoppr)$_2$Cl]$_2$ (a dark yellow powder, yield: 71%) was obtained. A synthesis scheme of Step 2 is shown by the following (A-2).

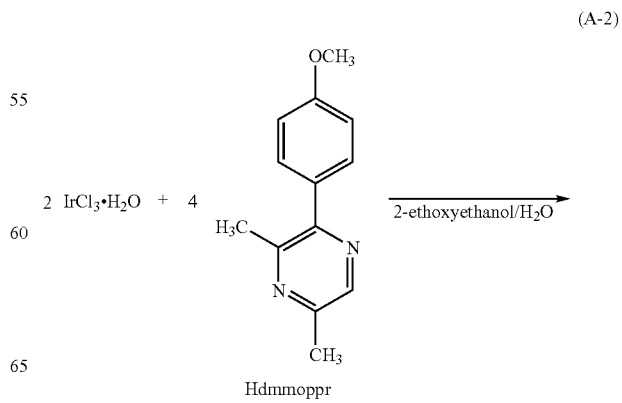

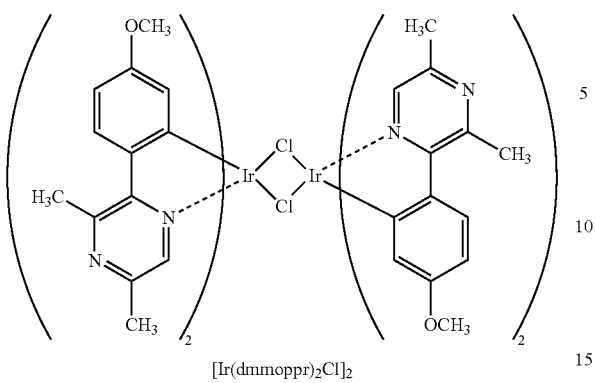

[Ir(dmmoppr)₂Cl]₂

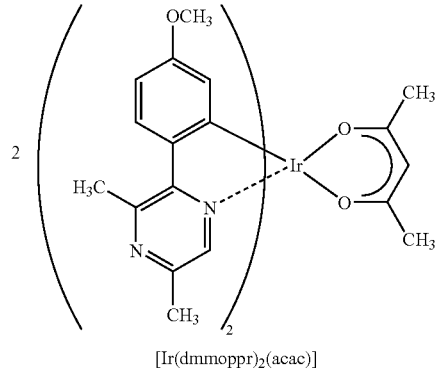

[Ir(dmmoppr)₂(acac)]

Step 3: Synthesis of (acetylacetonato)bis[2-(4-methoxyphenyl)-3,5-dimethylpyrazinato]iridium(III) (abbreviation: [Ir(dmmoppr)₂(acac)])

Next, to a recovery flask equipped with a reflux pipe were placed 10 mL of 2-ethoxyethanol, 0.75 g of the binuclear complex [Ir(dmmoppr)₂Cl]₂ obtained in the above Step 2, 0.18 mL of acetylacetone, and 0.60 g of sodium carbonate, and the atmosphere in the flask was replaced with argon. Then, this reaction container was subjected to irradiation with a microwave (2.45 GHz, 100 W) for 30 minutes to be reacted. The reaction solution was filtered. The obtained solid was dissolved into ethanol and the solution was filtrated to remove insoluble matter. Then, the filtrate was concentrated, and the obtained solid was recrystallized with ethanol, whereby the organometallic complex [Ir(dmmoppr)₂(acac)] (an orange powder, yield: 51%) represented by the structural formula (D29) in Embodiment 1 was obtained. A synthesis scheme of Step 3 is shown by the following (A-3).

(A-3)

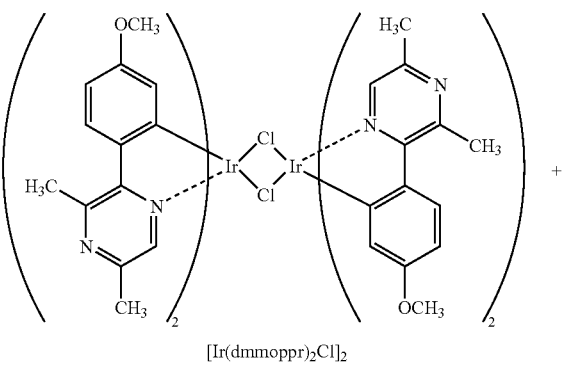

[Ir(dmmoppr)₂Cl]₂

+

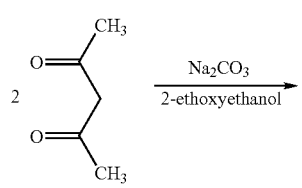

Figure 26:
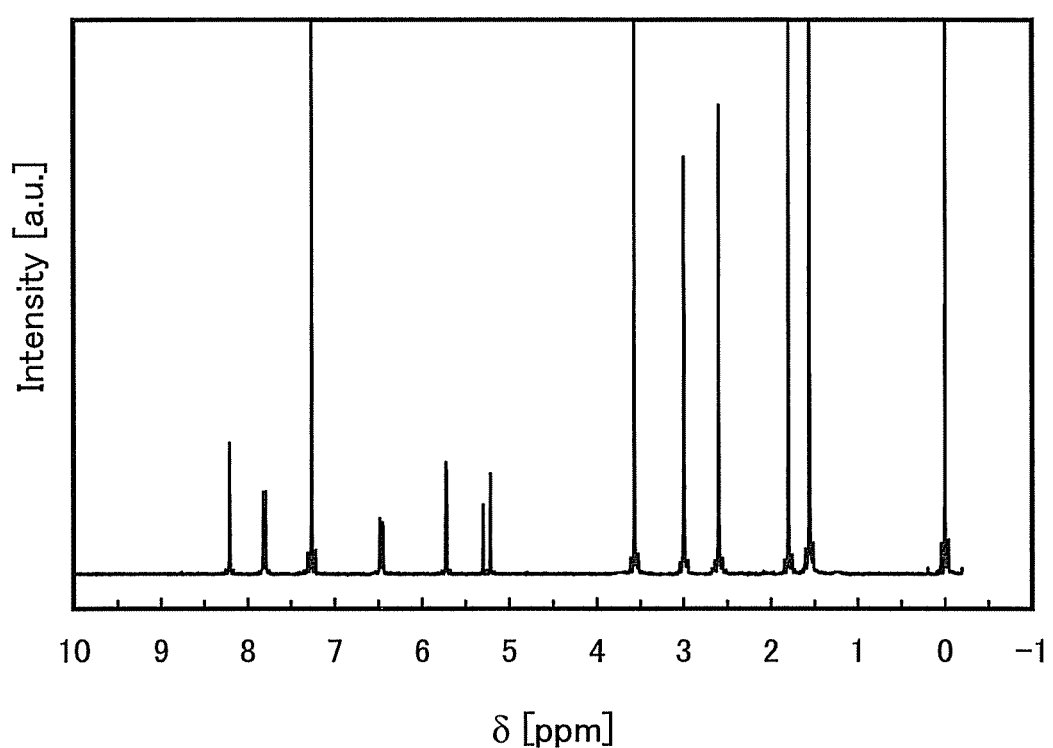
FIG. 26 is a $^1$H-NMR chart of an organometallic complex synthesized in Synthesis Example 1.

Analysis result of the orange powder obtained in the Step 3 by nuclear magnetic resonance spectroscopy (¹H-NMR) is shown below. A ¹H-NMR chart is shown in FIG. 26. From the result, it was found that the organometallic complex [Ir(dmmoppr)₂(acac)] represented by the above structural formula (D29) was obtained in this synthesis example.

¹H-NMR. δ (CDCl₃): 1.80 (s, 6H), 2.60 (s, 6H), 3.00 (s, 6H), 3.57 (s, 6H), 5.22 (s, 1H), 5.72 (d, 2H), 6.46 (dd, 2H), 7.81 (d, 2H), 8.21 (s, 2H).

Figure 27:
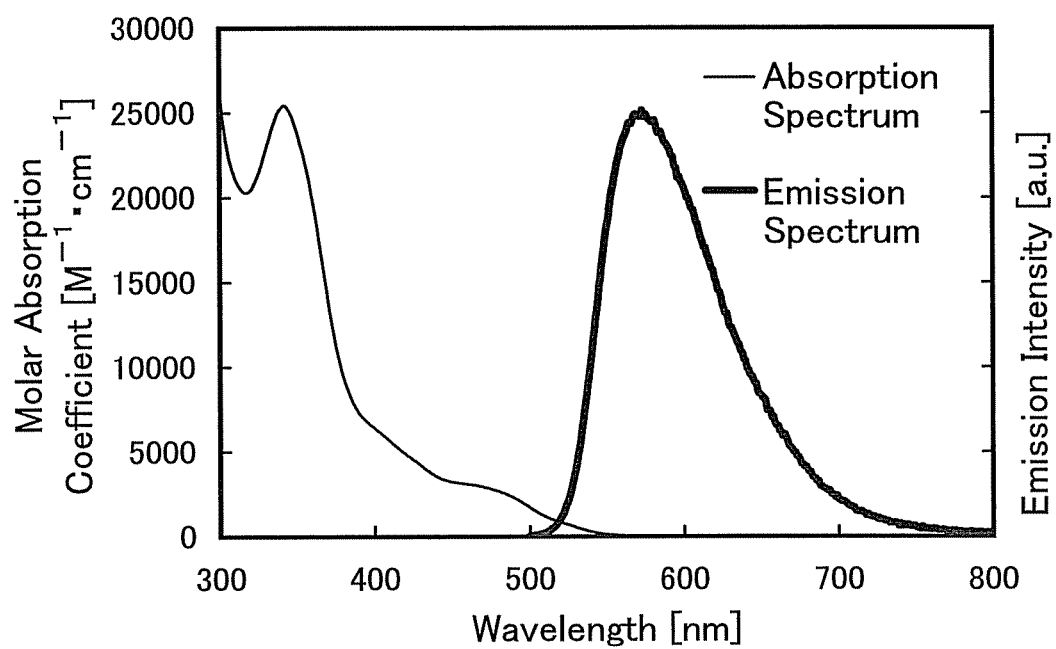
FIG. 27 is a graph showing an ultraviolet-visible light absorption spectrum and a light emission spectrum of an organometallic complex [Ir(dmmoppr)$_2$(acac)] in a dichloromethane solution.

Next, an analysis of [Ir(dmmoppr)₂(acac)] was conducted by an ultraviolet-visible spectrometry. The UV spectrum was measured using an ultraviolet-visible spectrophotometer (V550, manufactured by JASCO Corporation) at room temperature by using a dichloromethane solution (0.071 mmol/L). In addition, an emission spectrum of [Ir(dmmoppr)₂(acac)] was measured. The measurement of the emission spectrum was conducted by a fluorescence spectrophotometer (manufactured by Hamamatsu Photonics Corporation, FS920) using the degassed dichloromethane solution (0.42 mmol/L) at a room temperature. FIG. 27 shows the measurement results. The horizontal axis represents a wavelength and the vertical axis represents a molar absorption coefficient and emission intensity.

As shown in FIG. 27, the organometallic complex [Ir(dmmoppr)₂(acac)] has a peak of emission spectrum at 573 nm, and orange light was observed from the dichloromethane solution.

SYNTHESIS EXAMPLE 2

In this synthesis example, a synthesis example of the organometallic complex represented by the structural formula (D30) in Embodiment 1, (acetylacetonato)bis[2-(2-naphthyl)-3,5-dimethylpyrazinato]iridium(III) (abbreviation: [Ir(dm2npr)₂(acac)]) is specifically described.

Step 1: Synthesis of 2-(2-naphthyl)-3,5-dimethylpyrazine (abbreviation: Hdm2npr)

First, to a recovery flask equipped with a reflux pipe were placed 2.25 g of 2-chloro-3,5-dimethylpyrazine, 2.71 g of 2-naphthylboronic acid, 1.67 g of sodium carbonate, 0.072 g of bis(triphenylphosphine)palladium(II)dichloride (abbreviation: Pd(PPh₃)₂Cl₂), 15 mL of water, and 15 mL of acetonitrile, and the atmosphere in the flask was replaced with argon. This reaction container was subjected to irradiation with a microwave (2.45 GHz, 100 W) for 10 minutes to be heated. Then, water was added to this solution, and an organic layer was extracted with dichloromethane. The obtained organic layer was washed with water and dried with magnesium sulfate. After drying, the solution was filtered. The solvent of this solution was distilled off and the residue obtained by distillation was purified by silica gel column chromatography using dichloromethane as a developing solvent. In this way, Hdm2npr (a light orange powder, yield: 56%), which was a target substance, was obtained. For the irradiation with a microwave, a microwave synthesis system (Discover, manufactured by CEM Corporation) was used. A synthesis scheme of Step 1 is shown in the following (B-1).

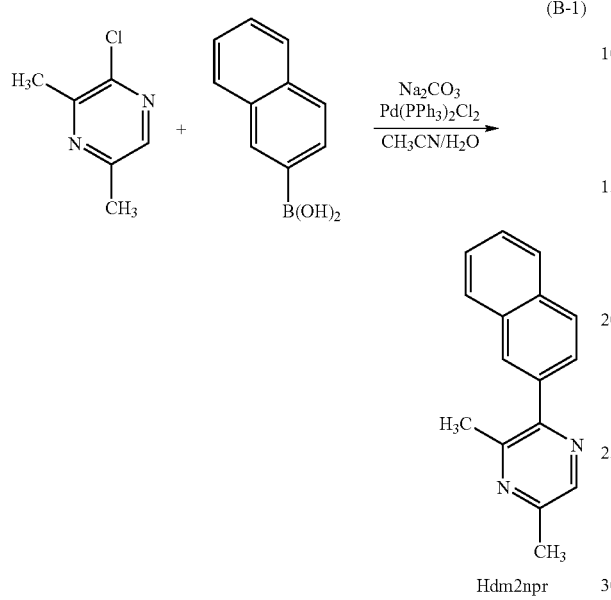

(B-1)

Hdm2npr

Step 2: Synthesis of di-μ-chloro-bis[bis{2-(2-naphthyl)-3,5-dimethylpyrazine}iridium(III)] (abbreviation: [Ir(dm2npr)$_2$Cl]$_2$ Next, to a recovery flask equipped with a reflux pipe were placed 15 mL of 2-ethoxyethanol, 5 mL of water, 2.06 g of the Hdm2npr obtained in the above Step 1, and 1.31 g of iridium chloride hydrate (IrCl$_3$·H$_2$O) (produced by Sigma-Aldrich Corp.), and the atmosphere in the flask was replaced with argon. Then, this reaction container was subjected to irradiation with a microwave (2.45 GHz, 100 W) for an hour to be reacted. A blown powder precipitated from the reaction solution was obtained by filtration and washed with ethanol, whereby a binuclear complex [Ir(dm2npr)$_2$Cl]$_2$ (yield: 77%) was obtained. A synthesis scheme of Step 2 is shown in the following (B-2).

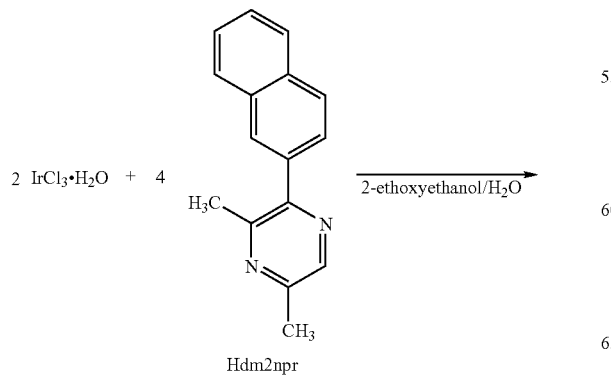

(B-2)

Hdm2npr

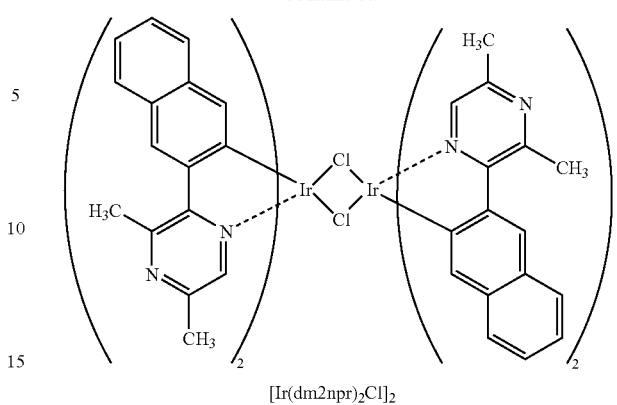

[Ir(dm2npr)$_2$Cl]$_2$

Step 3: Synthesis of (acetylacetonato)bis[2-(2-naphthyl)-3,5-dimethylpyrazinato)iridium(III) (abbreviation: [Ir(dm2npr)$_2$(acac)])

Further, to a recovery flask equipped with a reflux pipe were placed 20 mL of 2-ethoxyethanol, 1.05 g of the binuclear complex [Ir(dm2npr)$_2$Cl]$_2$ obtained in the above Step 2, 0.23 mL of acetylacetone, and 0.80 g of sodium carbonate, and the atmosphere in the flask was replaced with argon. After that, this reaction container was subjected to irradiation with a microwave (2.45 GHz, 100 W) for 30 minutes to be reacted. The reaction solution was filtered. The obtained solid was dissolved into dichloromethane and the solution was filtrated to remove insoluble matter. Then, the filtrate was concentrated, and the obtained solid was recrystallized with a mixed solvent of ethanol and dichloromethane, whereby an organometallic complex [Ir(dm2npr)$_2$(acac)] of the present invention was obtained as an orange powder (yield: 44%). A synthesis scheme of Step 3 is shown in the following (B-3).

(B-3)

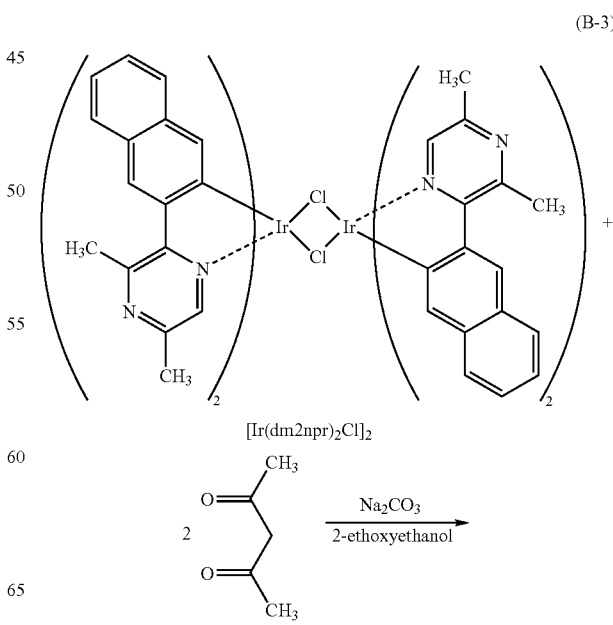

[Ir(dm2npr)$_2$Cl]$_2$

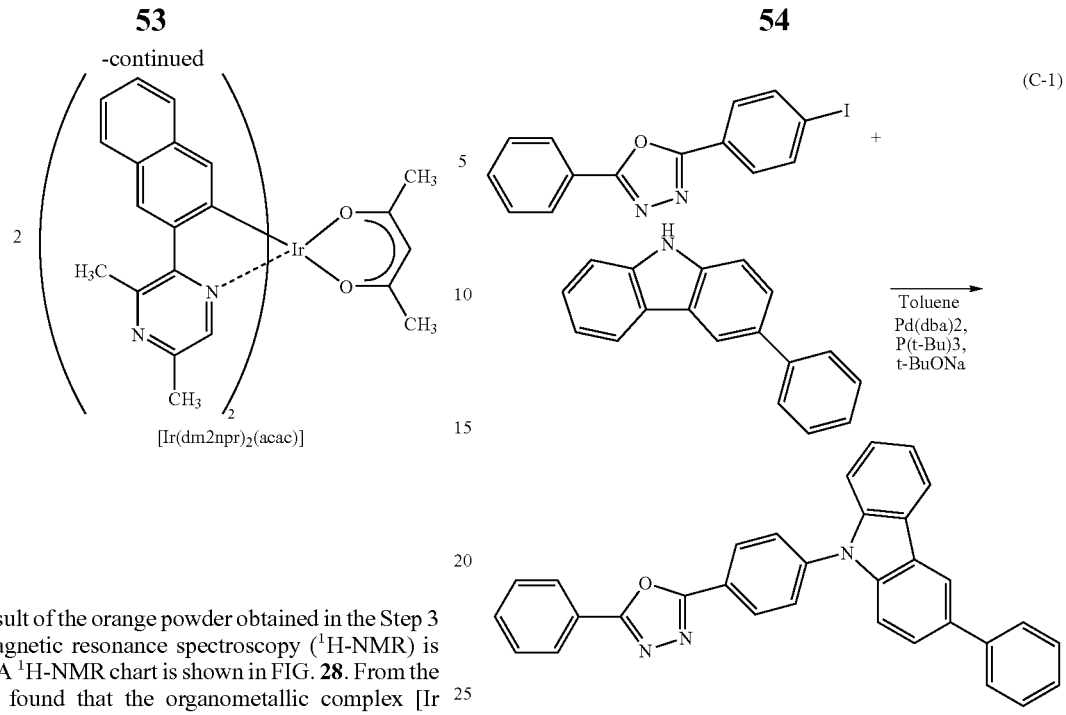

[Ir(dm2npr)₂(acac)]

Figure 28:
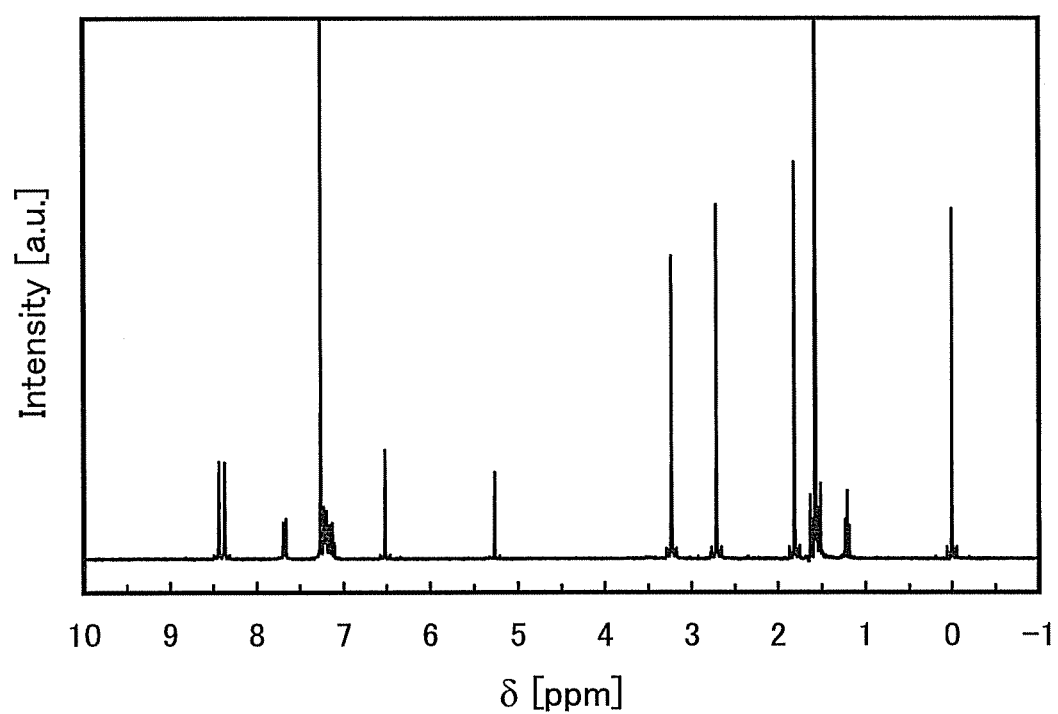
FIG. 28 is a $^1$H-NMR chart of an organometallic complex synthesized in Synthesis Example 2.

Analysis result of the orange powder obtained in the Step 3 by nuclear magnetic resonance spectroscopy (¹H-NMR) is shown below. A ¹H-NMR chart is shown in FIG. 28. From the result, it was found that the organometallic complex [Ir(dm2npr)₂(acac)] represented by the above structural formula (D30) was obtained in Synthesis Example 1.

¹H-NMR. δ (CDCl₃): 1.81 (s, 6H), 2.71 (s, 6H), 3.24 (s, 6H), 5.27 (s, 1H), 6.52 (s, 2H), 7.11-7.23 (m, 6H), 7.68 (d, 2H), 8.40 (d, 4H).

Figure 29:
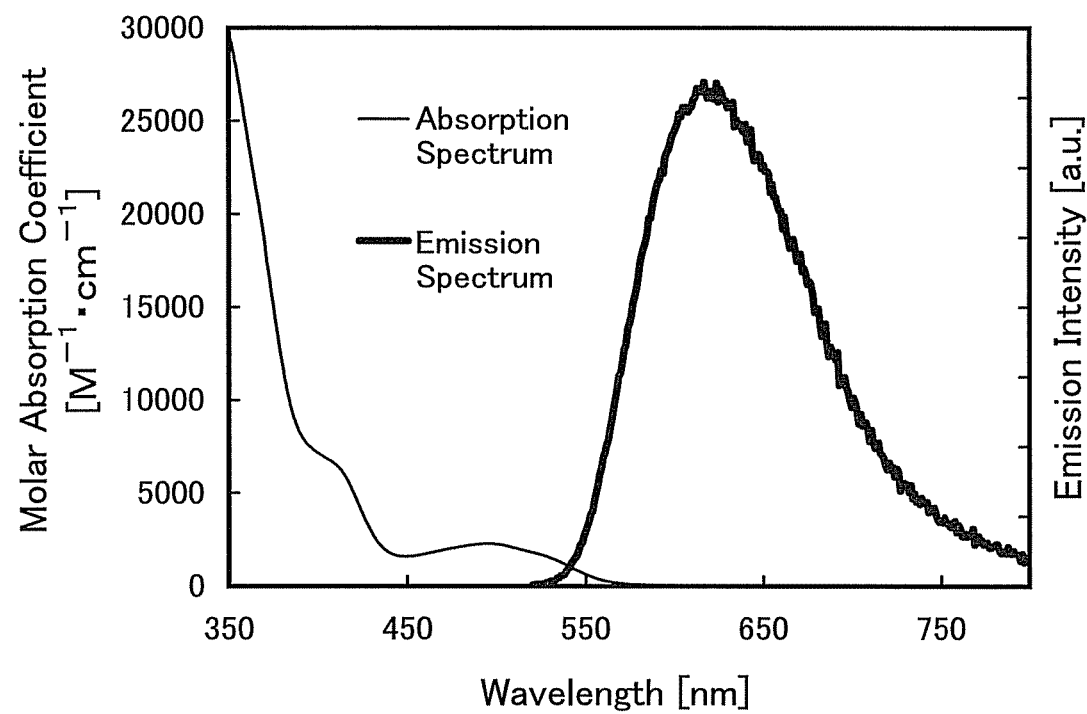
FIG. 29 is a graph showing an ultraviolet-visible light absorption spectrum and a light emission spectrum of an organometallic complex [Ir(dm2npr)$_2$(acac)] in a dichloromethane solution.

Next, an analysis of [Ir(dm2npr)₂(acac)] was conducted by an ultraviolet-visible spectrometry. The UV spectrum was measured using an ultraviolet-visible spectrophotometer (V550, manufactured by JASCO Corporation) by using a dichloromethane solution (0.13 mmol/L) at room temperature. In addition, an emission spectrum of [Ir(dm2npr)₂(acac)] was measured. The measurement of the emission spectrum was conducted by a fluorescence spectrophotometer (manufactured by Hamamatsu Photonics Corporation, FS920) using the degassed dichloromethane solution (0.47 mmol/L) at a room temperature. FIG. 29 shows the measurement results. The horizontal axis represents a wavelength and the vertical axis represents a molar absorption coefficient and emission intensity.

As shown in FIG. 29, the organometallic complex [Ir(dm2npr)₂(acac)] has a peak of emission spectrum at 616 nm, and red-orange light was observed from the dichloromethane solution.

REFERENCE EXAMPLE 3

In Reference Example 3, a synthesis method of CO11II represented by the structural formula (vi) in Example 4 is described.

SYNTHESIS EXAMPLE 3

In this synthesis example, a synthesis example of 3-phenyl-9-[4-(5-phenyl-1,3,4-oxadiazol-2-yl)phenyl]-9H-carbazole (abbreviation: CO11II) represented by the structural formula (vi) in Embodiment 1, is specifically described.

A synthesis scheme of 3-phenyl-9-[4-(5-phenyl-1,3,4-oxadiazol-2-yl)phenyl]-9H-carbazole is shown in the following (C-1).

To a 100 mL three-necked flask were placed 2.3 g (6.6 mmol) of 2-(4-iodophenyl)-5-phenyl-1,3,4-oxadiazole, 1.6 g (6.6 mmol) of 3-phenyl-9H-carbazole, and 1.4 g (15 mmol) of sodium tert-butoxide, and the atmosphere in the flask was replaced with nitrogen. To this mixture were added 30 mL of toluene and 0.2 mL of a 10 wt % hexane solution of tri(tert-butyl)phosphine, and this mixture was degassed by reducing the pressure of the flask with an aspirator, and then, the atmosphere in the flask was replaced with nitrogen. To this mixture was added 0.058 g (0.10 mmol) of bis(dibenzylideneacetone)palladium(0), and the mixture was stirred at 80° C. for 15 hours under nitrogen gas stream. After stirring, toluene was added to this mixture, and this suspension was washed with a saturated sodium carbonate aqueous solution and saturated saline in this order. After washing, magnesium sulfate was added to an organic layer to dry the organic layer. After drying, suction filtration was performed on the mixture, and thus a filtrate was obtained. Suction filtration was performed with sellite (Wako Pure Chemical Industries. Ltd., catalog number: 540-16855) on the obtained filtrate, and thus a filtrate was obtained. A compound obtained by concentrating the obtained filtrate was purified by silica gel column chromatography. The column chromatography was performed first using toluene as a developing solvent and then using a mixed solvent of toluene:ethyl acetate=4:1 as a developing solvent. Acetone was added to a solid obtained by concentrating the obtained fraction, and washed with ultrasonic wave irradiation. This mixture was subjected to suction filtration to collect a solid. The collected solid was recrystallized with a mixed solvent of chloroform and hexane, so that 2.0 g of a powder white solid was obtained at a yield of 64%.

Sublimation purification of 1.1 g of the obtained white solid was performed by a train sublimation method. The sublimation purification was carried out under reduced pressure of 3.0 Pa, with a flow rate of argon at 5 mL/min, at 240° C. for 16 hours. Thus, 0.98 g of the white solid was obtained at a yield of 89%.

It was confirmed by a nuclear magnetic resonance spectroscopy (NMR) that this compound was 3-phenyl-9-[4-(5-phenyl-1,3,4-oxadiazol-2-yl)phenyl]-9H-carbazole (abbreviation: CO11II).

¹H NMR data of the obtained compound is shown below.
¹H NMR (CDCl₃, 300 MHz): δ=7.30-7.76 (m, 13H), 7.79 (d, J=8.3 Hz, 2H), 8.14-8.24 (m, 3H), 8.35 (sd, J=1.5 Hz, 1H), 8.39 (d, J=8.8 Hz, 2H).

This application is based on Japanese Patent Application serial no. 2008-228080 filed with Japan Patent Office on Sep. 5, 2008, the entire contents of which are hereby incorporated by reference.

EXPLANATION OF REFERENCE

301: first electrode, 302: second electrode, 311: hole-injecting layer, 312: hole-transporting layer, 313: light-emitting layer, 313-1: first light-emitting layer, 313-2: second light-emitting layer, 314: electron-transporting layer, 315: electron-injecting layer, 321: hole-transporting material, 322: host material, 323: light-emitting material, 401: housing, 402: liquid crystal layer, 403: backlight, 404: housing, 405: driver IC, 406: terminal, 411: housing, 412: light source, 511: main body, 512: housing, 513: display portion, 514: keyboard, 521: display portion, 522: main body, 523: antenna, 524: audio output portion, 525: audio input portion, 526: operation switch, 531: display portion, 532: housing, 533: speaker, 541: main body, 542: display portion, 543: external memory slot, 544: speaker portion, 545: operation key, 601: driver circuit portion (source side driver circuit), 602: pixel portion, 603: driver circuit portion (gate side driver circuit), 604: sealing substrate, 605: sealing material, 607: space, 608: leading wiring, 609: FPC (flexible printed circuit), 610: element substrate, 611: switching TFT, 612: current controlling TFT, 613: first electrode, 614: insulator, 616: layer including light-emitting layer, 617: second electrode, 618: light-emitting element, 623: N-channel TFT, 624: P-channel TFT, 951: substrate, 952: electrode, 953: insulating layer, 954: partition layer, 955: layer including light-emitting layer, and 956: electrode

The invention claimed is:

1. A light-emitting element comprising:
an anode;
a first light-emitting layer over the anode;
a second light-emitting layer over the first light-emitting layer; and
a cathode over the second light-emitting layer,
wherein each of the first light-emitting layer and the second light-emitting layer comprises a host material, a hole-transporting material, and a light-emitting material,
wherein a mass ratio of the hole-transporting material to the host material in the first light-emitting layer is greater than or equal to 0.25 and less than or equal to 0.5, and
wherein a mass ratio of the hole-transporting material to the host material in the second light-emitting layer is equal to 0.1.

2. The light-emitting element according to claim 1, wherein the host material has an electron-transporting property.

3. The light-emitting element according to claim 1, wherein the hole-transporting material is an aromatic amine compound or a carbazole derivative.

4. The light-emitting element according to claim 1, wherein the light-emitting material comprises iridium.

5. A light-emitting element comprising:
an anode;
a hole-injection layer over the anode;
a hole-transporting layer over the hole-injection layer;
a first light-emitting layer over the hole-transporting layer;
a second light-emitting layer over the first light-emitting layer; and
a cathode over the second light-emitting layer,
wherein each of the first light-emitting layer and the second light-emitting layer comprises a host material, a hole-transporting material, and a light-emitting material,
wherein each of the hole-injection layer and the hole-transporting layer comprises the hole-transporting material,
wherein the host material is a heteroaromatic compound or a metal complex, and has an electron-transporting property,
wherein the hole-transporting material is a carbazole derivative,
wherein the light-emitting material is a compound emitting phosphorescence,
wherein a mass ratio of the hole-transporting material to the host material in the first light-emitting layer is greater than or equal to 0.25 and less than or equal to 0.5, and
wherein a mass ratio of the hole-transporting material to the host material in the second light-emitting layer is equal to 0.1.

6. The light-emitting element according to claim 1, further comprising:
an electron-transporting layer between the second light-emitting layer and the cathode,
wherein the second light-emitting layer is in contact with the electron-transporting layer.

7. A light-emitting device comprising the light-emitting element according to claim 1.

8. An electronic device comprising the light-emitting device according to claim 7.

9. The light-emitting element according to claim 1, wherein the hole-transporting layer further comprises a transition metal oxide.

10. A lighting device comprising the light-emitting element according to claim 1.

11. A light-emitting element comprising:
an anode;
a cathode;
a first light-emitting layer and a second light-emitting layer between the anode and the cathode;
a hole-injection layer between the anode and the first light-emitting layer; and
a hole-transporting layer between the hole-injection layer and the first light-emitting layer,
wherein each of the first light-emitting layer and the second light-emitting layer comprises a host material, a hole-transporting material, and a light-emitting material,
wherein each of the hole-injection layer and the hole-transporting layer comprises the hole-transporting material,
wherein the host material is a heteroaromatic compound or a metal complex, and has an electron-transporting property,
wherein the hole-transporting material is a carbazole derivative,
wherein the light-emitting material is a compound emitting phosphorescence,
wherein a mass ratio of the hole-transporting material to the host material in the first light-emitting layer is greater than or equal to 0.25 and less than or equal to 0.5, and
wherein a mass ratio of the hole-transporting material to the host material in the second light-emitting layer is equal to 0.1.

12. The light-emitting element according to claim 11, further comprising:
an electron-transporting layer between the second light-emitting layer and the cathode,
wherein the second light-emitting layer is in contact with the electron-transporting layer.

13. A light-emitting device comprising the light-emitting element according to claim 11.

14. An electronic device comprising the light-emitting device according to claim 13.

15. The light-emitting element according to claim 11, wherein the hole-transporting layer further comprises a transition metal oxide.

16. A lighting device comprising the light-emitting element according to claim 11.

17. A light-emitting element comprising:
an anode;
a cathode; and
a first light-emitting layer and a second light-emitting layer between the anode and the cathode,
wherein each of the first light-emitting layer and the second light-emitting layer comprises a host material, a hole-transporting material, and a light-emitting material,
wherein the host material is one of bis(2-methyl-8-quinolinolato)(4-phenylphenolato)aluminum(III) and 9-[4-(5-phenyl-1,3,4-oxadiazol-2-yl)phenyl]carbazole,
wherein the hole-transporting material is one of 4,4'-bis[N-(1-naphthyl)-N-phenylamino]biphenyl and 4-phenyl-4'-(9-phenyl-9H-carbazol-3-yl)triphenylamine,
wherein the light-emitting material is one of (acetylacetonato)bis(2,3,5-triphenylpyrazinato)iridium(III), bis(2,3,5-triphenylpyrazinato)(dipivaloylmethanato)iridium (III), and bis{2-(4-fluorophenyl)-3,5-dimethylpyrazinato}(picolinato) iridium(III),
wherein a mass ratio of the hole-transporting material to the host material in the first light-emitting layer is greater than or equal to 0.25 and less than or equal to 0.5, and
wherein a mass ratio of the hole-transporting material to the host material in the second light-emitting layer is equal to 0.1.

18. The light-emitting element according to claim 17, further comprising:
an electron-transporting layer between the second light-emitting layer and the cathode,
wherein the second light-emitting layer is in contact with the electron-transporting layer.

19. A light-emitting device comprising the light-emitting element according to claim 17.

20. An electronic device comprising the light-emitting device according to claim 19.

21. The light-emitting element according to claim 17, further comprising:
a hole-transporting layer between the first light-emitting layer and the anode,
wherein the first light-emitting layer is in contact with the hole-transporting layer.

22. The light-emitting element according to claim 21, wherein the hole-transporting layer comprises a hole-transporting compound and a transition metal oxide.

23. A lighting device comprising the light-emitting element according to claim 17.

* * * * *